(12) United States Patent
Song et al.

(10) Patent No.: US 12,035,577 B2
(45) Date of Patent: Jul. 9, 2024

(54) DISPLAY DEVICE HAVING GROOVES SURROUNDING PIXEL AREAS

(71) Applicant: Samsung Display Co., Ltd., Yongin-si (KR)

(72) Inventors: Heerim Song, Yongin-si (KR); Yujin Lee, Yongin-si (KR); Haemin Kim, Yongin-si (KR); Cheolgon Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/972,160

(22) Filed: Oct. 24, 2022

(65) Prior Publication Data

US 2023/0052358 A1 Feb. 16, 2023

Related U.S. Application Data

(63) Continuation of application No. 17/002,179, filed on Aug. 25, 2020, now Pat. No. 11,482,580.

(30) Foreign Application Priority Data

Dec. 27, 2019 (KR) .......................... 10-2019-0176140

(51) Int. Cl.
*H10K 59/12* (2023.01)
*H10K 59/121* (2023.01)
(Continued)

(52) U.S. Cl.
CPC ....... *H10K 59/124* (2023.02); *H10K 59/1213* (2023.02); *H10K 59/131* (2023.02);
(Continued)

(58) Field of Classification Search
CPC ............... H10K 59/124; H10K 59/131; H10K 59/1213
(Continued)

(56) References Cited

U.S. PATENT DOCUMENTS 10,325,972 B2 6/2019 Park et al.
10,490,608 B2 11/2019 Lee et al.
(Continued)

FOREIGN PATENT DOCUMENTS

CN 108288637 A * 7/2018 ............. G09F 9/301
KR 20060040232 A * 5/2006 ............ H10K 55/128
(Continued)

*Primary Examiner* — Phuc T Dang
(74) *Attorney, Agent, or Firm* — KILE PARK REED & HOUTTEMAN PLLC

(57) ABSTRACT

A display device includes an inorganic insulating layer having a groove surrounding pixel areas, a first thin film transistor in a first pixel area of a substrate, a second thin film transistor in a second pixel area of the substrate, a first electrode layer overlapping a first gate electrode of the first thin film transistor and a second gate electrode of the second thin film transistor, an organic material layer disposed in the groove, a data line extending over the organic material layer in a second direction, and a first connecting line extending across the organic material layer in a first direction, disposed between the first electrode layer and the data line, and overlapping the first electrode layer.

20 Claims, 47 Drawing Sheets

(51) Int. Cl.
*H10K 59/124* (2023.01)
*H10K 59/131* (2023.01)
*G09G 3/3258* (2016.01)
*H01L 27/12* (2006.01)
*H10K 59/126* (2023.01)
*H10K 59/35* (2023.01)

(52) U.S. Cl.
CPC ... *G09G 3/3258* (2013.01); *G09G 2300/0809* (2013.01); *H01L 27/1214* (2013.01); *H10K 59/126* (2023.02); *H10K 59/352* (2023.02)

(58) Field of Classification Search
USPC .......................................................... 257/72
See application file for complete search history.

(56) References Cited

U.S. PATENT DOCUMENTS

| | | |
|---|---|---|
| 10,559,645 B2 | 2/2020 | Kwon et al. |
| 2008/0224599 A1 | 9/2008 | Kim |
| 2012/0097990 A1 | 4/2012 | Koh et al. |
| 2016/0079333 A1 | 3/2016 | Shishido et al. |
| 2018/0158895 A1* | 6/2018 | Lee ................... H10K 59/1315 |
| 2019/0066545 A1* | 2/2019 | Jung ....................... G02B 5/201 |
| 2019/0103455 A1 | 4/2019 | Song et al. |
| 2019/0148476 A1* | 5/2019 | Park ..................... H10K 59/131 |
| | | 257/40 |

FOREIGN PATENT DOCUMENTS

| | | |
|---|---|---|
| KR | 10-2016-0105956 | 9/2016 |
| KR | 10-2018-0011385 | 2/2018 |
| KR | 10-2019-0037380 | 4/2019 |
| KR | 10-2019-0055868 | 5/2019 |

* cited by examiner

DISPLAY DEVICE HAVING GROOVES SURROUNDING PIXEL AREAS

CROSS-REFERENCE TO RELATED APPLICATION(S)

This is a continuation application based on currently pending U.S. patent application Ser. No. 17/002,179, filed Aug. 25, 2020, now issued as U.S. Pat. No. 11,482,580, the disclosure of which is incorporated herein by reference in its entirety. U.S. patent application Ser. No. 17/002,179 claims priority to and benefit, under 35 U.S.C. § 119, of Korean Patent Application No. 10-2019-0176140 under 35 U.S.C. § 119, filed in the Korean Intellectual Property Office on Dec. 27, 2019, the entire contents of which are incorporated herein by reference.

BACKGROUND

1. Technical Field

One or more embodiments relate to a foldable display device that may be folded or curved.

2. Description of the Related Art

Display devices have been used for various purposes. As the thickness and weight of display devices have been reduced, the utilization range of display devices has increased. Research into flexible display devices such as foldable display devices, rollable display devices, etc., in addition to flat type display devices, has been conducted.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

One or more embodiments may include a high-resolution display device that may be flexible while being robust to external shock. However, the above technical features are exemplary, and the scope of the disclosure is not limited thereto.

Additional aspects will be set forth in part in the description which follows and, in part, will be apparent from the description, or may be learned by practice of the presented embodiments of the disclosure.

According to an embodiment, a display device may include a substrate including a display area including display elements, the display area including pixel areas each of which may include a first pixel area and a second pixel area that may be adjacent to each other in a first direction, an inorganic insulating layer including a groove surrounding the pixel areas, and a first thin film transistor including a first semiconductor layer on the first pixel area of the substrate, and a first gate electrode on the first semiconductor layer. The display device may include a second thin film transistor including a second semiconductor layer on the second pixel area of the substrate, and a second gate electrode on the second semiconductor layer. The display device may include a first electrode layer disposed on the first gate electrode and overlapping the first gate electrode and the second gate electrode, an organic material layer disposed in the groove, a data line extending across the organic material layer in a second direction, and a first connecting line extending across the organic material layer in the first direction, disposed between the first electrode layer and the data line, and overlapping the first electrode layer.

The first semiconductor layer and the second semiconductor layer may be symmetrical with each other with respect to a boundary line between the first pixel area and the second pixel area.

The inorganic insulating layer may include inorganic patterns corresponding to the pixel areas, and the organic material layer may be disposed between the inorganic patterns and may include holes corresponding to the inorganic patterns.

The data line may overlap at least a portion of the first connecting line.

The display device may further include a power line extending across the organic material layer in a direction substantially parallel with the data line. The power line and the data line may be disposed on a same layer. The first connecting line may be electrically connected to the first electrode layer, and the power line may be electrically connected to the first connecting line.

The display device may further include a node electrode disposed between the first electrode layer and the first connecting line. The node electrode may include an end electrically connected to the first gate electrode, and another end electrically connected to the first semiconductor layer.

The first connecting line may overlap the end of the node electrode, and the end of the node electrode overlapping the first connecting line may overlap the first electrode layer.

The display device may further include a second connecting line extending across the organic material layer in a direction substantially parallel with the first connecting line, wherein the second connecting line and the first connecting line may be disposed on a same layer, and at least a portion of the second connecting line may be disposed between the data line and the another end of the node electrode in a plan view.

A voltage applied to the first connecting line may be different from a voltage applied to the second connecting line.

Each of the display elements may include a pixel electrode, an opposite electrode facing the pixel electrode, and an emission layer disposed between the pixel electrode and the opposite electrode, wherein at least two organic insulating layers may be disposed between the data line and the pixel electrode.

The pixel electrode may overlap the organic material layer.

The groove in a first row and the groove in a second row adjacent to the first row may be offset from each other as much as the first pixel area.

According to another embodiment, a display device may include a substrate including a first pixel area and a second pixel area adjacent to the first pixel area in a first direction, a first driving thin film transistor in the first pixel area of the substrate, a second driving thin film transistor in the second pixel area of the substrate, a first electrode layer overlapping a first gate electrode of the first driving thin film transistor and a second gate electrode of the second driving thin film transistor, the first electrode layer being disposed on the first gate electrode and the second gate electrode, a data line extending in the first pixel area in a second direction, a first connecting line extending in the first direction, disposed between the first electrode layer and the data line, and overlapping the first electrode layer, and an inorganic insulating layer disposed between the substrate and the first connecting line and including a groove surrounding the first pixel area and the second pixel area, wherein an organic material may be filled in the groove.

The display device may further include a third driving thin film transistor in a third pixel area adjacent to the first pixel area in the first direction, and a second electrode layer disposed on a third gate electrode of the third driving thin film transistor and overlapping the third gate electrode, wherein the groove may be disposed between the first driving thin film transistor and the third driving thin film transistor, and the first connecting line may be electrically connected to the first electrode layer and the second electrode layer across the groove.

The display device may further include a first switching thin film transistor in the first pixel area, and a node electrode disposed between the first electrode layer and the first connecting line. The node electrode may include an end electrically connected to the first gate electrode of the first driving thin film transistor, and another end connected to a semiconductor layer of the first switching thin film transistor.

The first connecting line may overlap the end of the node electrode, and the end of the node electrode overlapping the first connecting line may overlap the first electrode layer.

The display device may further include a second connecting line extending substantially parallel with the first connecting line, wherein the first connecting line and the second connecting line may be disposed on a same layer, and at least a portion of the second connecting line may be disposed between the data line and the another end of the node electrode in a plan view.

The display device may further include a second switching thin film transistor in the first pixel area, the second switching thin film transistor including an end electrically connected to the semiconductor layer of the first switching thin film transistor, and another end electrically connected to the second connecting line, and a conductive layer electrically connected to a semiconductor layer of the second switching thin film transistor and overlapping the semiconductor layer between two channel regions of the second switching thin film transistor, wherein the conductive layer and the node electrode may be disposed on a same layer.

The display device may further include a third switching thin film transistor in the first pixel area, the third switching thin film transistor being electrically connected to the first driving thin film transistor and an organic light-emitting diode, a fourth switching thin film transistor in a fourth pixel area adjacent to the first pixel area in the second direction, and a third connecting line extending in the second direction, wherein the groove may be disposed between the third switching thin film transistor and the fourth switching thin film transistor, and the third connecting line may be electrically connected to a semiconductor layer of the third switching thin film transistor and a semiconductor layer of the fourth switching thin film transistor across the groove.

The display device may further include a display element in the first pixel area, the display element including a pixel electrode and an opposite electrode facing the pixel electrode, wherein at least two organic insulating layers may be disposed between the data line and the pixel electrode.

The pixel electrode may overlap the groove.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1A:
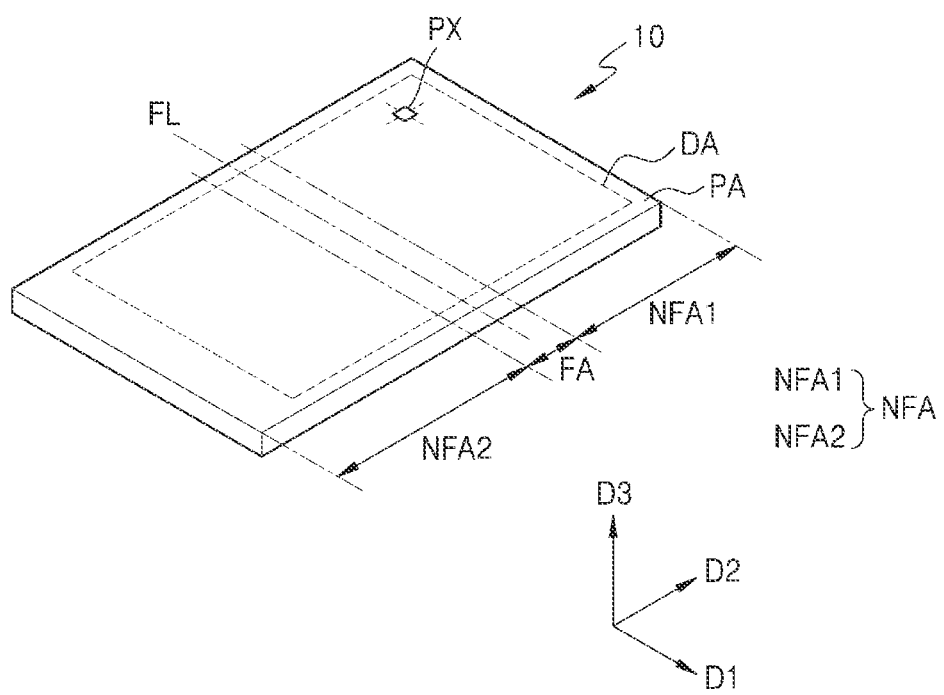
FIGS. 1A and 1B are schematic perspective views of a display device in an unfolded state according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description.

While such terms as "first," "second," etc., may be used to describe various elements, such elements are not to be limited to the above terms. The above terms are used only to distinguish one element from another.

An expression used in the singular encompasses the expression of the plural, unless it has a clearly different meaning in the context.

It is to be understood that terms such as "including," "having," and "comprising" are intended to indicate the existence of the features, numbers, steps, actions, elements, parts, or combinations thereof disclosed herein, and are not intended to preclude the possibility that one or more other features, numbers, steps, actions, elements, parts, or combinations thereof may exist or may be added.

It will be understood that when a layer, region, or element is referred to as being "formed on" another layer, region, or element, it may be directly or indirectly formed on the other layer, region, or element. For example, intervening layers, regions, or elements may be present.

Sizes of elements in the drawings may be exaggerated for convenience of explanation. In other words, since sizes and thicknesses of elements in the drawings may be arbitrarily illustrated for convenience of explanation, the following embodiments are not limited thereto.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or." Throughout the disclosure, the expression "at least one of a, b or c" indicates only a, only b, only c, both a and b, both a and c, both b and c, all of a, b, and c, or variations thereof. The phrase "at least one of A and B" denotes A, B, or A and B.

A line "extending in a first direction or a second direction" may denote extending in the first direction or the second direction in zig-zags or in a curve, as well as extending straightly in the first direction or the second direction.

The phrase "in a plan view" may denote viewing a target portion from the top, and the phrase "in a cross-sectional view" may denote viewing of a cross-section of the target portion that may be vertically cut from a lateral direction. As used herein, a first element "overlapping" a second element may denote that the first element may be located on, over, under, facing, or covering the second element, as would be understood by those of ordinary skill in the art.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 5% of the stated value.

In a case that a certain embodiment may be implemented differently, a specific process order may be performed differently from the described order. For example, two consecutively described processes may be performed substantially at the same time or performed in an order opposite to the described order.

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Figure 1B:
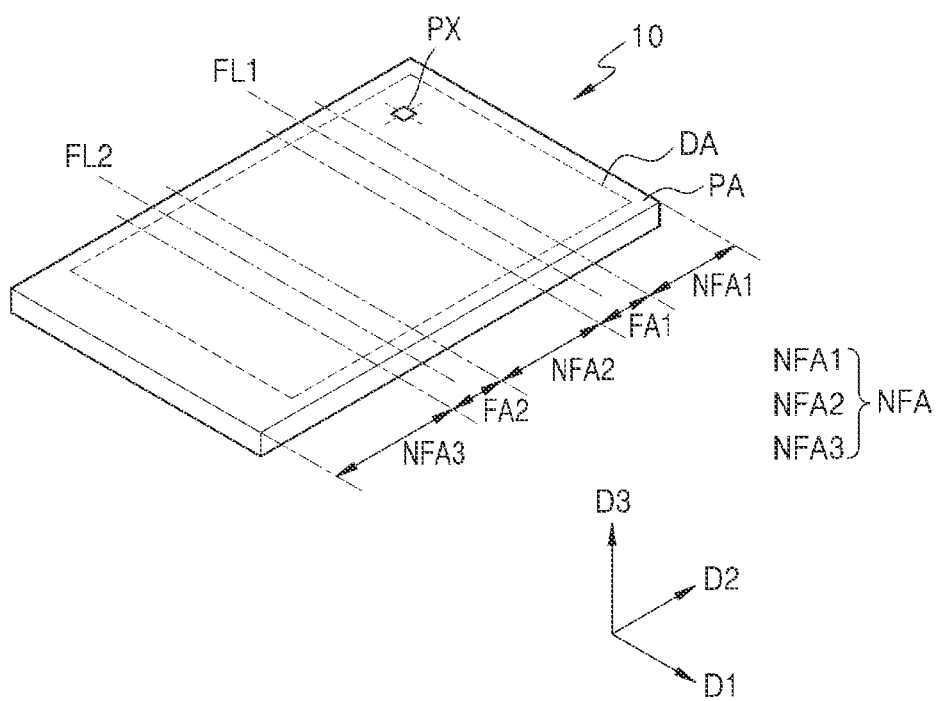

FIGS. 1A and 1B are schematic perspective views of a display device that is unfolded according to an embodiment.

Figure 2A:
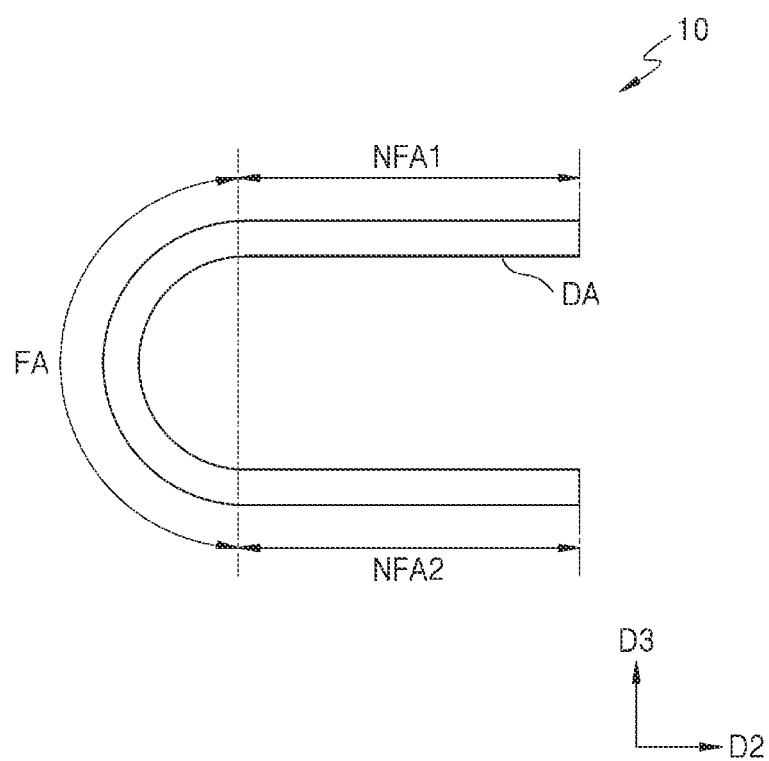
FIGS. 2A and 2B are schematic cross-sectional views of a display device in a folded state according to an embodiment.
Figure 2B:
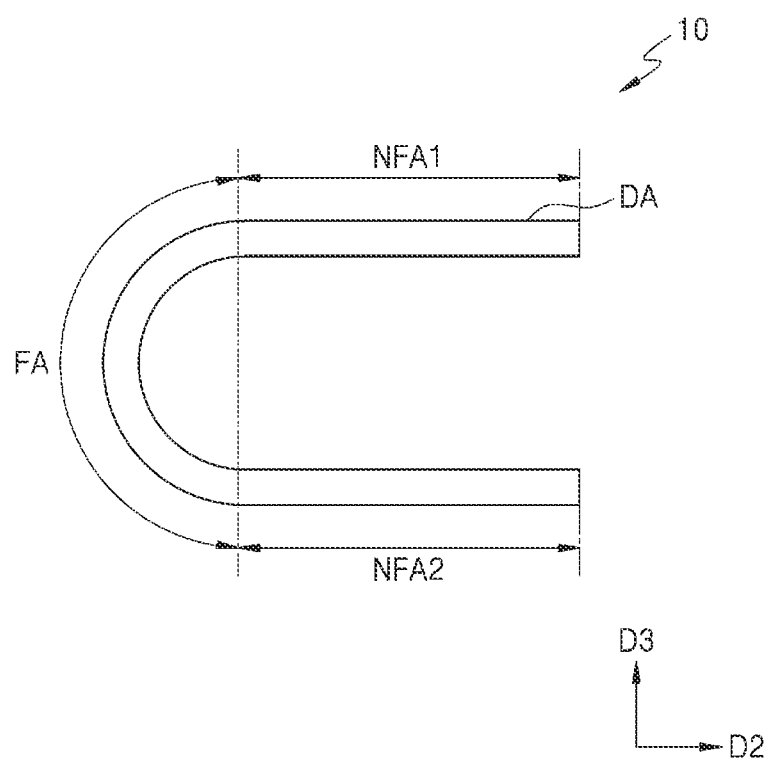

FIGS. 2A and 2B are schematic cross-sectional views of a display device in a folded state according to an embodiment.

Figure 3A:
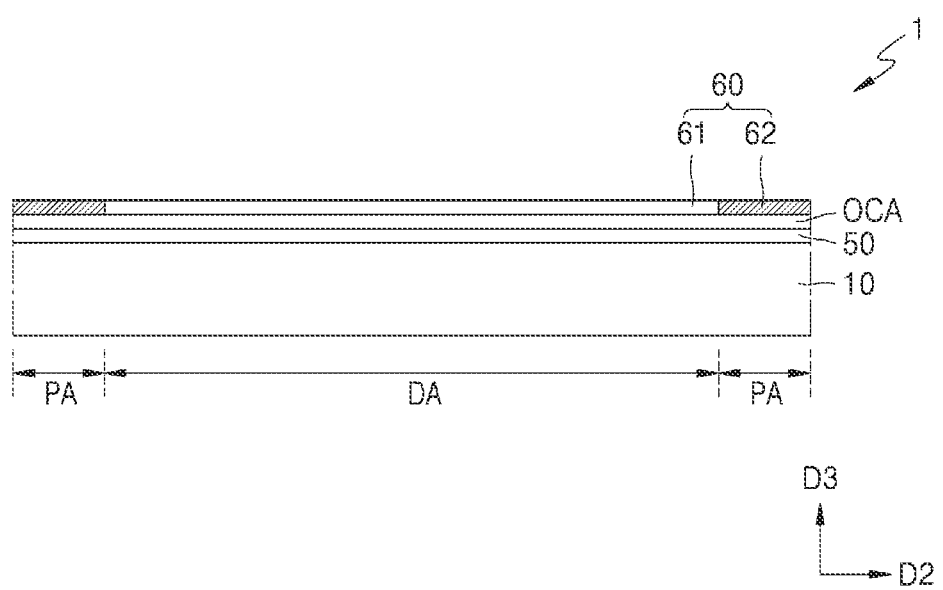
FIGS. 3A and 3B are schematic cross-sectional views of a display device according to an embodiment.
Figure 3B:
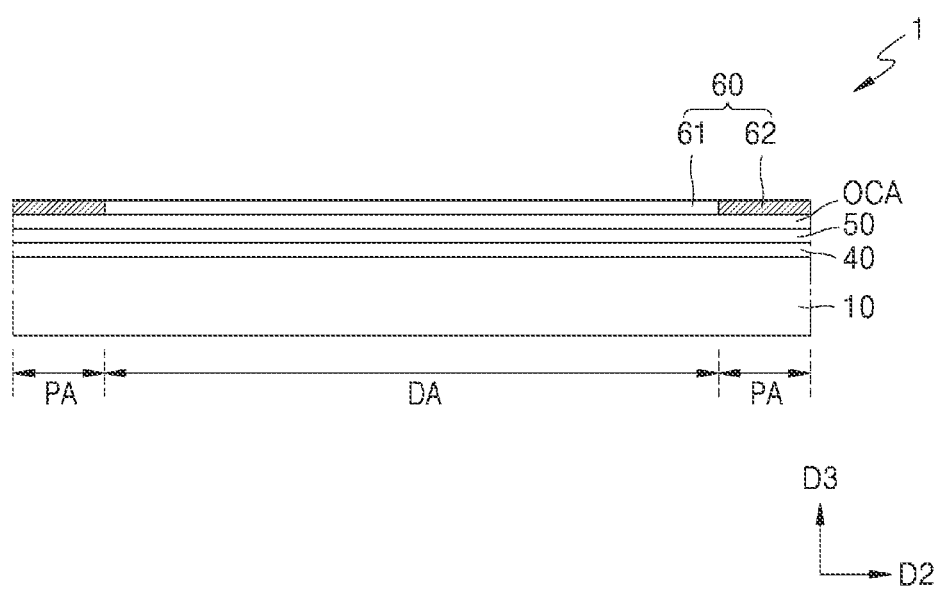

FIGS. 3A and 3B are cross-sectional views of a display device according to an embodiment.

The display device according to an embodiment may be folded or curved. The display device may be provided in various shapes, for example, may have a rectangular plate shape having two pairs of sides which are substantially parallel with each other. In case that the display device is provided in a rectangular plate shape, a pair of sides may be longer than another pair of sides. In the embodiment, the display device has a rectangular shape having a pair of long sides and a pair of short sides for convenience of description. A direction in which the short sides extend is denoted as a first direction D1, a direction in which the long sides extend is denoted as a second direction D2, and a direction perpendicular to the extending directions of the long sides and the short sides is denoted as a third direction D3.

The display device according to the embodiment is not limited to the above example, and may have various shapes. For example, the display device may be provided in various shapes, for example, a polygonal shape of closed type including straight sides, a circular shape or an elliptical shape including a curved side, a semi-circular shape or a semi-elliptical shape including straight and curved sides, etc. In an embodiment, in case that a display device has a straight line side, at least some of corners in each shape may have curved lines. For example, in case that a display device has a rectangular shape, a point where adjacent straight lines meet each other may be substituted with a curved line having a curvature. For example, a vertex portion of the rectangular shape may include a curved side having opposite ends connected to two adjacent straight sides and having a curvature. Here, the curvature may vary depending on a location of the vertex. For example, the curvature may be changed according to a location from which the curved line starts and a length of the curved line.

Referring to FIGS. 1A, 1B, 2A, and 2B, the display device may include a display panel 10. The display panel 10 may include a display area DA and a peripheral area PA on an outer portion of the display area DA. The display area DA may be an area in which pixels PX may be arranged to display images. The peripheral area PA surrounds the display area DA and may be a non-display area, in which pixels may not be arranged.

Various electronic devices such as a printed circuit board, etc. may be electrically attached to the peripheral area PA, and a voltage line for supplying electric power to drive display elements, etc. may be in the peripheral area PA. For example, a scan driver for providing each of the pixels PX with a scan signal, a data driver for providing each pixel PX with a data signal, supply lines (clock signal lines, carry signal lines, driving voltage lines, etc.) for supplying signals input to the scan driver and the data driver, main power lines, etc. may be in the peripheral area PA.

The display panel 10 may be at least partially flexible and may be folded at a portion that may be flexible. For example, the display panel 10 may include a foldable area FA that may be flexible and foldable and non-foldable areas NFA1 and NFA2 that may be provided on at least one side of the foldable area FA and may not be foldable. In the disclosure, an area that may not be foldable may be referred to as a non-foldable area for convenience of description, but one or more embodiments are not limited thereto, and the expression "non-foldable" may denote the case in which the area has less flexibility than the foldable area FA, and the case in which the area may not be foldable but flexible, as well as the case in which the area may not be flexible but rigid. The display panel 10 may display images on the display area DA in the foldable area FA and the non-foldable area NFA (NFA1 and NFA2).

In FIG. 1A, the first and second non-foldable areas NFA1 and NFA2 have similar areas to each other and one foldable area FA may be between the first and second non-foldable areas NFA1 and NFA2 for convenience of description, but one or more embodiments are not limited thereto. For example, the first and second non-foldable areas NFA1 and NFA2 may have different areas from each other. Also, as shown in FIG. 1B, one or more foldable areas FA may be provided. Non-foldable areas NFA1, NFA2, and NFA3 may be spaced from one another with foldable areas FA1 and FA2 therebetween. Each of the foldable areas FA, FA1, and FA2 may be folded about a folding line FL, FL1, or FL2, and each of the folding lines FL, FL1, and FL2 may be provided in plural lines. The folding lines FL, FL1, and FL2 may be respectively provided in the foldable areas FA, FA1, and FA2 in the first direction D1, in which the foldable areas FA, FA1, and FA2 extend, and accordingly, the display panel 10 may be folded at the foldable areas FA, FA1, and FA2.

In FIGS. 1A and 1B, the folding lines FL, FL1, and FL2 extend across centers of the foldable areas FA, FA1, and FA2, and each of the foldable areas FA, FA1, and FA2 may be line-symmetrical about the folding line FL, FL1, or FL2. However, one or more embodiments are not limited thereto. For example, the folding lines FL, FL1, and FL2 may be provided asymmetrically in the foldable areas FA, FA1, and FA2. The foldable areas FA, FA1, and FA2 and the folding lines FL, FL1, and FL2 of the foldable areas FA, FA1, and FA2 may overlap an area displaying images on the display panel 10, and in case that the display panel 10 is folded, the area displaying the image may be folded.

In another embodiment, the display panel 10 may entirely correspond to the foldable areas FA, FA1, and FA2. For example, in case that the display device is rollable, the display panel 10 may entirely correspond to the foldable areas FA, FA1, and FA2.

The display panel 10 may be unfolded to be flat as shown in FIGS. 1A and 1B. In an embodiment, the display panel 10 may be folded as shown in FIG. 2A, and thus, the display area DA may be folded about the folding line FL such that opposite sides of the display area face each other. In another embodiment, the display panel 10 may be folded about the folding line FL as shown in FIG. 2B, and thus, the display area DA may face outside. Here, the term "fold" denotes that an original shape may not be fixed, but may be transformed into another form, and includes folded along one or more certain lines, e.g., folding lines FL, curved, or rolled. Therefore, in an embodiment of the disclosure, the display area may be folded such that surfaces of two non-foldable areas NFA1 and NFA2 face each other substantially parallel with each other, but one or more embodiments are not limited thereto, and the display area may be folded so that two non-foldable areas NFA1 and NFA2 form a certain degree angle (e.g., an acute angle or an obtuse angle) with the foldable area FA therebetween.

Referring to FIG. 3A, the display device 1 may include an optical functional layer 50 on the display panel 10, and the optical functional layer 50 and the display panel 10 may be covered by a window 60. The window 60 may be bonded to an element thereunder, e.g., the optical functional layer 50, via an optical clear adhesive (OCA). The display device 1 may be provided in various electronic devices such as a mobile phone, a tablet PC, a laptop computer, a smart watch, etc. As shown in FIG. 3B, the display device 1 may further include an input sensing layer 40 between the display panel 10 and the optical functional layer 50.

The input sensing layer 40 may obtain coordinate information generated according to an external input, e.g., a touch event. The input sensing layer 40 may include a sensing electrode (e.g., a touch electrode) and signal lines (e.g., trace lines) connected to the sensing electrode. In an embodiment, the input sensing layer 40 may be on (e.g., directly on) the display panel 10. That the input sensing layer 40 may be on (e.g., directly on) the display panel 10 denotes that an additional adhesive material layer may not be provided between the input sensing layer 40 and the display panel 10, and elements of the input sensing layer 40 may be patterned (e.g., directly patterned) on the display panel 10. In another embodiment, the input sensing layer 40 may be obtained through a separate process from that of the display panel 10 and may be bonded onto the display panel 10 via a transparent adhesive material layer, etc.

The optical functional layer 50 may include a structure of a black matrix and color filters. The color filters may be arranged taking into account a color of light emitted from each of the pixels in the display panel 10. The optical functional layer 50 may function as an anti-reflection layer that reduces a reflectivity of light (e.g., external light) incident to the display panel 10 from outside via the window 60.

The window 60 may cover and protect the optical functional layer 50, the input sensing layer 40, and/or the display panel 10. The window 60 may be on the display panel 10 without an intervening polarization layer between the display panel 10 and the window 60. According to the embodiment, the foldable display device that may be foldable while having an external light reflection preventing function may be implemented by including the optical functional layer 50 including the color filter instead of a rigid polarization layer (for example, a retarder and a polarizer) and/or a planarization layer including organic insulating layers in the display panel 10.

The window 60 may be provided to be larger than the input sensing layer 40, the optical functional layer 50, and the display panel 10, and thus, a side of the window 60 may protrude more than sides of the input sensing layer 40, the optical functional layer 50, and the display panel 10. The window 60 may include a transparent material. The window 60 may be flexible. For example, the window 60 may include a polymer resin such as a polyether sulfone (PES), polyarylate (PAR), polyetherimide (PEI), polyethylene naphthalate (PEN), polyethylene terephthalate (PET), polyphenylene sulfide (PPS), polyimide (PI), polycarbonate (PC), cellulose triacetate (TAC), cellulose acetate propionate (CAP), etc., or a combination thereof. The window 60 may be coupled onto the input sensing layer 40 and the optical functional layer 50 by using a transparent adhesive material layer, etc. The window 60 may include a light-transmitting area 61 that may correspond to the display area DA and a light-blocking area 62 that may correspond to the peripheral area PA.

Figure 4:
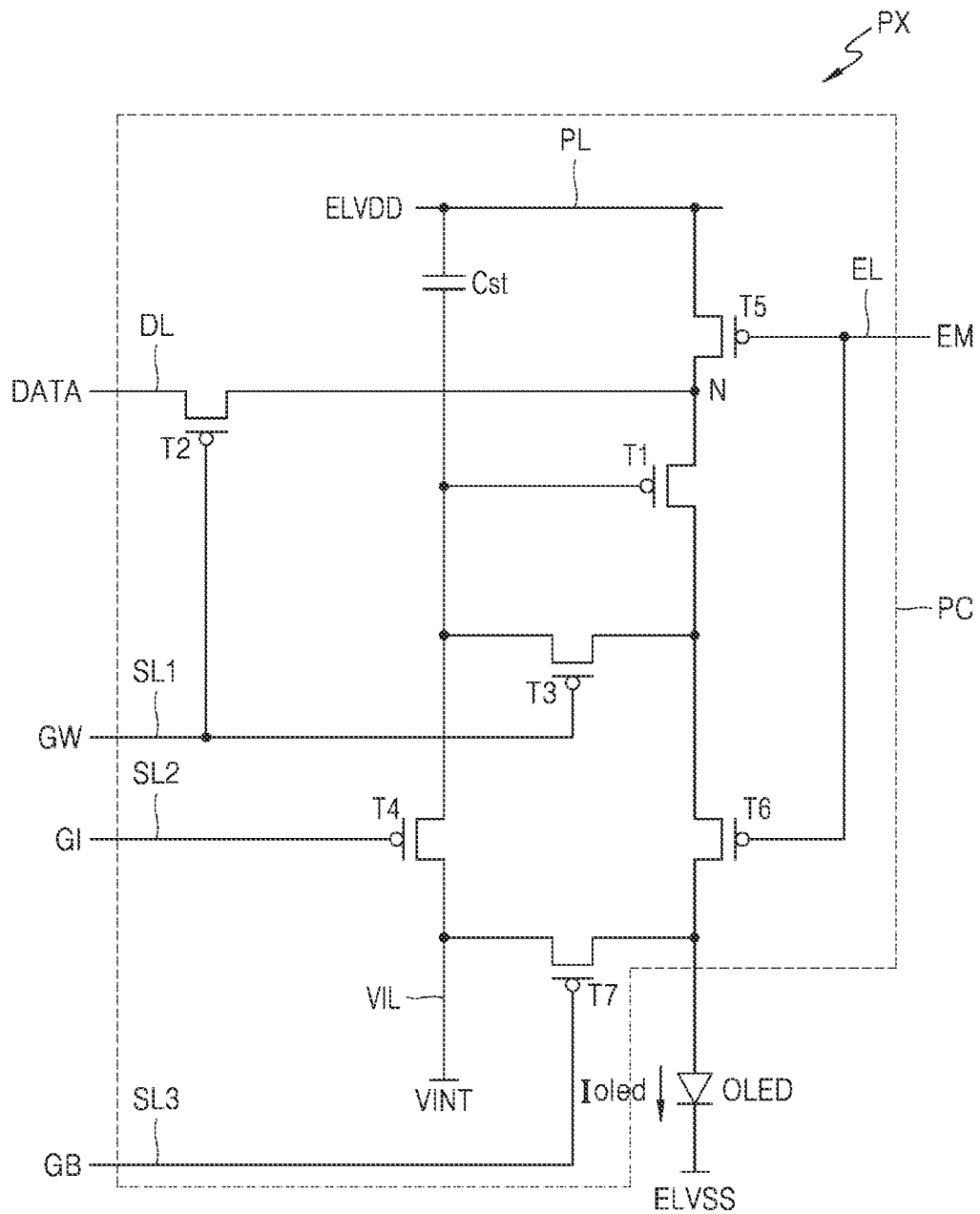
FIG. 4 is schematic equivalent circuit diagram of one pixel in a display panel according to an embodiment.

FIG. 4 is a schematic equivalent circuit diagram of one pixel PX in a display panel according to an embodiment.

Referring to FIG. 4, a pixel PX may include signal lines SL1, SL2, SL3, EL, and DL, an initialization voltage line VIL, and a power voltage line PL. In another embodiment, at least one of the signal lines SL1, SL2, SL3, EL, and DL, the initialization voltage line VIL, and/or the power voltage line PL may be shared by neighboring pixels.

The signal lines may include a first scan line SL1 configured to transfer a first scan signal GW, a second scan line SL2 configured to transfer a second scan signal GI, a third scan line SL3 configured to transfer a third scan signal GB, an emission control line EL configured to transfer a light-emitting control signal EM, and a data line DL configured to transfer a data signal DATA. The third scan line SL3 may be the second scan line SL2 of a different (e.g., next) row and the third scan signal GB may be the second scan signal GI of a different (e.g., next) row.

The power voltage line PL may be configured to transfer a first power voltage ELVDD to a first transistor T1, and the initialization voltage line VIL may be configured to transfer an initialization voltage VINT to the pixel PX for initializing the first transistor T1 and an organic light-emitting diode OLED.

A pixel circuit PC of the pixel PX may include first to seventh transistors T1 to T7 and a capacitor Cst. The first to seventh transistors T1 to T7 may each include a thin film transistor.

The first transistor T1 may be electrically connected to the power voltage line PL via the fifth transistor T5 and may be electrically connected to the organic light-emitting diode OLED via the sixth transistor T6. The first transistor T1 may act as a driving transistor and may receive the data signal DATA to supply a driving current Ioled to the organic light-emitting diode OLED according to a switching operation of the second transistor T2.

The second transistor T2 may be electrically connected to the first scan line SL1 and the data line DL, and may be turned on according to the first scan signal GW transferred through the first scan line SL1 to perform a switching operation for transferring to a node N the data signal DATA that may be transferred through the data line DL.

The third transistor T3 may be electrically connected to the organic light-emitting diode OLED via the sixth transistor T6. The third transistor T3 may be turned on according to the first scan signal GW transferred through the first scan line SL1 to diode-connect the first transistor T1.

The fourth transistor T4 may be turned on according to the second scan signal GI transferred through the second scan line SL2 and may be configured to transfer an initialization voltage VINT from the initialization voltage line VIL to a gate electrode of the first transistor T1 to initialize a gate voltage of the first transistor T1.

The fifth transistor T5 and the sixth transistor T6 may be simultaneously turned on according to the emission control signal EM transferred through the emission control line EL to form a current path through which the driving current Ioled flows from the power voltage line PL towards the organic light-emitting diode OLED.

The seventh transistor T7 may be turned on according to the third scan signal GB transferred through the third scan line SL3 and may be configured to transfer the initialization voltage VINT from the initialization voltage line VIL to the organic light-emitting diode OLED to initialize the organic light-emitting diode OLED. The seventh transistor T7 may be omitted.

In FIG. 4, the fourth transistor T4 may be electrically connected to the second scan line SL2 and the seventh transistor T7 may be electrically connected to the third scan line SL3. In another embodiment, the seventh transistor T7 and the fourth transistor T4 may be electrically connected to the second scan line SL2.

The capacitor Cst may be electrically connected to the power voltage line PL and the gate electrode of the first transistor T1 to store and maintain a voltage corresponding to a difference between voltages at opposite ends to maintain the voltage applied to the gate electrode of the first transistor T1.

The organic light-emitting diode OLED may include a pixel electrode and an opposite electrode, and the opposite electrode may receive a second power voltage ELVSS. The organic light-emitting diode OLED may receive the driving current Ioled from the first thin film transistor T1 to emit light, and thus may display images.

Figure 5:
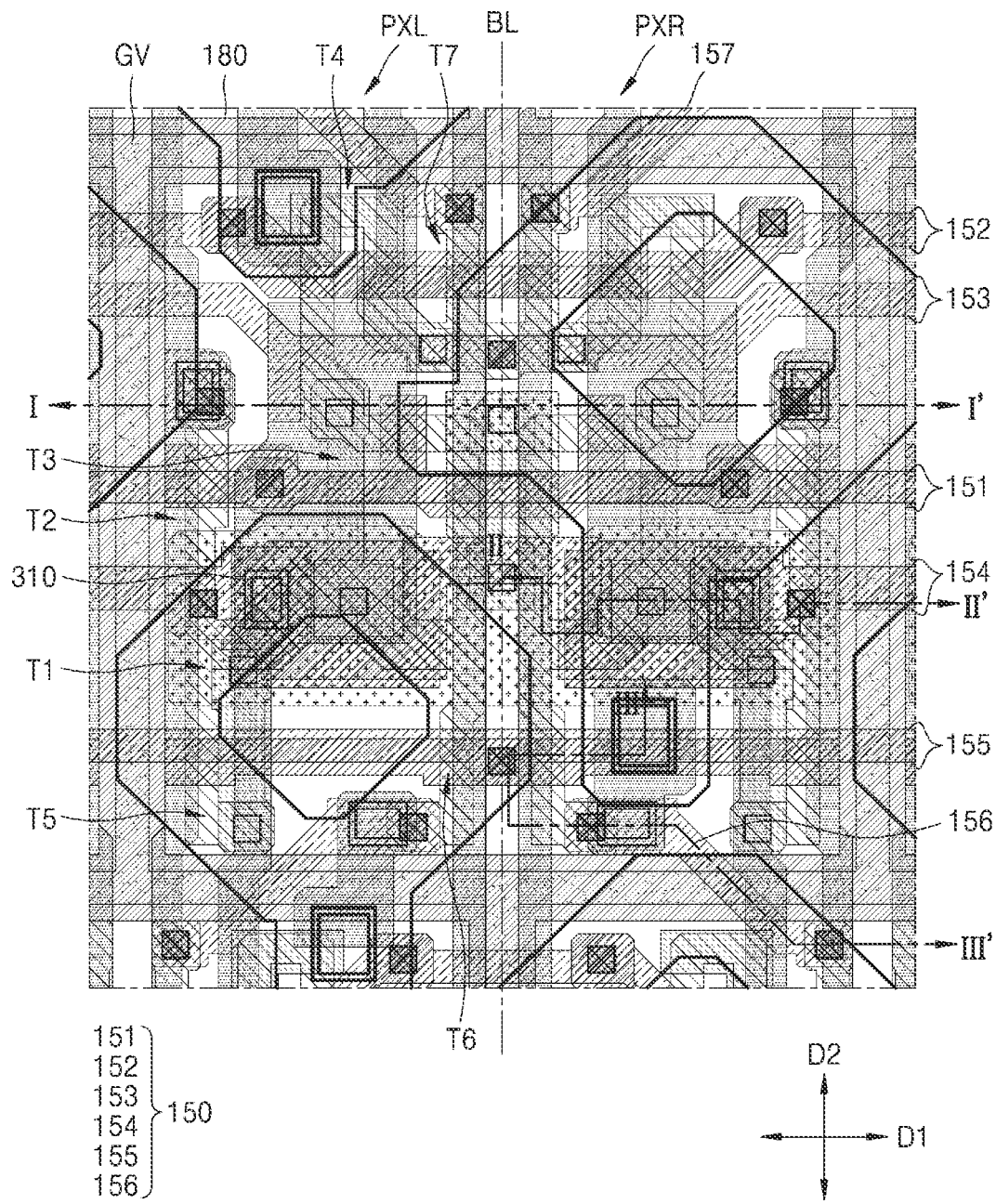
FIG. 5 is a schematic diagram showing locations of thin film transistors and a capacitor in each of two adjacent pixels according to an embodiment.
Figure 6A:
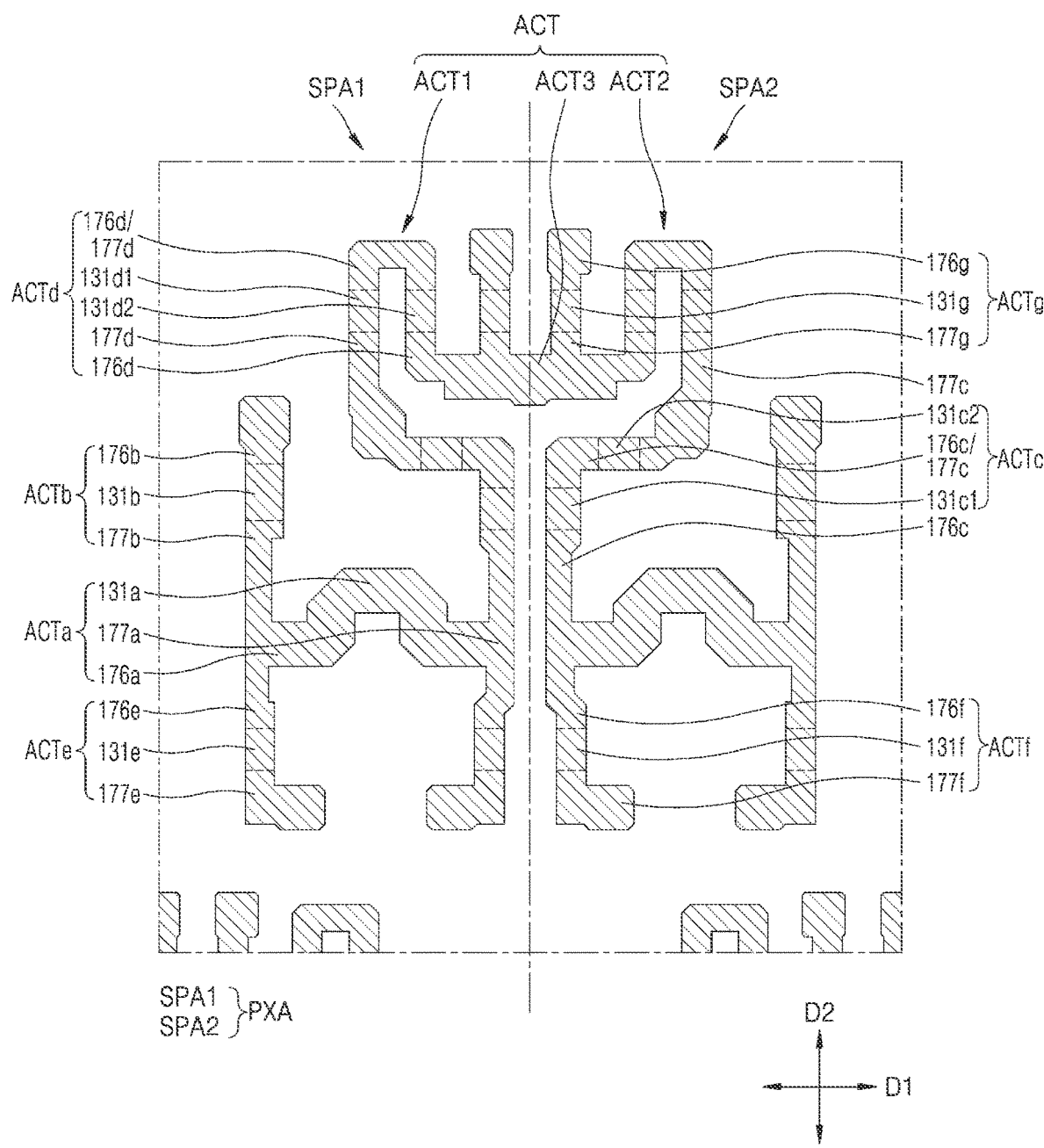
FIGS. 6A to 6I are schematic plan views showing elements such as thin film transistors, the capacitor, and a pixel electrode shown in FIG. 4 according to layers.
Figure 7:
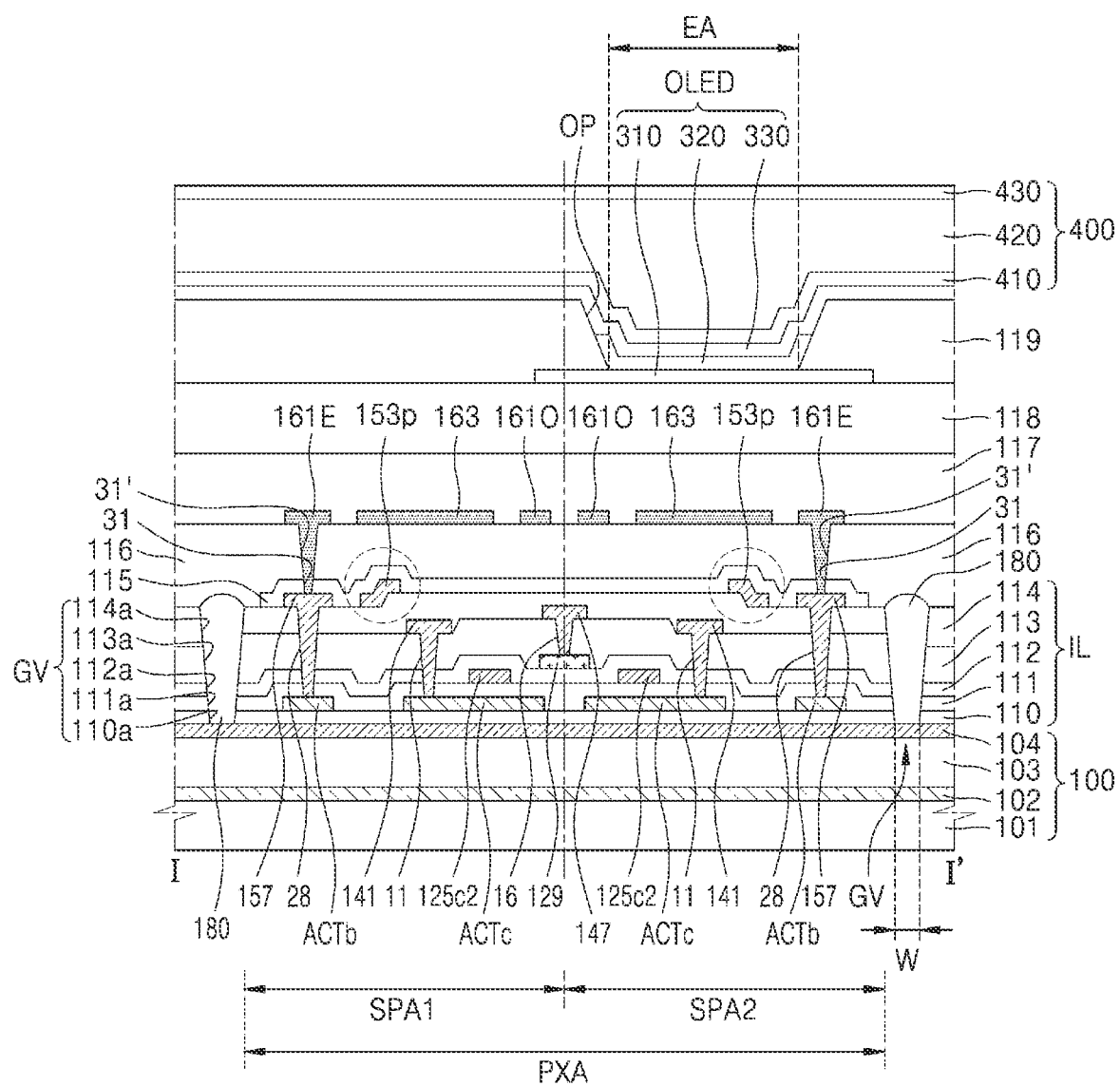
FIGS. 7 to 9 are schematic cross-sectional views of the pixel taken along line I-I', line II-1I', and line III-III' of FIG. 5.
Figure 8:
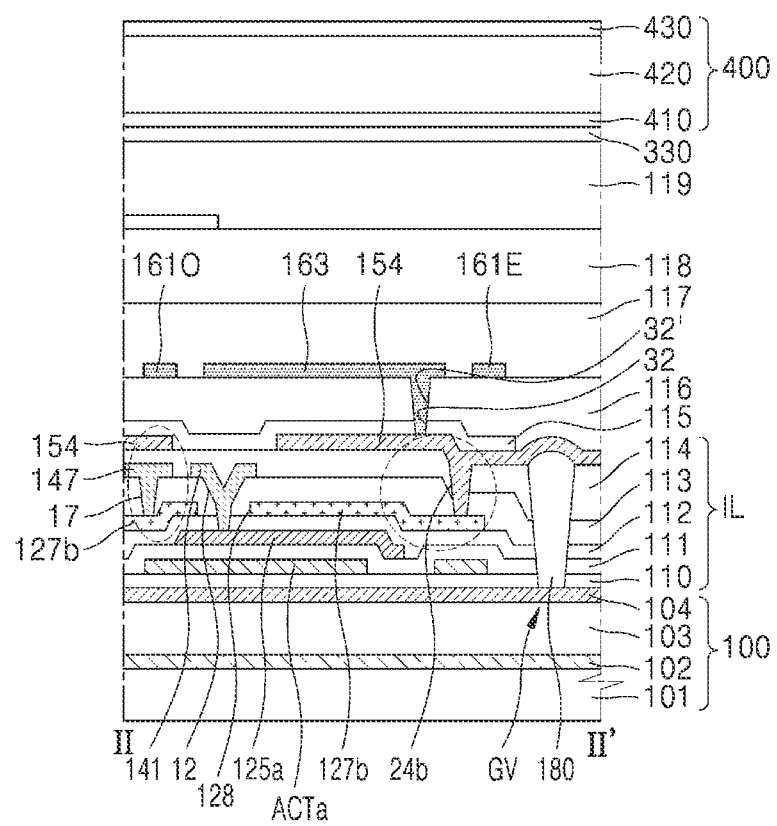
Figure 9:
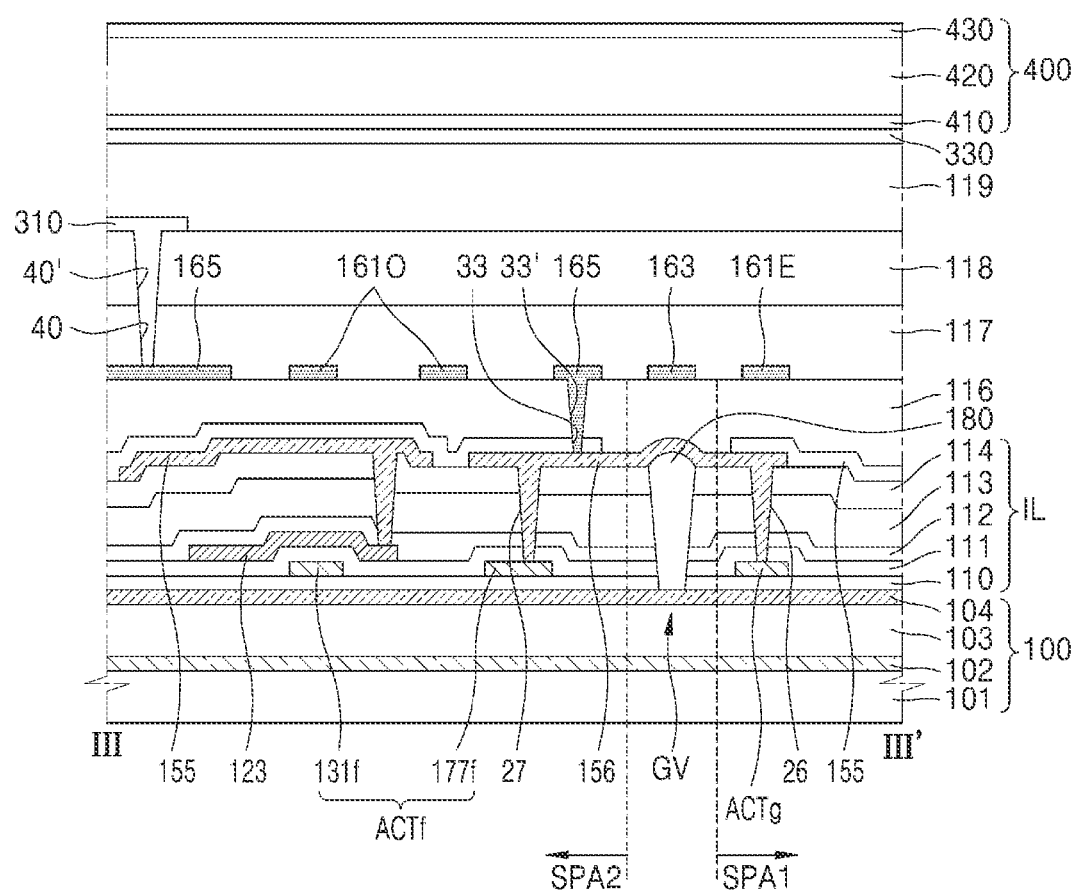

FIG. 5 is a schematic diagram showing locations of thin film transistors and a capacitor in each of two adjacent pixels according to an embodiment. FIGS. 6A to 6I are schematic plan views showing elements such as thin film transistors, the capacitor, and a pixel electrode shown in FIG. 4 according to layers. FIGS. 7 to 9 are schematic cross-sectional views of the pixel taken along line I-I', line II-II', and line III-III' of FIG. 5.

Referring to FIGS. 5 to 9, the display panel 10 according to the embodiment may include a substrate 100, pixels PX on the substrate 100, and an encapsulation layer 400.

An inorganic insulating layer including a groove GV between pixel areas PXA and an organic material layer 180 filling the groove GV may be on the substrate 100. Connecting lines 151 to 156 may be on the organic material layer 180 on the substrate 100, and the connecting lines 151 to 156 may cross the organic material layer 180 in the first direction D1 and/or the second direction D2.

The pixel area PXA may be an area in which a pair of pixels PX may be arranged and may include a first pixel area SPA1 at the left and a second pixel area SPA2 at the right. Hereinafter, a pixel in the first pixel area SPA1 may be referred to as a first pixel PXL and a pixel in the second pixel area SPA2 may be referred to as a second pixel PXR. A pixel circuit of the first pixel PXL in the first pixel area SPA1 and a pixel circuit of the second pixel PXR in the second pixel area SPA2 may be symmetrical with each other based on a virtual boundary line BL that may partition the pixel area PXA. FIGS. 5 to 6I further show a part of an adjacent pixel area PXA.

Each of FIGS. 6A to 6I shows an arrangement of lines, electrodes, semiconductor layers, etc. at a same layer, and insulating layers may be located among the layers shown in FIGS. 6A to 6I. Hereinafter, descriptions will be provided with reference to FIGS. 5 to 9 together.

The substrate 100 may include various materials such as a metal material, a plastic material, etc., or a combination thereof. In an embodiment, the substrate 100 may include a flexible substrate. As shown in FIGS. 7 to 9, the substrate 100 may include a first base layer 101, a first barrier layer 102, a second base layer 103, and a second barrier layer 104, which may be sequentially stacked on each other. The first and second base layers 101 and 103 may each include a polymer resin. For example, the first and second base layers 101 and 103 may each include a polymer resin such as a polyether sulfone (PES), polyarylate (PAR), polyetherimide (PEI), polyethylene naphthalate (PEN), polyethylene terephthalate (PET), polyphenylene sulfide (PPS), polyimide (PI), polycarbonate (PC), cellulose triacetate (TAC), cellulose acetate propionate (CAP), etc., or a combination thereof. The above polymer resin may be transparent. The first barrier layer 102 and the second barrier layer 104 may prevent infiltration of external impurities may each have a single-layered or multi-layered structure including an inorganic material such as silicon nitride and/or silicon oxide.

The buffer layer 110 may be on the second barrier layer 104 of the substrate 100. The buffer layer 110 may block impurities or moisture that may infiltrate through the substrate 100. The buffer layer 110 may include an inorganic material such as silicon oxide, silicon nitride, and/or silicon oxynitride, and may have a single-layered or multi-layered structure.

A semiconductor layer ACT may be on the buffer layer 110 for each pixel area PXA. The semiconductor layer ACT may include a first semiconductor layer ACT1 in the first pixel area SPA1 and a second semiconductor layer ACT2 in the second pixel area SPA2. The first semiconductor layer ACT1 and the second semiconductor layer ACT2 may be connected to each other. The first semiconductor layer ACT1 and the second semiconductor layer ACT2 may be integrally provided with each other. In FIG. 6A, a portion between the first semiconductor layer ACT1 and the second semiconductor layer ACT2 may be denoted as a third semiconductor layer ACT3. The semiconductor layer ACT in the pixel area PXA may be separated from a semiconductor layer in another pixel area PXA with the groove GV therebetween.

The semiconductor layer ACT may include amorphous silicon, polycrystalline silicon, an organic semiconductor material, or a combination thereof. Each of the first semiconductor layer ACT1 and the second semiconductor layer ACT2 may have variously curved shapes, in which a semiconductor layer ACTa of the first transistor T1, a semiconductor layer ACTb of the second transistor T2, a semiconductor layer ACTc of the third transistor T3, a semiconductor layer ACTd of the fourth transistor T4, a semiconductor layer ACTe of the fifth transistor T5, a semiconductor layer ACTf of the sixth transistor T6, and a semiconductor layer ACTg of the seventh transistor T7 may be connected to one another.

As shown in FIG. 6A, each of the first semiconductor layer ACT1 and the second semiconductor layer ACT2 may include a channel region 131a of the first transistor T1, a channel region 131b of the second transistor T2, channel regions 131c1 and 131c2 of the third transistor T3, channel regions 131d1 and 131d2 of the fourth transistor T4, a channel region 131e of the fifth transistor T5, a channel region 131f of the sixth transistor T6, and a channel region 131g of the seventh transistor T7. For example, the channel region in each of the first to seventh transistors T1 to T7 may be a part of the semiconductor layer ACT. Because the channel region 131a of the first transistor T1 may be curved and elongated, a driving range of a gate voltage applied to the gate electrode may be increased. The channel region 131a of the first transistor T1 may have various shapes, e.g., '⊏', '⊇','S', 'M', 'W', etc.

The semiconductor layer of each of the first to seventh transistors T1 to T7 may include source and drain regions at opposite sides of the channel region. As shown in FIG. 6A, each of the first semiconductor layer ACT1 and the second semiconductor layer ACT2 may include a source region 176a and a drain region 177a of the first transistor T1, a source region 176b and a drain region 177b of the second transistor T2, a source region 176c and a drain region 177c of the third transistor T3, a source region 176d and a drain region 177d of the fourth transistor T4, a source region 176e and a drain region 177e of the fifth transistor T5, a source region 176f and a drain region 177f of the sixth transistor T6, and a source region 176g and a drain region 177g of the seventh transistor T7. In some cases, the source region and the drain region may be interpreted as a source electrode and a drain electrode of a transistor. For example, a source electrode and a drain electrode of the first transistor T1 may respectively correspond to the source region 176a and the drain region 177a doped with impurities around the channel region 131a in the semiconductor layer ACT shown in FIG. 6A. According to embodiments, locations of the source region and the drain region may be changed.

The source region 176a of the first transistor T1 may be connected to the drain region 177b of the second transistor T2 and the source region 176e of the fifth transistor T5. The drain region 177a of the first transistor T1 may be connected to the source region 176c of the third transistor T3 and the drain region 177f of the sixth transistor T6. The drain region 177c of the third transistor T3 may be connected to the drain region 177d of the fourth transistor T4. The source region 176d of the fourth transistor T4 may be connected to the drain region 177g of the seventh transistor T7. The third transistor T3 may be a dual-thin film transistor including two channel regions 131c1 and 131c2, and a region between the channel regions 131c1 and 131c2 may be a region doped with impurities and may locally correspond to a source region of a dual-thin film transistor and a drain region of another dual-thin film transistor. The fourth transistor T4 may be a dual-thin thin film transistor including two channel regions 131d1 and 131d2, and a region between the channel regions 131d1 and 131d2 may be a region doped with impurities and may locally correspond to a source region of a dual-thin film transistor and a drain region of another dual-thin film transistor.

At a boundary between the first pixel area SPA1 and the second pixel area SPA2, the source region 176d of the fourth transistor T4 and the drain region 177g of the seventh transistor T7 in the first pixel PXL may be connected to the source region 176d of the fourth transistor T4 and the drain region 177g of the seventh transistor T7 in the second pixel PXR.

A first gate insulating layer 111 may be on the semiconductor layer ACT. The first gate insulating layer 111 may include inorganic insulating material such as silicon oxide, silicon nitride, silicon oxynitride, aluminum oxide, titanium oxide, tantalum oxide, hafnium oxide, etc., or a combination thereof. The first gate insulating layer 111 may have a single-layered or multi-layered structure including the above materials.

Figure 6B:
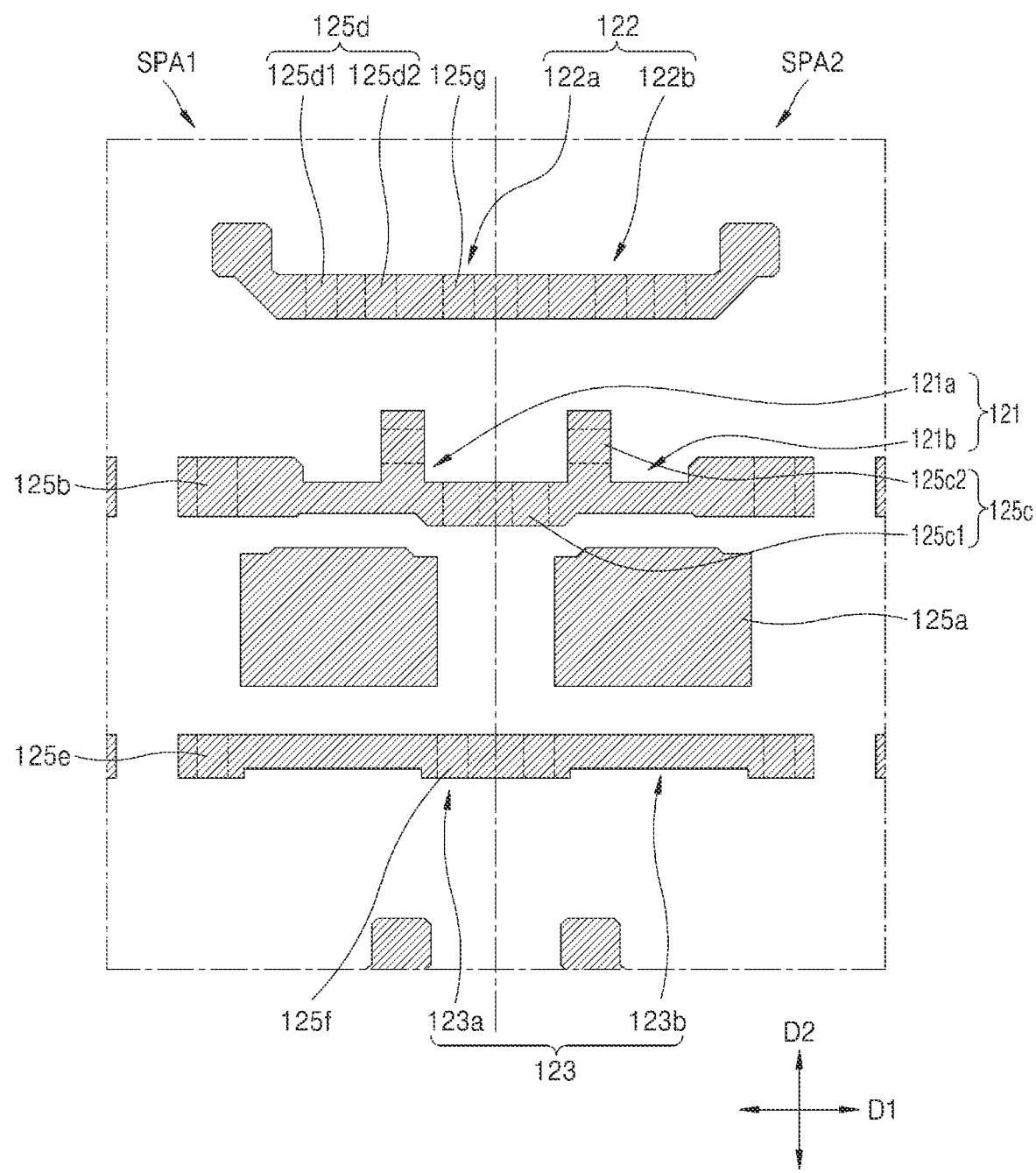

As shown in FIG. 6B, in the first pixel area SPA1 and the second pixel area SPA2, a gate electrode 125a of the first transistor T1, a gate electrode 125b of the second transistor T2, gate electrodes 125c1 and 125c2 of the third transistor T3, gate electrodes 125d1 and 125d2 of the fourth transistor T4, a gate electrode 125e of the fifth transistor T5, a gate electrode 125f of the sixth transistor T6, and a gate electrode 125g of the seventh transistor T7 may be on the first gate insulating layer 111. The gate electrode 125a of the first transistor T1 may function as a lower electrode of the capacitor Cst.

A first scan line 121, a second scan line 122, and an emission control line 123, which may be at the same layer and may include the same material as those of the gate electrodes of the first to seventh transistors T1 to T7, may extend in the first direction D1 on the first gate insulating layer 111, and may cross the first pixel area SPA1 and the second pixel area SPA2.

The first scan line 121 may include a 1-1 scan line 121a in the first pixel area SPA1 and a 1-2 scan line 121b in the second pixel area SPA2. The 1-1 scan line 121a and the 1-2 scan line 121b may be connected to each other. For example, the first scan line 121 may include the 1-1 scan line 121a in the first pixel PXL and the 1-2 scan line 121b in the second pixel PXR provided integrally with each other.

The second scan line 122 may include a 2-1 scan line 122a in the first pixel area SPA1 and a 2-2 scan line 122b in the second pixel area SPA2. The 2-1 scan line 122a and the 2-2 scan line 122b may be connected to each other. For example, the second scan line 122 may include the 2-1 scan line 122a in the first pixel PXL and the 2-2 scan line 122b in the second pixel PXR provided integrally with each other.

The emission control line 123 may include a first emission control line 123a in the first pixel area SPA1 and a second emission control line 123b in the second pixel area SPA2. The first emission control line 123a and the second emission control line 123b may be connected to each other. For example, the emission control line 123 may include the first emission control line 123a in the first pixel PXL and the second emission control line 123b in the second pixel PXR provided integrally with each other.

The gate electrode 125b of the second transistor T2 and the gate electrodes 125c1 and 125c2 of the third transistor T3 may be portions of the first scan line 121 overlapping the semiconductor layer ACT or portions protruding from the first scan line 121. The gate electrodes 125d1 and 125d2 of the fourth transistor T4 and the gate electrode 125g of the seventh transistor T7 may be portions of the second scan line 122 overlapping the semiconductor layer ACT or portions protruding from the second scan line 122. The gate electrode 125e of the fifth transistor T5 and the gate electrode 125f of the sixth transistor T6 may be portions of the emission control line 123 overlapping the semiconductor layer ACT or portions protruding from the emission control line 123. The gate electrode 125a of the first transistor T1 may be of an island type overlapping the channel region 131a of the first and the semiconductor layer ACT1 and ACT2. The third transistor T3 and the fourth transistor T4 may be dual-thin film transistors each including two gate electrodes.

The gate electrodes of the first to seventh transistors T1 to T7 may have a single-layered or multi-layered structure including one or more selected from aluminum (Al), platinum (Pt), palladium (Pd), argentum (Ag), magnesium (Mg), aurum (Au), nickel (Ni), neodymium (Nd), iridium (Ir), chromium (Cr), lithium (Li), calcium (Ca), molybdenum (Mo), titanium (Ti), tungsten (W), and copper (Cu).

The first scan line 121, the second scan line 122, and the emission control line 123 in the pixel area PXA may be separated from the first scan line 121, the second scan line 122, and the emission control line 123 in another pixel area PXA.

A second gate insulating layer 112 may be on the gate electrodes of the first to seventh transistors T1 to T7. The second gate insulating layer 112 may each include inorganic insulating material such as silicon oxide, silicon nitride, silicon oxynitride, aluminum oxide, titanium oxide, tantalum oxide, hafnium oxide, etc., or a combination thereof. The second gate insulating layer 112 may have a single-layered or multi-layered structure including the above materials.

Figure 6C:
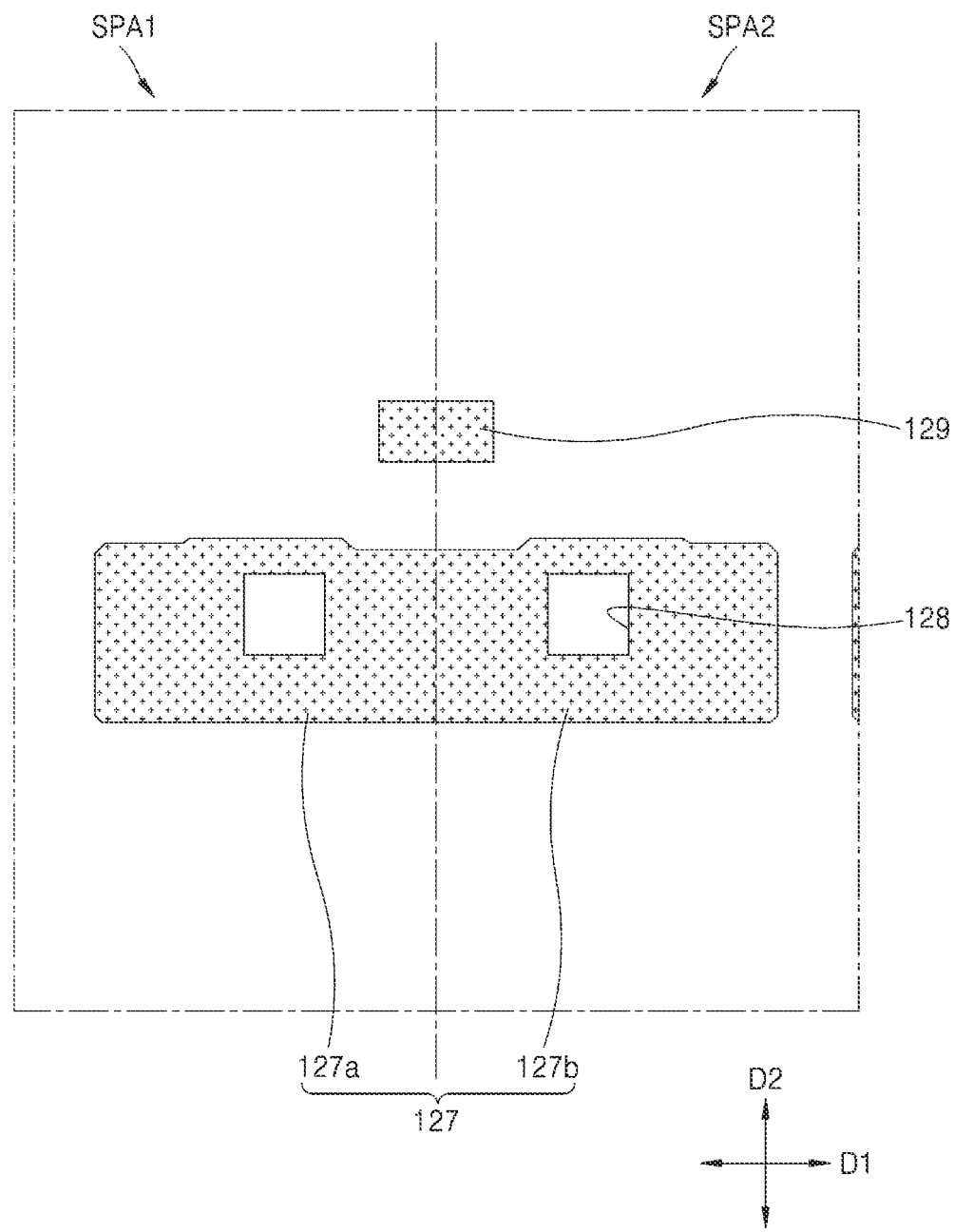

As shown in FIG. 6C, an electrode voltage layer 127 extends on the second gate insulating layer 112 in the first direction D1 and may extend across the first pixel area SPA1 and the second pixel area SPA2. The electrode voltage layer 127 may include a first portion 127a that may overlap the gate electrode 125a of the first transistor T1 in the first pixel area SPA1, and a second portion 127b that may overlap the gate electrode 125a of the first transistor T1 in the second pixel area SPA2. The first portion 127a may function as an upper electrode of the capacitor Cst in the first pixel PXL, and the second portion 127b may function as an upper electrode of the capacitor Cst in the second pixel PXR. For example, the capacitor Cst may share the gate electrode 125a of the first transistor T1 as a lower electrode and may overlap the first transistor T1. Each of the first portion 127a and the second portion 127b in the electrode voltage layer 127 may include an opening 128.

The electrode voltage layer 127 may have a single or multi-layered structure including one or more materials from aluminum (Al), platinum (Pt), palladium (Pd), argentum (Ag), magnesium (Mg), aurum (Au), nickel (Ni), neodymium (Nd), iridium (Ir), chromium (Cr), lithium (Li), calcium (Ca), molybdenum (Mo), titanium (Ti), tungsten (W), and copper (Cu).

The electrode voltage layer 127 in the pixel area PXA may be separated apart from the electrode voltage layer 127 in another pixel area PXA.

A first shielding electrode 129 may be further on the second gate insulating layer 112. The first shielding electrode 129 may include the same material as that of the electrode voltage layer 127. The first shielding electrode 129 may overlap the source/drain region 176c/177c between the two channel regions 131c1 and 131c2 of the third transistor T3 in each of the first pixel PXL and the second pixel PXR. The first shielding electrode 129 may be at the boundary between the first pixel area SPA1 and the second pixel area SPA2 and may be shared by the first pixel PXL and the second pixel PXR. The first shielding electrode 129 may prevent the third transistor T3 in each of the first pixel PXL and the second pixel PXR from being affected by light incident from outside and/or other electrical signals.

A first interlayer insulating layer 113 may be on the electrode voltage layer 127 and the first shielding electrode 129. The first interlayer insulating layer 113 may include inorganic insulating material such as silicon oxide, silicon nitride, silicon oxynitride, aluminum oxide, titanium oxide, tantalum oxide, hafnium oxide, etc., or a combination thereof. The first interlayer insulating layer 113 may have a single-layered or multi-layered structure including the above materials.

Figure 6D:
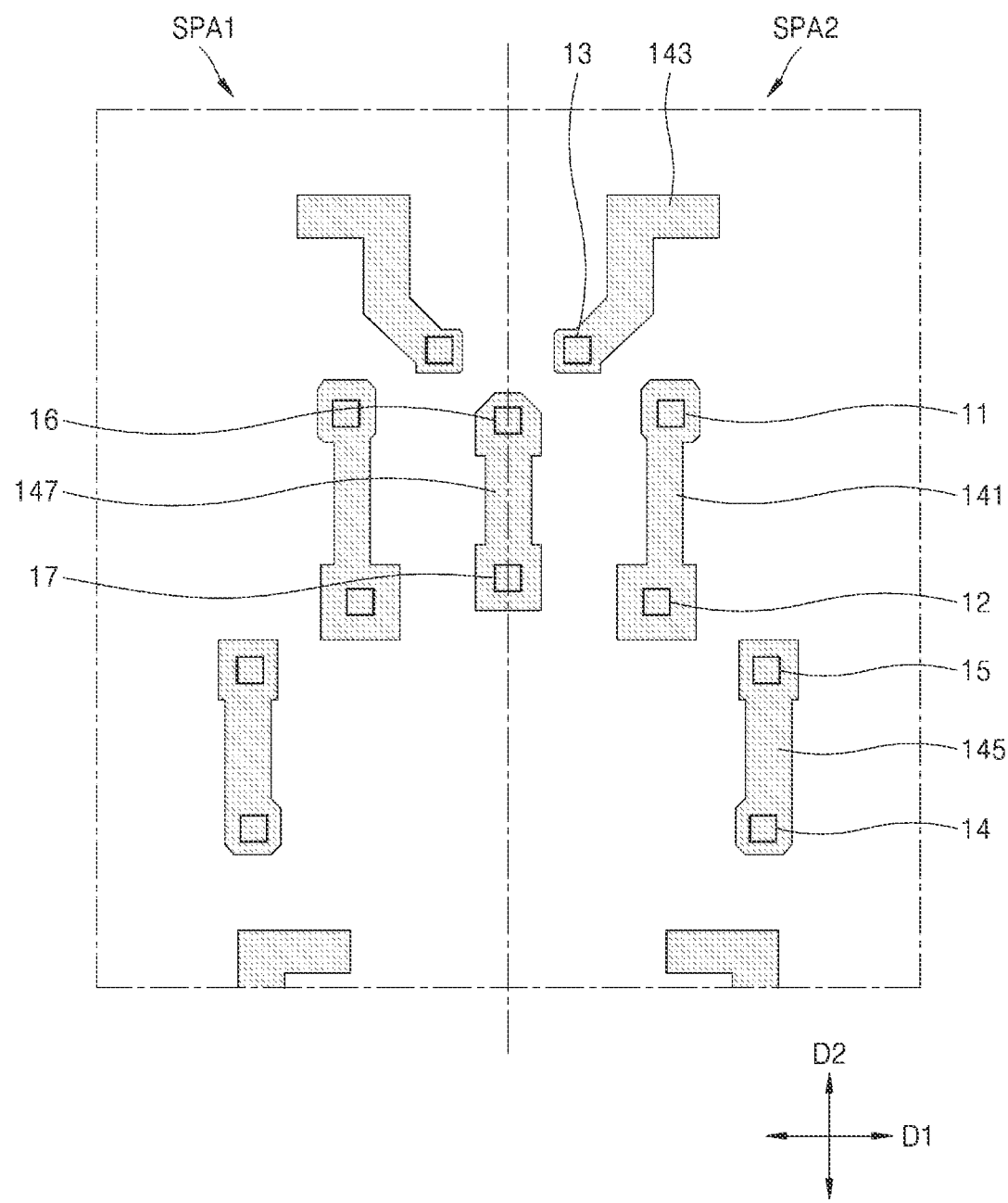

As shown in FIG. 6D, a node electrode 141, a second shielding electrode 143, a first connecting electrode 145, and a second connecting electrode 147 may be on the first interlayer insulating layer 113. The node electrode 141, the second shielding electrode 143, the first connecting electrode 145, and the second connecting electrode 147 may each have a single-layered or multi-layered structure including one or more materials selected from aluminum (Al), platinum (Pt), palladium (Pd), argentum (Ag), magnesium (Mg), aurum (Au), nickel (Ni), neodymium (Nd), iridium (Ir), chromium (Cr), lithium (Li), calcium (Ca), molybdenum (Mo), titanium (Ti), tungsten (W), and copper (Cu).

The node electrode 141 may be in each of the first pixel area SPA1 and the second pixel area SPA2. An end of the node electrode 141 may be connected to the gate electrode 125a of the first transistor T1 via a contact hole 12 in the second gate insulating layer 112 and the first interlayer insulating layer 113. Another end of the node electrode 141 may be connected to the drain region 177c of the third transistor T3 and the drain region 177d of the fourth transistor T4 via a contact hole 11 in the first gate insulating layer 111, the second gate insulating layer 112, and the first interlayer insulating layer 113.

The second shielding electrode 143 may be in each of the first pixel area SPA1 and the second pixel area SPA2. An end of the second shielding electrode 143 may be connected to the source region 176d of the fourth transistor T4 and the drain region 177g of the seventh transistor T7 via contact holes 13 in the first gate insulating layer 111, the second gate insulating layer 112, and the first interlayer insulating layer 113. The second shielding electrode 143 may overlap the source/drain region 176d/177d between the two channel regions 131d1 and 131d2 of the fourth transistor T4. The second shielding electrode 143 may prevent the fourth transistor T4 from being affected by the light incident from outside and/or other electrical signals.

The first connecting electrode 145 may be in each of the first pixel area SPA1 and the second pixel area SPA2. An end of the first connecting electrode 145 may be connected to the drain region 177e of the fifth transistor T5 via contact holes 14 in the first gate insulating layer 111, the second gate insulating layer 112, and the first interlayer insulating layer 113, and another end of the first connecting electrode 145 may be connected to the upper electrode 127 of the capacitor Cst via a contact hole 15 in the first interlayer insulating layer 113.

The second connecting electrode 147 may be at the boundary between the first pixel area SPA1 and the second pixel area SPA2 and may be shared by the first pixel PXL and the second pixel PXR. An end of the second connecting electrode 147 may overlap the first shielding electrode 129 and may be connected to the first shielding electrode 129 via a contact hole 16 in the first interlayer insulating layer 113. Another end of the second connecting electrode 147 overlaps the electrode voltage layer 127 and may be connected to the electrode voltage layer 127 via a contact hole 17 in the first interlayer insulating layer 113.

A second interlayer insulating layer 114 may be on the node electrode 141, the second shielding electrode 143, the first connecting electrode 145, and the second connecting electrode 147. The second interlayer insulating layer 114 may include inorganic insulating material such as silicon oxide, silicon nitride, silicon oxynitride, aluminum oxide, titanium oxide, tantalum oxide, hafnium oxide, etc. The second interlayer insulating layer 114 may have a single-layered or multi-layered structure including the above materials.

Figure 6E:
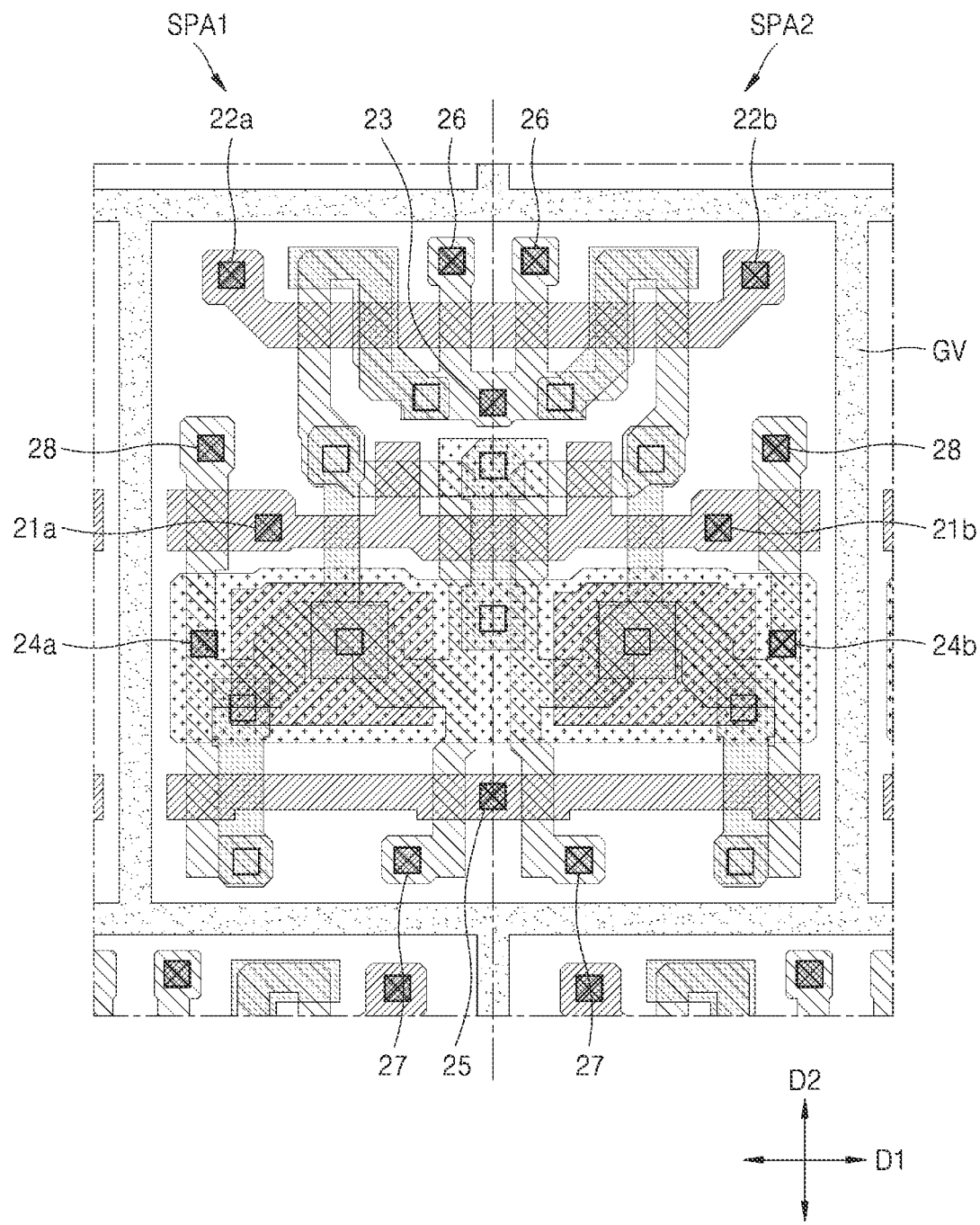

FIG. 6E shows a stack structure of conductive layers shown in FIGS. 6A to 6D. As shown in FIG. 6E, the groove GV surrounding the pixel area PXA may be provided in the buffer layer 110, the first and second gate insulating layers 111 and 112, and the first and second interlayer insulating layers 113 and 114. Hereinafter, the buffer layer 110, the first and second gate insulating layers 111 and 112, and the first and second interlayer insulating layers 113 and 114 may be collectively referred to as an inorganic insulating layer IL. The groove GV may denote a trench formed in the inorganic insulating layer IL. In an embodiment, the inorganic insulating layer IL may be divided by the groove GV into inorganic patterns of island shapes in units of pixel area PXA.

The groove GV may be provided between adjacent pixel areas PXA and may surround each pixel area PXA. The groove GV may include an opening 111a in the first gate insulating layer 111, an opening 112a in the second gate insulating layer 112, an opening 113a in the first interlayer insulating layer 113, and an opening 114a in the second interlayer insulating layer 114. The groove GV may further include an opening 110a in the buffer layer 110. However, one or more embodiments are not limited thereto, and the groove GV may be variously modified. For example, the buffer layer 110 may not include an opening or the buffer layer 110 may not be partially or entirely removed but may remain.

The openings 110a, 111a, 112a, 113a, and 114a in the inorganic insulating layer IL may overlap one another. In FIGS. 7 to 9, the opening 110a in the buffer layer 110, the opening 111a in the first gate insulating layer 111, the opening 112a in the second gate insulating layer 112, the opening 113a in the first interlayer insulating layer 113, and the opening 114a in the second interlayer insulating layer 114 may have inner side surfaces coinciding with one another. In another embodiment, the inner side surfaces of the openings 110a, 111a, 112a, 113a, and 114a may not coincide with one another, and the openings 110a, 111a, 112a, 113a, and 114a may have different sizes from one another.

A width W of the groove GV may be about a few pm. For example, the width W of the groove GV in the inorganic insulating layer IL may be about 5 μm to about 10 μm. The substrate 100 may be exposed by the groove GV of the inorganic insulating layer IL.

The groove GV may be obtained by a mask process. In the mask process, a dry etching may be performed.

Contact holes 21a, 21b, 22a, 22b, 23, 24a, 24b, 25, 26, 27, and 28 for making a conductive layer formed on the second interlayer insulating layer 114 in contact with a lower conductive layer (e.g., a semiconductor layer, gate electrode, an upper electrode of the capacitor, etc.) may be in at least one of the first and second gate insulating layers 111 and 112 and the first and second interlayer insulating layers 113 and 114. The contact holes 21a, 21b, 22a, 22b, 23, 24a, 24b, 25, 26, 27, and 28 may be obtained simultaneously with the forming of the groove GV in the mask process for forming the groove GV. FIG. 6E only shows locations corresponding to the contact holes 21a, 21b, 22a, 22b, 23, 24a, 24b, 25, 26, 27, and 28 and insulating layers are omitted for convenience of description and disclosure.

Figure 6F:
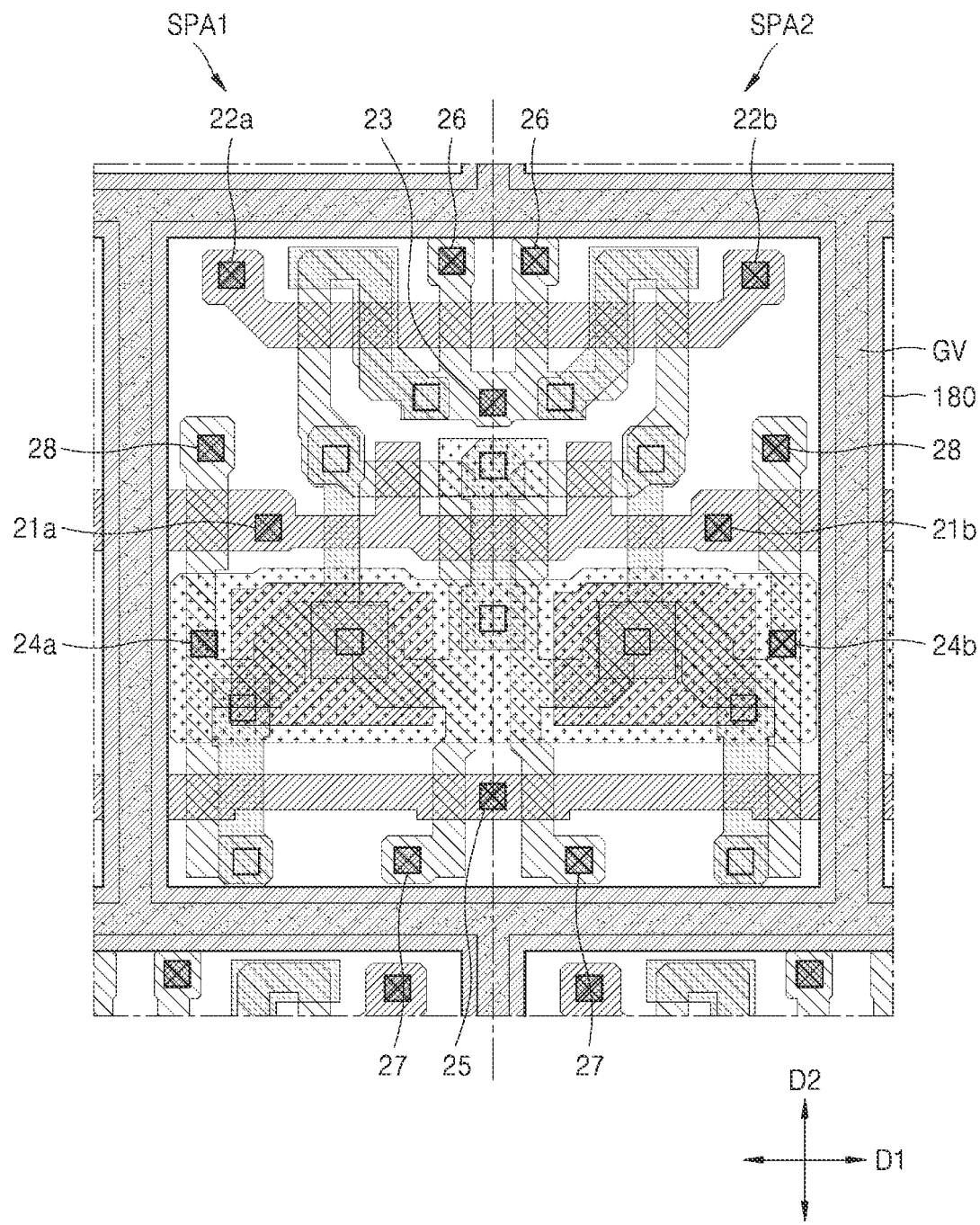

As shown in FIG. 6F, the organic material layer 180 may be filled in the groove GV of the inorganic insulating layer IL. The organic material layer 180 may at least partially fill the groove GV of the inorganic insulating layer IL. The organic material layer 180 may not completely fill the groove GV. Also, the organic material layer 180 may not fill portions of the groove GV. However, the organic material layer 180 may completely fill the groove GV in order to absorb external shock. In some embodiments, the organic material layer 180 may extend to an upper surface of the inorganic insulating layer IL. An upper surface of the organic material layer 180 may have a convex shape due to characteristics of the organic material layer.

An angle between the upper surface of the organic material layer 180 and the upper surface of the inorganic insulating layer IL may be about 45 degrees or less. In case that an inclination of a boundary where the upper surface of the inorganic insulating layer IL and the upper surface of the organic material layer 180 meet each other is not gradual, a conductive material may not be removed but may remain at the boundary while the connecting lines 151 to 156 may be formed by patterning the conductive layer. In the above case, the remaining conductive material may cause a short with other conductive layers. Therefore, the upper surface of the organic material layer 180 may have a gradual (slow) inclination with respect to the upper surface of the inorganic insulating layer IL.

The organic material layer 180 may include one or more materials selected from the group consisting of acryl, metacryl, polyester, polyethylene, polypropylene, polyethylene terephthalate, polyethylene naphthalate, polycarbonate, polyimide, polyethylene sulfonate, polyoxymethylene, polyarilate, and hexamethyldisiloxane.

The organic material layer 180 surrounds the pixel area PXA along with the groove GV, and thus, may partition the pixels PX in units of pixel area PXA. Accordingly, propagation of stress or cracks due to folding of the display panel 10 to other pixel areas may be prevented.

Figure 6G:
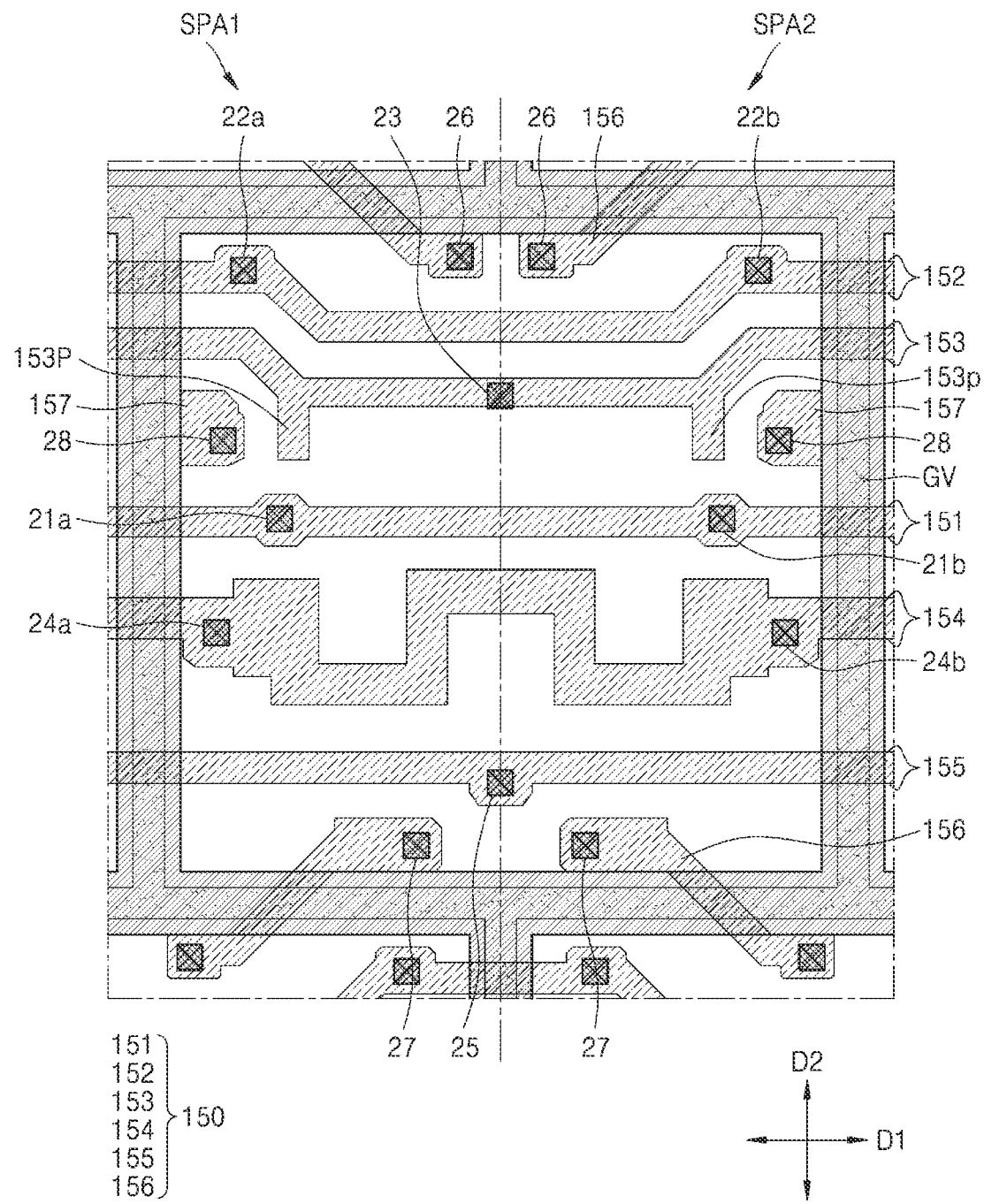

As shown in FIG. 6G, connecting lines 150 may be on the second interlayer insulating layer 114. A third connecting electrode 157 may be further on the second interlayer insulating layer 114. The connecting lines 150 may include conductive lines extending across the groove GV and the organic material layer 180 in the first direction D1 or the second direction D2. The connecting lines 150 may include soft lines each including a material with a high elongation rate. The connecting lines 150 and the third connecting electrode 157 may include a single-layered or multi-layered structure including magnesium (Mg), aluminum (Al), copper (Cu), titanium (Ti), etc., or a combination thereof. In an embodiment, the connecting lines 150 and the third connecting electrode 157 may each have a multi-layered structure including Ti/Al/Ti.

The connecting lines 150 may include a first scan connecting line 151, a second scan connecting line 152, an initialization voltage connecting line 153, a power voltage connecting line 154, an emission control connecting line 155, and a semiconductor layer connecting line 156.

The first scan connecting line 151 may extend in the first direction D1 while overlapping the first scan line 121 and may be arranged across the first pixel area SPA1 and the second pixel area SPA2. The first scan connecting line 151 may be connected to the first scan line 121 via the contact holes 21a and 21b in the second gate insulating layer 112, the first interlayer insulating layer 113, and the second interlayer insulating layer 114.

The second scan connecting line 152 may extend in the first direction D1 while overlapping the second scan line 122 and may be arranged across the first pixel area SPA1 and the second pixel area SPA2. The second scan connecting line 152 may be connected to the second scan line 122 via the contact holes 22a and 22b in the second gate insulating layer 112, the first interlayer insulating layer 113, and the second interlayer insulating layer 114.

The initialization voltage connecting line 153 may extend in the first direction D1 across the first pixel area SPA1 and the second pixel area SPA2. The initialization voltage connecting line 153 may be connected to a portion where the first semiconductor layer ACT1 of the first pixel PXL and the second semiconductor layer ACT2 of the second pixel PXR may be connected, for example, the third semiconductor layer ACT3, via the contact hole 23 in the first gate insulating layer 111, the second gate insulating layer 112, the first interlayer insulating layer 113, and the second interlayer insulating layer 114. The initialization voltage connecting line 153 may include a protrusion 153p protruding in the second direction D2 in each of the first pixel area SPA1 and the second pixel area SPA2.

The power voltage connecting line 154 may extend in the first direction D1 while overlapping the electrode voltage layer 127 and may cross the first pixel area SPA1 and the second pixel area SPA2. The power voltage connecting line 154 may have a curved shape partially surrounding the opening 128 without overlapping the opening 128 in the electrode voltage layer 127. The power voltage connecting line 154 may be connected to the electrode voltage layer 127 via the contact holes 24a and 24b in the first interlayer insulating layer 113 and the second interlayer insulating layer 114.

The emission control connecting line 155 may extend in the first direction D1 while overlapping the emission control line 123 and may cross the first pixel area SPA1 and the second pixel area SPA2. The emission control connecting line 155 may be connected to the emission control line 123 via the contact hole 25 in the second gate insulating layer 112, the first interlayer insulating layer 113, and the second interlayer insulating layer 114 at the boundary between the first pixel area SPA1 and the second pixel area SPA2.

The semiconductor layer connecting line 156 may extend in the second direction D2 (or in a direction between the first direction D1 and the second direction D2) across the upper portion of the organic material layer 180 in the groove GV. An end of the semiconductor layer connecting line 156 may be connected to the source region 176g of the seventh transistor T7 via the contact hole 26 in the first gate insulating layer 111, the second gate insulating layer 112, the first interlayer insulating layer 113, and the second interlayer insulating layer 114. Another end of the semiconductor layer connecting line 156 may be connected to the drain region 177f of the sixth transistor T6 via the contact hole 27 in the first gate insulating layer 111, the second gate insulating layer 112, the first interlayer insulating layer 113, and the second interlayer insulating layer 114. As shown in FIGS. 5 and 9, an end and another end of the semiconductor layer connecting line 156 may be at different pixel areas PXA with the groove GV therebetween to connect the semiconductor layers of adjacent pixels PX to each other in the second direction D2.

The third connecting electrode 157 may be further on the second interlayer insulating layer 114. The third connecting electrode 157 may be connected to the source region 176b of the second transistor T2 via the contact hole 28 in the first gate insulating layer 111, the second gate insulating layer 112, the first interlayer insulating layer 113, and the second interlayer insulating layer 114. The third connecting electrode 157 may be in each of the first pixel area SPA1 and the second pixel area SPA2.

Each of the first scan connecting line 151, the second scan connecting line 152, the power voltage connecting line 154, and the emission control connecting line 155 may extend across the upper portion of the organic material layer 180 in the groove GV to connect the first scan lines 121, the second scan lines 122, the electrode voltage layers 127, and the emission control lines 123 in the pixel areas PXA adjacent to each other in the first direction D1. For example, each of the first scan connecting line 151, the second scan connecting line 152, the power voltage connecting line 154, and the emission control connecting line 155 may connect the first scan lines 121, the second scan lines 122, the electrode voltage layers 127, and the emission control lines 123 of the pixels PX in the same row, which may be divided in units of the pixel areas PXA. The power voltage connecting line 154 may be connected to the pixels PX in the pixel areas PXA adjacent to one another in the first direction D1 to apply the first power voltage ELVDD. The initialization voltage connecting line 153 may extend across the upper portion of the organic material layer 180 surrounding the pixel area PXA to be connected to the pixels PX in the pixel areas PXA adjacent to one another in the first direction and may apply the initialization voltage VINT to the pixels PX.

Before forming the conductive layers shown in FIG. 6D or before forming the conductive layers shown in FIG. 6G, a dehydrogenation annealing process may be performed on the semiconductor layer after forming the contact holes. A driving range of a driving transistor may be increased due to the annealing process.

A protective layer 115 may be on the connecting lines 150 and the third connecting electrode 157. The protective layer 115 may have a single-layered or multi-layered structure including an inorganic insulating material such as silicon oxide, silicon nitride, silicon oxynitride, aluminum oxide, titanium oxide, tantalum oxide, hafnium oxide, etc., or a combination thereof.

In an embodiment, the protective layer 115 may function as a planarization layer together with organic insulating layers that will be described later. A contact hole in the inorganic layer may have a smaller size than that of a contact hole in an organic layer. In the foldable display device having the island type pixel group structure according to the embodiment, an integration ratio of the pixel circuit for high resolution and high radio frequency (e.g., 120 Hz) driving may be increased by providing an inorganic planarization layer.

The protective layer 115 may not cover the organic material layer 180. For example, the protective layer 115 may be provided as an insulation pattern of an island type in each pixel area PXA due to the groove GV. A first insulating layer 116 may be further on the protective layer 115.

Figure 6H:
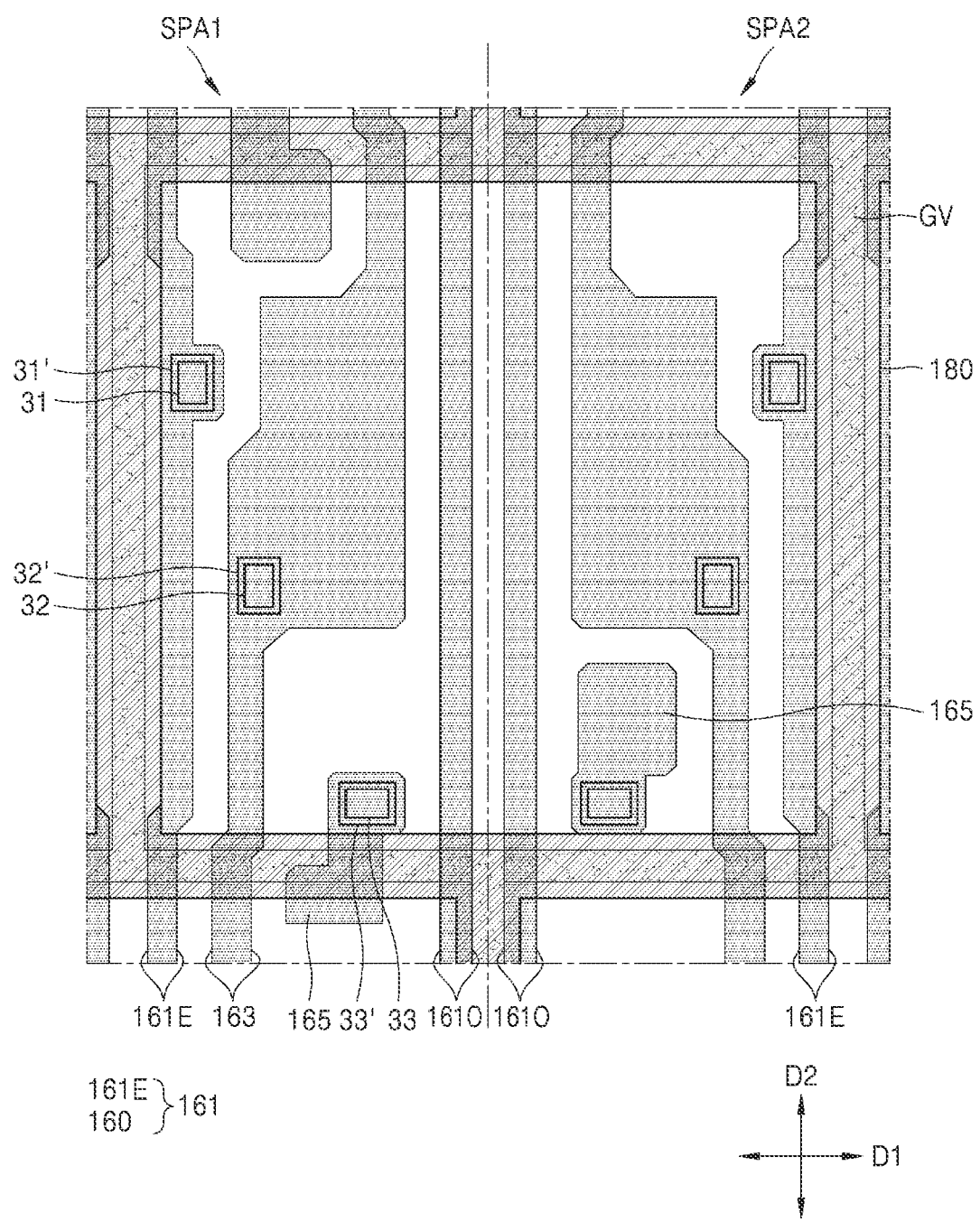
Figure 6I:
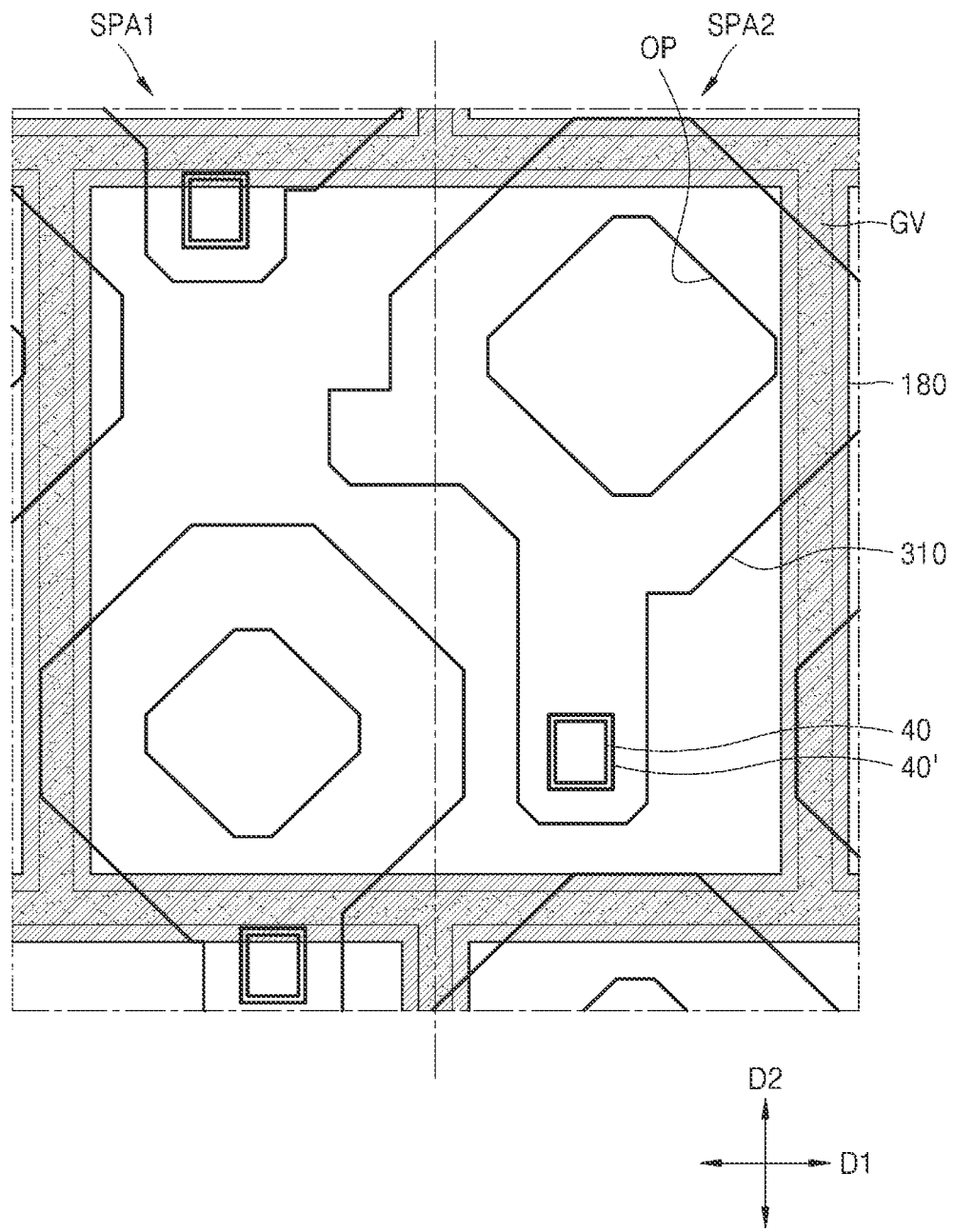

As shown in FIG. 6H, data lines 161 and a power voltage line 163 may be on the first insulating layer 116. The data lines 161 and the power voltage line 163 extend in the second direction D2 across the organic material layer 180 among the pixel areas PXA to be connected to the pixels PX adjacent to one another in the second direction D2.

The data lines 161 may include a first data line 161E and a second data line 161O. In each of the first pixel area SPA1 and the second pixel area SPA2, the first data line 161E and the second data line 161O may be separated substantially parallel with each other. The first data line 161E may be at a left side of the first pixel area SPA1 and a right side of the second pixel area SPA2 in a plan view. The second data line 161O may be at a right side of the first pixel area SPA1 and a left side of the second pixel area SPA2.

The pixels PX in even-numbered rows may be connected to the first data line 161E, and the pixels PX in odd-numbered rows may be connected to the second data line 161O. FIG. 5 shows an example, in which the first pixel PXL in the first pixel area SPA1 and the second pixel PXR in the second pixel area SPA2 may be connected to the first data line 161E. For example, the pixels PX shown in FIG. 5 may be the pixels in the even-numbered row. The data lines 161 may be connected to the third contact electrode 157 via a contact hole 31 in the protective layer 115 and a contact hole 31' in the first insulating layer 116. Because the third connecting electrode 157 may be connected to the source region 176b of the second transistor T2, the first data line 161E or the second data line 161O may be connected to the second transistor T2 via the third connecting electrode 157.

The first data line 161E may overlap the source region 176a of the first transistor T1, and the second data line 161O may overlap the drain region 177a of the first transistor T1. The first data line 161E and the second data line 161O may overlap the electrode voltage layer 127 and the power voltage connecting line 154.

The power voltage line 163 may overlap the electrode voltage layer 127 and may be substantially parallel with the data lines 161. The power voltage line 163 may be connected to the power voltage connecting line 154 via a contact hole 32 in the protective layer 115 and a contact hole 32' in the first insulating layer 116. Because the power voltage connecting line 154 may be connected to the electrode voltage layer 127, the power voltage line 163 may have a mesh structure due to the power voltage 163 extending in the second direction D2 and the electrode voltage layer 127 and the power voltage connecting line 154 extending in the first direction D1.

In case that an electric potential of the gate electrode 125a in the first transistor T1 is affected by a voltage variation in the data lines 161, a coupling may be caused between the data lines 161 and the gate electrode 125a of the first transistor T1. Also, because the node electrode 141 may be connected to the gate electrode 125a of the first transistor T1, in case that the node electrode 141 is affected by the voltage variation in the first data line 161E or the second data line 161O, the electric potential of the gate electrode 125a in the first transistor T1 may be also affected.

According to the embodiment, the initialization voltage connecting line 153 to which a constant voltage, e.g., an initialization voltage VINT, may be applied, may be at a layer between the gate electrode 125a of the first transistor T1 and the data line 161 in a cross-sectional view as shown in FIG. 7 (a part of the initialization voltage connecting line 153 that may be a protrusion 153p of the initialization voltage connecting line 153 is shown in FIG. 7). The protrusion 153p of the initialization voltage connecting line 153 may be located between an end of the node electrode 141 and the first data line 161E in a plan view as shown in FIG. 5. For example, according to the embodiment, the initialization voltage connecting line 153 may be on a layer between the data lines 161 and the node electrode 141 in order to reduce affection to the electric potential of the gate electrode 125a of the first transistor T1 due to the voltage variation in the data lines 161, and thus, the display device may display high-quality images with precise luminance.

According to an embodiment, as shown in FIG. 8, the electrode voltage layer 127 and the power voltage connecting line 154, to which the first power voltage ELVDD may be applied, may be on layers between the gate electrode 125a of the first transistor T1 and the data lines 161, and thus, the electric potential of the gate electrode 125a of the first transistor T1 may be prevented or reduced from being affected by the voltage variation in the data lines 161. Thus, the display device may display high-quality images with precise luminance. Also, the electrode voltage layer 127 and the power voltage connecting line 154 may overlap the data lines 161, and thus, the gate electrode 125a of the first transistor T1 may be shielded.

Each of the data lines 161 and the power voltage line 163 may have a single-layered or multi-layered structure including one or more selected from aluminum (Al), platinum (Pt), palladium (Pd), argentum (Ag), magnesium (Mg), aurum (Au), nickel (Ni), neodymium (Nd), iridium (Ir), chromium (Cr), lithium (Li), calcium (Ca), molybdenum (Mo), titanium (Ti), tungsten (W), and copper (Cu). In an embodiment, each of the data lines 161 and the power voltage line 163 may each have a multi-layered structure including Ti/Al/Ti.

A fourth connecting electrode 165 may be further on the first insulating layer 116. The fourth connecting electrode 165 may be connected to the semiconductor layer connecting line 156 via a contact hole 33 in the protective layer 115 and a contact hole 33' in the first insulating layer 116. The fourth connecting electrode 165 may include the same material as that of the power voltage line 163. For example, the fourth connecting electrode 165 may have a single or multi-layered structure including one or more materials selected from aluminum (Al), platinum (Pt), palladium (Pd), argentum (Ag), magnesium (Mg), aurum (Au), nickel (Ni), neodymium (Nd), iridium (Ir), chromium (Cr), lithium (Li), calcium (Ca), molybdenum (Mo), titanium (Ti), tungsten (W), and copper (Cu). In an embodiment, the fourth connecting electrode 165 may have a multi-layered structure including Ti/Al/Ti.

A mask process for forming the contact hole in the protective layer 115 and a mask process for forming a contact hole in the first insulating layer 116 may be separately performed. The contact holes 31', 32', and 33' in the first insulating layer 116 may respectively overlap the contact holes 31, 32, and 33 in the protective layer 115.

A second insulating layer 117 and a third insulating layer 118 may be sequentially on the data lines 161, the power voltage line 163, and the fourth connecting electrode 165.

The first insulating layer 116, the second insulating layer 117, and the third insulating layer 118 may each be a planarization layer and an organic insulating layer. For example, the first to third insulating layers 116, 117, and 118 may each include an organic insulating material such as a general universal polymer (polymethylmethacrylate (PMMA) or polystyrene (PS)), polymer derivatives having phenol groups, acryl-based polymer, imide-based polymer, siloxane-based polymer, aryl ether-based polymer, amide-based polymer, fluoride-based polymer, p-xylene-based polymer, vinyl alcohol-based polymer, and blends thereof. In an embodiment, the first and third insulating layers 116 and 118 may include organic insulating layers including polyimide, and the second insulating layer 117 may include an organic insulating layer including siloxane.

In case that the organic light-emitting diode OLED has an uneven structure due to steps among the conductive layers under the organic light-emitting diode OLED, a reflective color band due to the reflection of light emitted from the organic light-emitting diode OLED may be recognized. According to the embodiment, at least two or more organic insulating layers may be provided between the organic light-emitting diode OLED and the thin film transistors, and thus, lower layers of the organic light-emitting diode OLED may be planarized to address the above issue.

The foldable display device according to an embodiment may include the window 60 of a thin plastic material and may not include a polarization layer between the display panel 10 and the window 60, as shown in FIG. 3. According to the foldable display device of an embodiment, the lower layer of the organic light-emitting diode OLED may be planarized due to the organic insulating layers, and external light reflection may be reduced without using an additional polarization layer.

In FIGS. 7 to 9, two organic insulating layers, for example, the second and third insulating layers 117 and 118, may be between the organic light-emitting diode OLED and the thin film transistor. However, in another embodiment, three or more organic insulating layers may be between the organic light-emitting diode OLED and the thin film transistor.

A display element, for example, the organic light-emitting diode OLED, may be on the third insulating layer 118. The organic light-emitting diode OLED may include a first electrode 310, for example, a pixel electrode, an intermediate layer 320, and a second electrode 330, for example, an opposite electrode.

As shown in FIG. 6I, the first electrode 310 of the organic light-emitting diode OLED may be on the third insulating layer 118. The first electrode 310 in the first pixel area SPA1 and the first electrode 310 in the second pixel area SPA2 may be offset from each other. A center of the first electrode 310 in the first pixel area SPA1 and a center of the first electrode 310 in the second pixel area SPA2 may be offset from each other.

The first electrode 310 may partially extend to a neighboring pixel area that may be adjacent to the pixel area of the first electrode 310 with the groove GV therebetween. For example, in FIG. 6I, the first electrode 310 in the first pixel area SPA1 may be in the first pixel area SPA1, and may partially extend to the upper portion of the organic material layer 180 and a second pixel area in another pixel area PXA. The first electrode 310 in the second pixel area SPA2 may be in the second pixel area SPA2, and may partially extend to the first pixel area SPA1 and the upper portion of the organic material layer 180.

The first electrode 310 in the first pixel area SPA1 or the first electrode 310 in the second pixel area SPA2 may partially overlap the first shielding electrode 129. Accordingly, the first electrode 310 in the first pixel area SPA1 or the first electrode 310 in the second pixel area SPA2 may overlap the source/drain region 176c/177c between the two channel regions 131c1 and 131c2 of the third transistor T3 in each of the first pixel PXL and the second pixel PXR. For example, the first electrode 310 in the first pixel area SPA1 or the first electrode 310 in the second pixel area SPA2 may function as a shielding layer with the first shielding electrode 129, in order to prevent the third transistor T3 in each of the first pixel PXL and the second pixel PXR from being affected by the light incident from outside and/or other peripheral electrical signals.

The first electrode 310 may be connected to the fourth connecting electrode 165 via a contact hole 40 in the second insulating layer 117 and a contact hole 40' in the third insulating layer 118 as shown in FIG. 9. Accordingly, the first electrode 310 may be connected to the sixth transistor T6 via the semiconductor connecting line 156 on the second interlayer insulating layer 114 and the fourth connecting electrode 165 on the first insulating layer 116.

A mask process for forming the contact hole in the second insulating layer 117 and a mask process for forming the contact hole in the third insulating layer 118 may be separately performed. The contact hole 40' in the third insulating layer 118 may overlap the contact hole 40 in the second insulating layer 117.

The first electrode 310 may include a conductive oxide such as indium tin oxide (ITO), indium zinc oxide (IZO), zinc oxide (ZnO), indium oxide ($In_2O_3$), indium gallium oxide, or aluminum zinc oxide (AZO), or a combination thereof. In another embodiment, the first electrode 310 may include a reflective layer including argentum (Ag), magnesium (Mg), aluminum (Al), platinum (Pt), palladium (Pd), aurum (Au), nickel (Ni), neodymium (Nd), iridium (Ir), chromium (Cr), or a compound thereof. In another embodiment, the first electrode 310 may further include a layer including ITO, IZO, ZnO, or $In_2O_3$, or a combination thereof, on and/or under the reflective layer.

A fourth insulating layer 119 may be on the third insulating layer 118. The fourth insulating layer 119 may include an opening corresponding to each pixel, for example, an opening OP for exposing at least a central portion of the first electrode 310. The opening OP in the fourth insulating layer 119 may define an emission area EA of a pixel. For example, the fourth insulating layer 119 may correspond to other regions than the emission area EA, for example, non-emission area, and the pixel circuit PC may overlap the emission area EA and/or the non-emission area.

The fourth insulating layer 119 may increase a distance between an edge of the first electrode 310 and the second electrode 330 on the first electrode 310 to prevent generation of arc at the edge of the first electrode 310. The fourth insulating layer 119 may include an organic material, for example, polyimide (PI), hexamethyldisiloxane (HMDSO), etc., or a combination thereof. A size of the emission area EA may vary depending on a color of light emitted from the pixel.

The intermediate layer 320 may include an emission layer. The emission layer may include a polymer or low-molecular weight organic material emitting a light (e.g., a color light). In an embodiment, the intermediate layer 320 may further include a first functional layer under the emission layer and/or a second functional layer on the emission layer. The first functional layer and/or the second functional layer may include a layer formed integrally throughout the first electrodes 310 or patterned to correspond to each of the first electrodes 310.

The first functional layer may have a single-layered or multi-layered structure. For example, in case that the first functional layer includes a polymer material, the first functional layer may include a hole transport layer (HTL) having a single-layered structure, and may include poly-(3,4)-ethylene-dihydroxy thiophene (PEDOT), polyaniline (PANI), or a combination thereof. In case that the first functional layer includes a low-molecular weight material, the first functional layer may include a hole injection layer (HIL) and an HTL.

The second functional layer may be optional. For example, in case that the first functional layer and the emission layer include a polymer material, the second functional layer may be formed in order to improve characteristics of the organic light-emitting diode. The second functional layer may have a single-layered or multi-layered structure. The second functional layer may include an electron transport layer (ETL) and/or an electron injection layer (EIL).

The second electrode 330 may face the first electrode 310 with the intermediate layer 320 therebetween. The second electrode 330 may include a conductive material having a low work function. For example, the second electrode 330 may include a (semi-)transparent layer including argentum (Ag), magnesium (Mg), aluminum (Al), platinum (Pt), palladium (Pd), aurum (Au), nickel (Ni), neodymium (Nd), iridium (Ir), chromium (Cr), lithium (Li), calcium (Ca), or an alloy thereof. As another example, the second electrode 330 may further include a layer including ITO, IZO, ZnO, or $In_2O_3$, or a combination thereof on the (semi-)transparent layer including the above material.

The second electrode 330 may be provided integrally with respect to the organic light-emitting diodes OLED to face the first electrodes 310, and may be on the intermediate layer 320 and the fourth insulating layer 119.

The encapsulation layer 400 may be on the second electrode 330 to protect the display panel 10 against external impurities or moisture. The encapsulation layer 400 may include at least one organic encapsulation layer and at least one inorganic encapsulation layer. FIGS. 7 to 9 show that the encapsulation layer 400 may include first and second inorganic encapsulation layers 410 and 430 and an organic encapsulation layer 420 between the first and second inorganic encapsulation layers 410 and 430. In another embodiment, a stacking order and the number of organic and inorganic encapsulation layers may vary.

The first and second inorganic encapsulation layers 410 and 430 may each include one or more inorganic insulating materials from aluminum oxide, titanium oxide, tantalum oxide, hafnium oxide, zinc oxide, silicon oxide, silicon nitride, silicon oxynitride, etc. The organic encapsulation layer 420 may include polyethylene terephthalate, polyethylene naphthalate, polycarbonate, polyimide, polyethylene sulfonate, polyoxymethylene, polyarylate, hexamethyl disiloxane, an acryl-based resin (e.g., polymethyl methacrylate, polyacrylic acid, etc.), or a combination thereof. Because the first inorganic encapsulation layer 410 may be formed along a structure thereunder, the first inorganic encapsulation layer 410 may have an uneven upper surface. The organic encapsulation layer 420 may have a sufficient thickness enough to cover the first inorganic encapsulation layer 410. An upper surface of the organic encapsulation layer 420 may be substantially flat throughout the entire display area DA. The second inorganic encapsulation layer 430 may extend to an outer portion of the organic encapsulation layer 420 to contact the first inorganic encapsulation layer 410, and the organic encapsulation layer 420 may not be exposed to outside.

Figure 10:
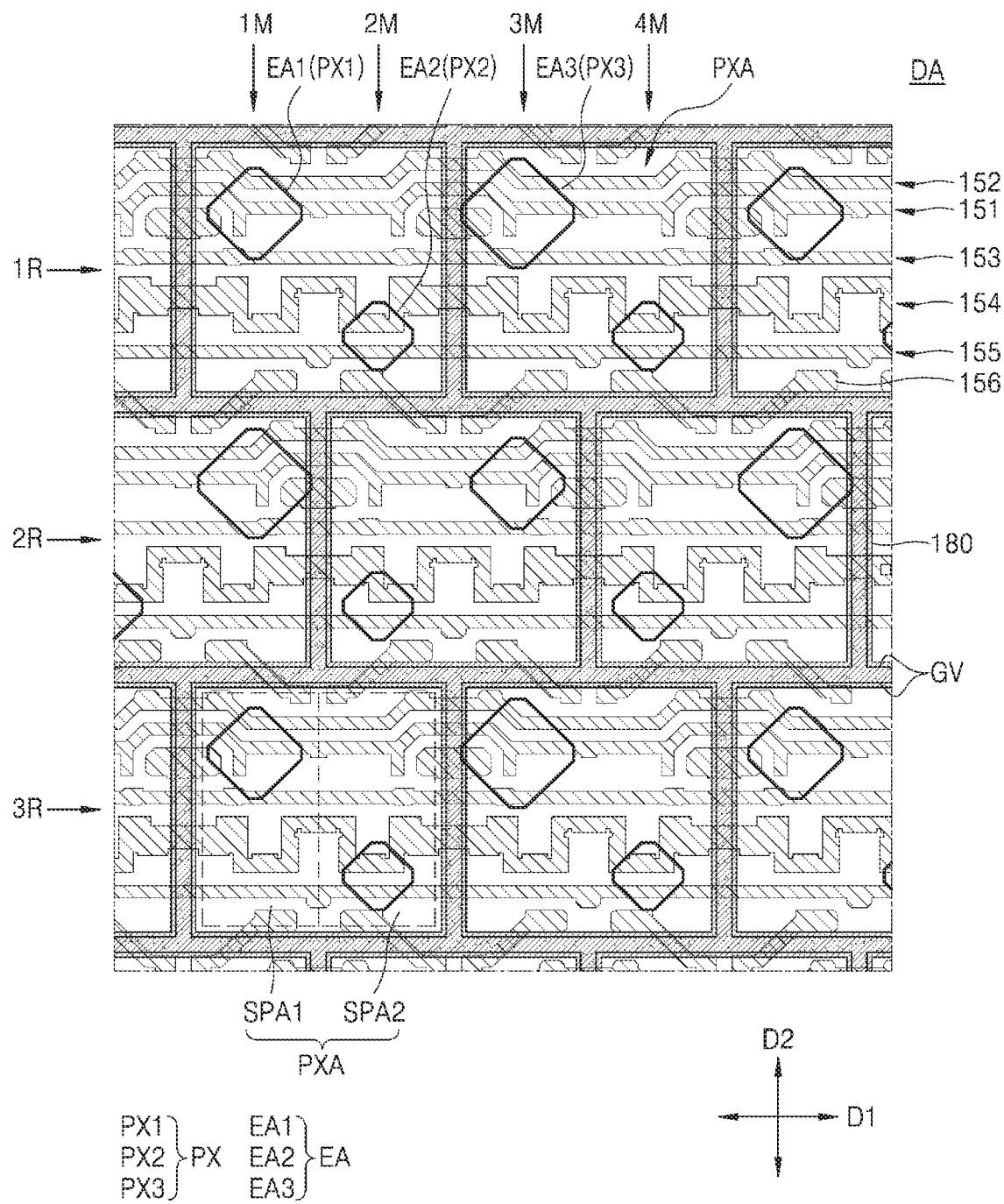
FIG. 10 is a schematic plan view showing a relationship between pixel areas and connecting lines according to an embodiment.

FIG. 10 is a schematic plan view showing a relationship between pixel areas PXA and connecting lines 150 according to an embodiment. FIG. 10 shows the connecting lines 150 in the display area DA, patterns of the groove GV and the organic material layer 180, and arrangement of the emission areas EA.

The display area DA of the substrate 100 may include the pixel areas PXA, and each of the pixel areas PXA may include the first pixel area SPA1 and the second pixel area SPA2. The inorganic insulating layer IL (see FIG. 7) including inorganic patterns of island types in the pixel areas PXA may be on the display area DA of the substrate 100. The inorganic patterns may be surrounded by the groove GV.

The organic material layer 180 may be among the inorganic patterns and may include holes (openings). Each of the holes in the organic material layer 180 may correspond to each of the pixel areas PXA. The groove GV and the organic material layer 180 in the display area DA may have lattice structures.

The display panel 10 according to an embodiment may include the pixels PX in the display area DA. The pixels PX may include first color pixels PX1 emitting first color light, second color pixels PX2 emitting second color light, and third color pixels PX3 emitting third color light. The first color pixels PX1, the second color pixels PX2, and the third color pixels PX3 may be repeatedly arranged according to a certain pattern in the first direction D1 and the second direction D2. In an embodiment, the first color pixels PX1 may include red pixels, the second color pixels PX2 may include green pixels, and the third color pixels PX3 may include blue pixels. In another embodiment, the first color pixels PX1 may include red pixels, the second color pixels PX2 may include blue pixels, and the third color pixels PX3 may include green pixels.

Referring to FIG. 10, the organic light-emitting diode OLED in each of the first color pixels PX1 may include a first emission area EA1, the organic light-emitting diode OLED in each of the second color pixels PX2 may include a second emission area EA2, and the organic light-emitting diode OLED in each of the third color pixels PX3 may include a third emission area EA3.

In each of rows 1R, 2R, 3R . . . , the first emission area EA1 of the first color pixel PX1, the second emission area EA2 of the second color pixel PX2, the third emission area EA3 of the third color pixel PX3, and the second emission area EA2 of the second color pixel PX2 may be repeatedly arranged in zig-zags in the first direction D1.

In an odd-numbered column 1M, 3M . . . , the first emission area EA1 of the first color pixel PX1 and the third emission area EA3 of the third color pixel PX3 may be alternately arranged in the second direction D2. In an even-numbered column, the second emission area EA2 of the second color pixel PX2 may be repeatedly arranged in the second direction D2. For example, in a first column 1M, the first emission area EA1 of the first color pixel PX1 and the third emission area EA3 of the third color pixel PX3 may be alternately arranged in the second direction D2. In a second column 2M that may be adjacent to the first column 1M, the second emission area EA2 of the second color pixel PX2 may be repeatedly arranged in the second direction D2. In a third column 3M adjacent to the second column 2M, the third emission area EA3 of the third color pixel PX3 and the first emission area EA1 of the first color pixel PX1 may be alternately arranged in the second direction D2, opposite the first column 1M.

The first emission area EA1 of the first color pixel PX1, the second emission area EA2 of the second color pixel PX2, and the third emission area EA3 of the third color pixel PX3 may have different areas from one another. In an embodiment, the third emission area EA3 of the third color pixel PX3 may have an area greater than that of the first emission area EA1 of the first color pixel PX1. Also, the third emission area EA3 of the third color pixel PX3 may have an area greater than that of the second emission area EA2 of the second color pixel PX2. Also, the first emission area EA1 of the first color pixel PX1 may have an area greater than that of the second emission area EA2 of the second color pixel PX2. In another embodiment, the third emission area EA3 of the third color pixel PX3 may have an area equal to that of the first emission area EA1 of the first color pixel PX1. However, one or more embodiments are not limited thereto. For example, the first emission area EA1 of the first color pixel PX1 may be greater than the second emission area EA2 of the second color pixel PX2 and the third emission area EA3 of the third color pixel PX3.

The first to third emission areas EA1, EA2, and EA3 may each have a polygonal shape such as a rectangular shape, an octagonal shape, etc., a circular shape, an elliptical shape, etc., and the polygonal shape may have rounded vertices.

In each of the rows 1R, 2R, 3R . . . , the pixel areas PXA may each include a pair of color pixels arranged therein may be separated by the groove GV, and the pixels PX in the pixel areas PXA may be connected to one another by the connecting lines 150. The pixel area PXA in an odd-numbered row and the pixel area PXA in an even-numbered row may be offset from each other as much as the first pixel area SPA1 or the second pixel area SPA2. Accordingly, in the pixel area PXA of the odd-numbered rows 1R, 3R, . . . , the first color pixel PX1 or the third color pixel PX3 may be in the first pixel area SPA1 and the second color pixel PX2 may be in the second pixel area SPA2. In the pixel area PXA of the even-numbered rows 2R, . . . , the second color pixel PX2 may be in the first pixel area SPA1 and the first color pixel PX1 or the third color pixel PX3 may be in the second pixel area SPA2.

Figure 11:
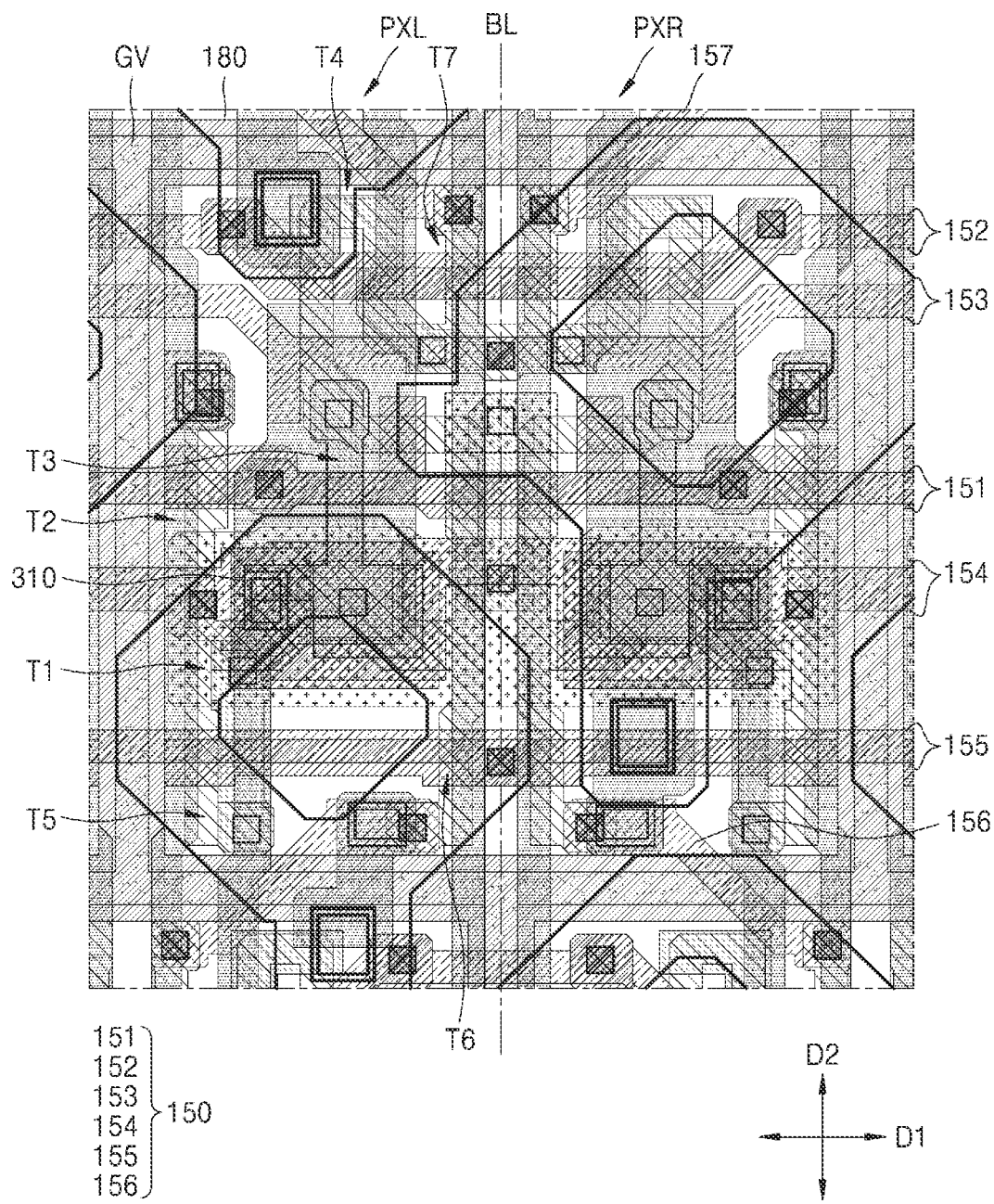
FIG. 11 is a schematic diagram showing locations of thin film transistors and a capacitor in each of two adjacent pixels according to another embodiment.
Figure 12A:
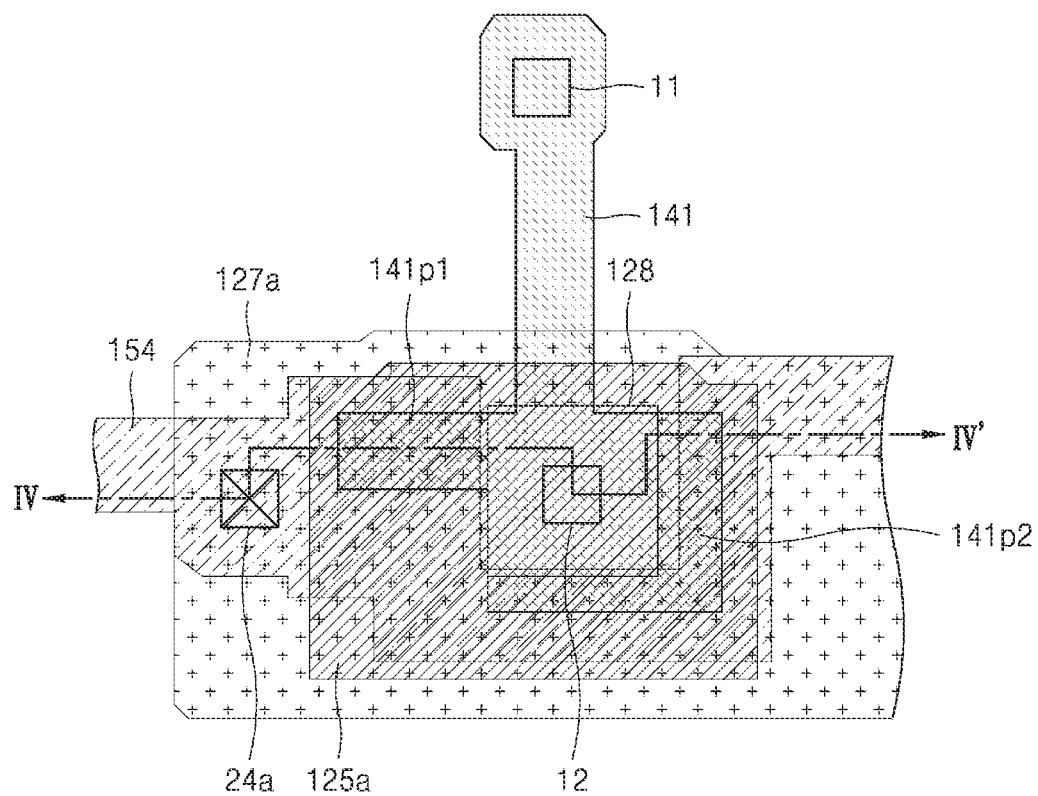
FIG. 12A is a partially enlarged schematic view of a left capacitor of FIG. 11.
Figure 12B:
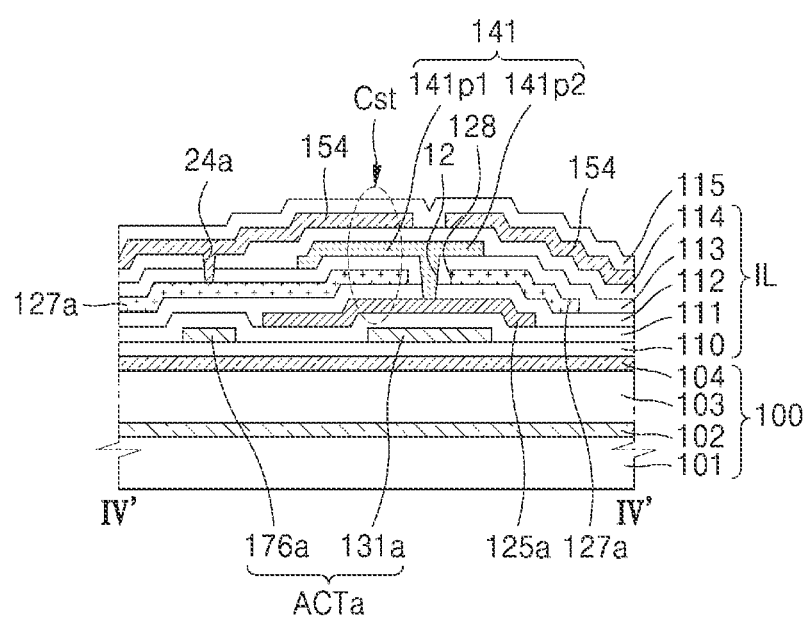
FIG. 12B is a schematic cross-sectional view of the left capacitor taken along line IV-IV' of FIG. 12A.

FIG. 11 is a schematic diagram showing locations of thin film transistors and a capacitor in each of two adjacent pixels according to another embodiment. FIG. 12A is a partially enlarged schematic view of a left capacitor of FIG. 11, and FIG. 12B is a schematic cross-sectional view of the left capacitor taken along line IV-IV' of FIG. 12A. Because the embodiment illustrated with reference to FIG. 11 is the same as the embodiment of FIG. 5 except for a shape of the node electrode 141, descriptions about the same elements as those of FIG. 5 are omitted.

An end of the node electrode 141 in FIG. 5 may have a size corresponding to the opening 128 in the first portion of the electrode voltage layer 127a or the second portion of the electrode voltage layer 127b. The node electrode 141 shown in FIGS. 12A and 12B may include a first protrusion 141p1 and a second protrusion 141p2 that may expand to the periphery of the opening 128 in the first electrode voltage layer 127a. The first protrusion 141p1 and the second protrusion 141p2 of the node electrode 141 may overlap the first electrode voltage layer 127a. The power voltage connecting line 154 may overlap the first protrusion 141p1 and the second protrusion 141p2 of the node electrode 141. Accordingly, the capacitor Cst may be formed by a stacked structure, for example, the gate electrode 125a of the first transistor T1 and the electrode voltage layer 127a, the electrode voltage layer 127a and the first and second protrusions 141p1 and 141p2 of the node electrode 141, the first and second protrusions 141p1 and 141p2 of the node electrode 141 and the power voltage connecting line 154, and thus, a capacitance of the capacitor Cst may be ensured.

Figure 13:
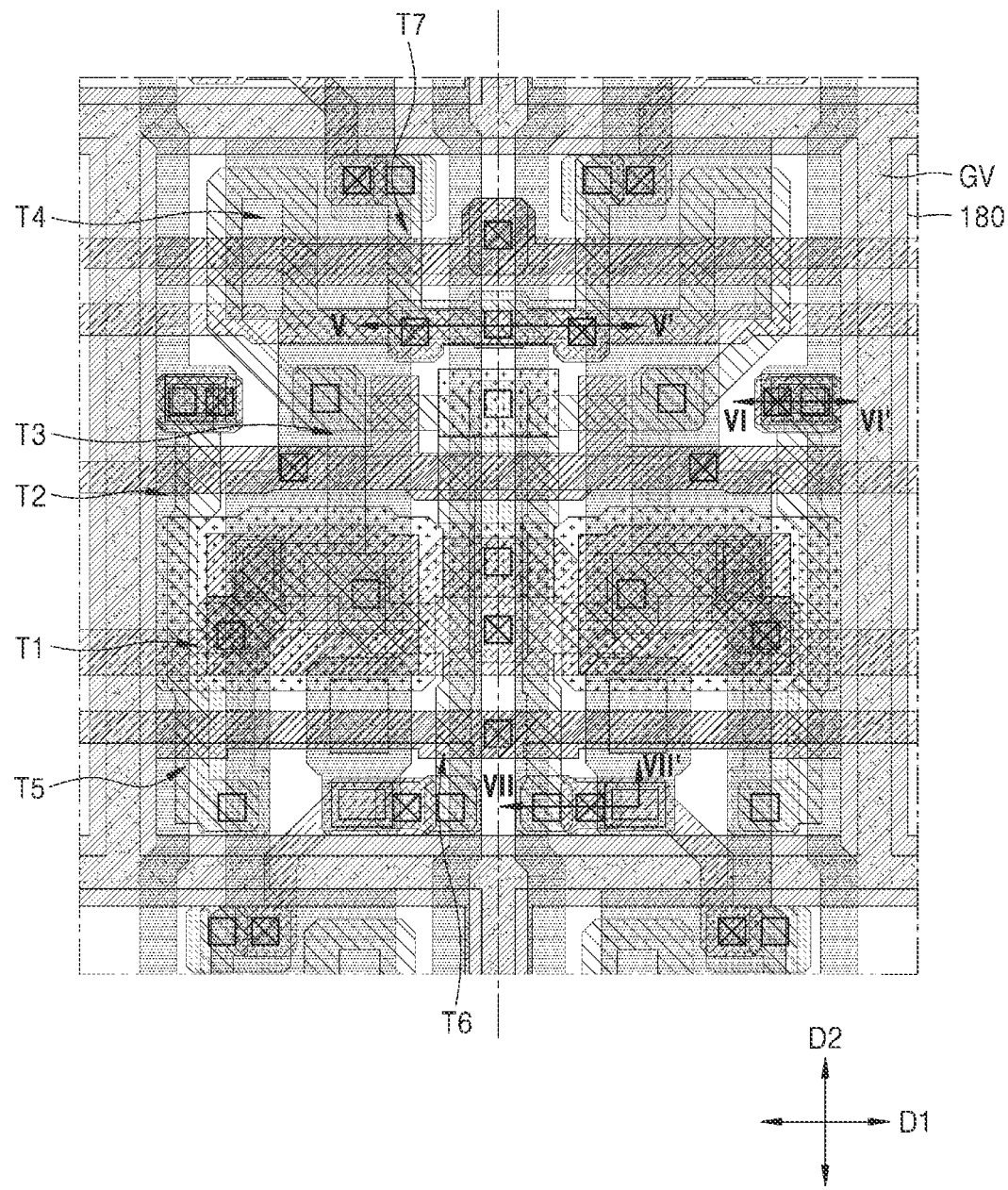
FIG. 13 is a schematic diagram showing locations of thin film transistors and a capacitor in each of two adjacent pixels according to another embodiment.

FIG. 13 is a schematic diagram showing locations of thin film transistors and a capacitor in each of two adjacent pixels according to another embodiment. FIGS. 14A to 14H are schematic plan views showing elements such as thin film transistors, the capacitor, and a pixel electrode shown in FIG. 13 according to layers. FIG. 15 is a schematic cross-sectional view of the pixels taken along lines V-V', VI-VI', and VII-VII' of FIG. 13. In FIG. 15, layers arranged after the second insulating layer 117 are omitted for convenience of disclosure. Hereinafter, elements different from those of FIG. 5 will be described, and descriptions about the same elements as those of FIG. 5 will be omitted.

Figure 14A:
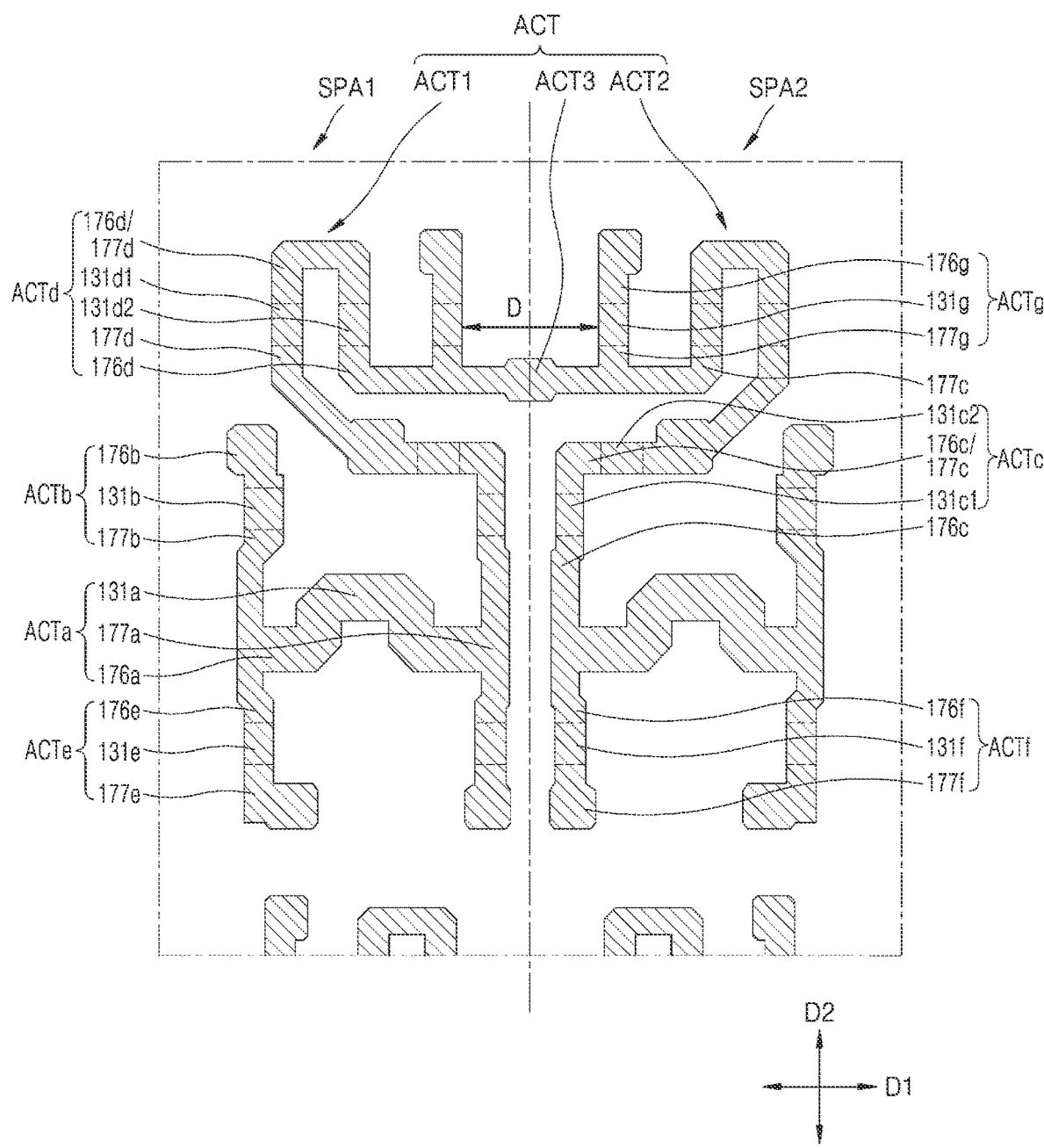
FIGS. 14A to 14H are schematic plan views showing elements such as thin film transistors, the capacitor, and a pixel electrode shown in FIG. 13 according to layers.
Figure 15:
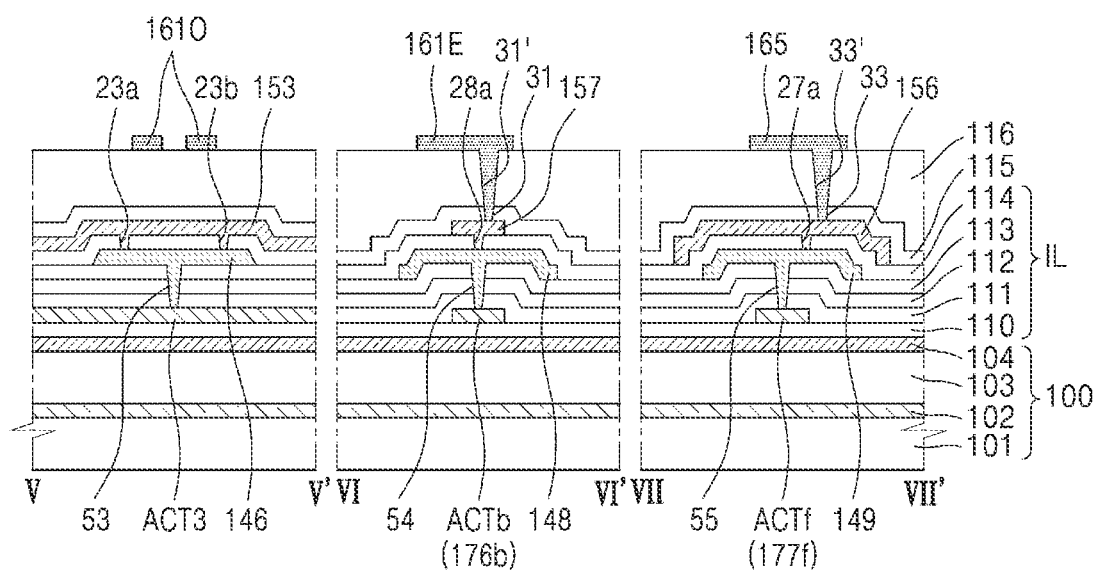
FIG. 15 is a schematic cross-sectional view of the pixels taken along lines V-V', VI-VI', and VII-VII' of FIG. 13.

Referring to FIGS. 13 and 14A, the semiconductor layer ACT may be on the buffer layer 110 of the substrate 100 in units of the pixel area PXA. The semiconductor layer ACT may include the first semiconductor layer ACT1 of the first pixel area SPA1, the second semiconductor layer ACT2 of the second pixel area SPA2, and the third semiconductor layer ACT3 where the first semiconductor layer ACT1 and the second semiconductor layer ACT2 may be connected.

In the semiconductor layer ACT of FIG. 14A, a distance D between a semiconductor layer ACTg of the first semiconductor layer ACT1 and a semiconductor layer ACTg of the second semiconductor layer ACT2 in the first direction D1 may be greater than a distance between the semiconductor layer ACTg of the first semiconductor layer ACT1 and the semiconductor layer ACTg of the second semiconductor layer ACT2 in the first direction D1 shown in FIG. 5. A gate insulating layer 111 may be on the semiconductor layer ACT.

Figure 14B:
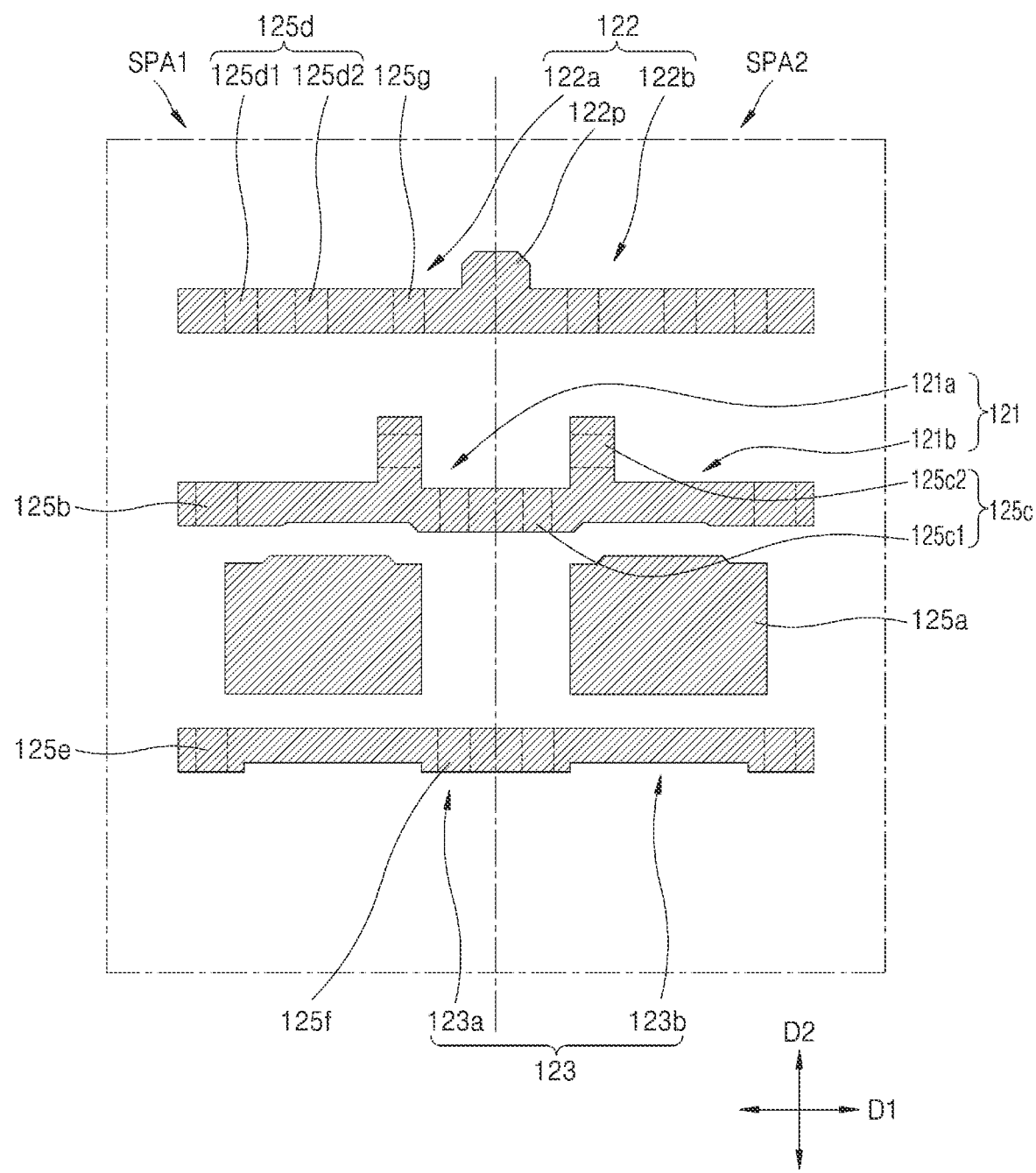

Referring to FIGS. 13 and 14B, the gate electrodes 125a, 125b, 125c, 125d, 125e, 125f, and 125g of the first to seventh transistors T1 to T7, the first scan line 121, the second scan line 122, and the emission control line 123 may be on the first gate insulating layer 111. The second scan line 122 may include a 2-1 scan line 122a in the first pixel area SPA1 and a 2-2 scan line 122b in the second pixel area SPA2. The second scan line 122 may further include a protrusion 122p at a boundary between the first pixel area SPA1 and the second pixel area SPA2. A second gate insulating layer 112 may be on the gate electrodes of the first to seventh transistors T1 to T7.

Figure 14C:
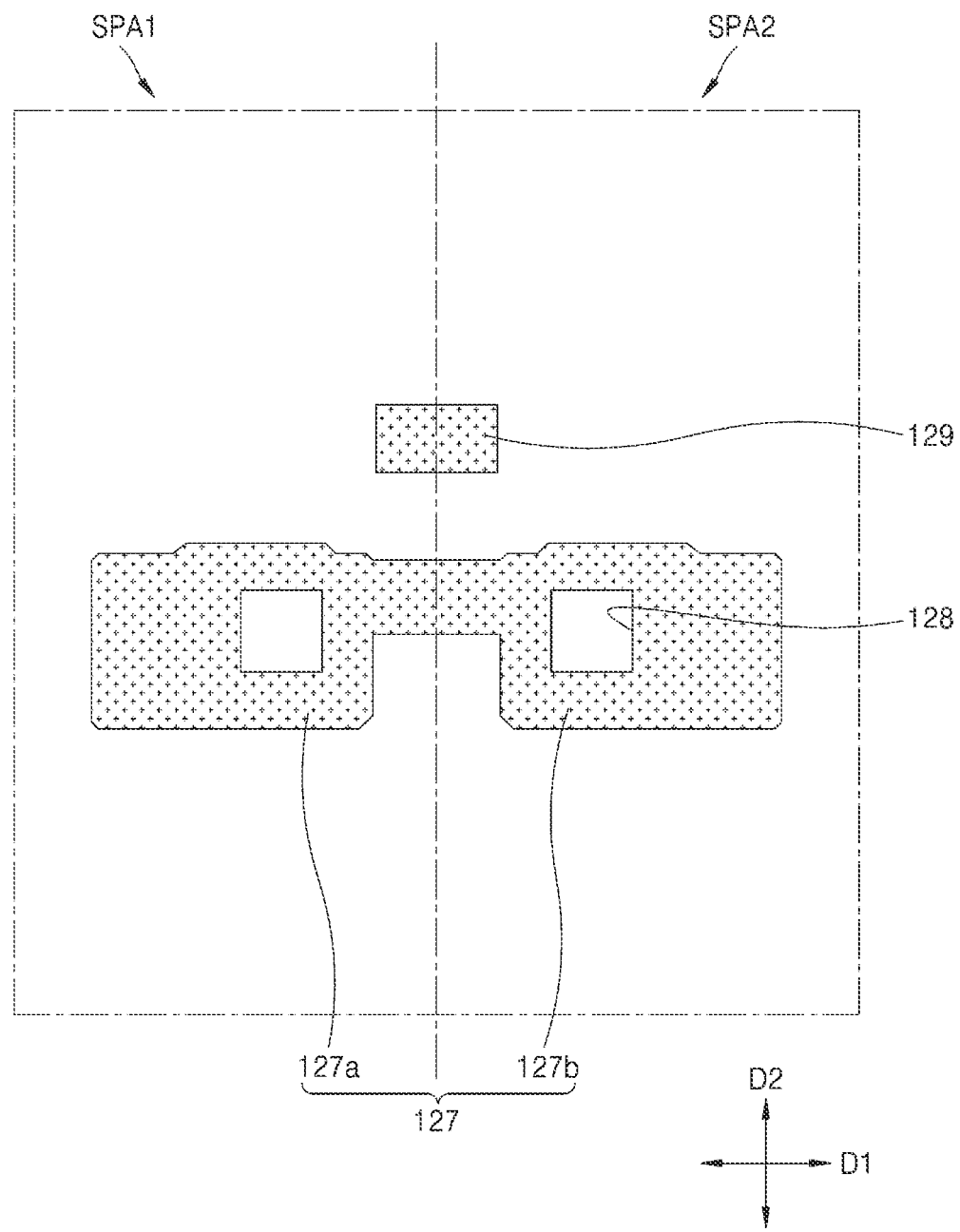

Referring to FIGS. 13 and 14C, the electrode voltage layer 127 and the first shielding electrode 129 may be on the second gate insulating layer 112. Each of the first portion 127a and the second portion 127b in the electrode voltage layer 127 may include an opening 128. A first interlayer insulating layer 113 may be on the electrode voltage layer 127 and the first shielding electrode 129.

Figure 14D:
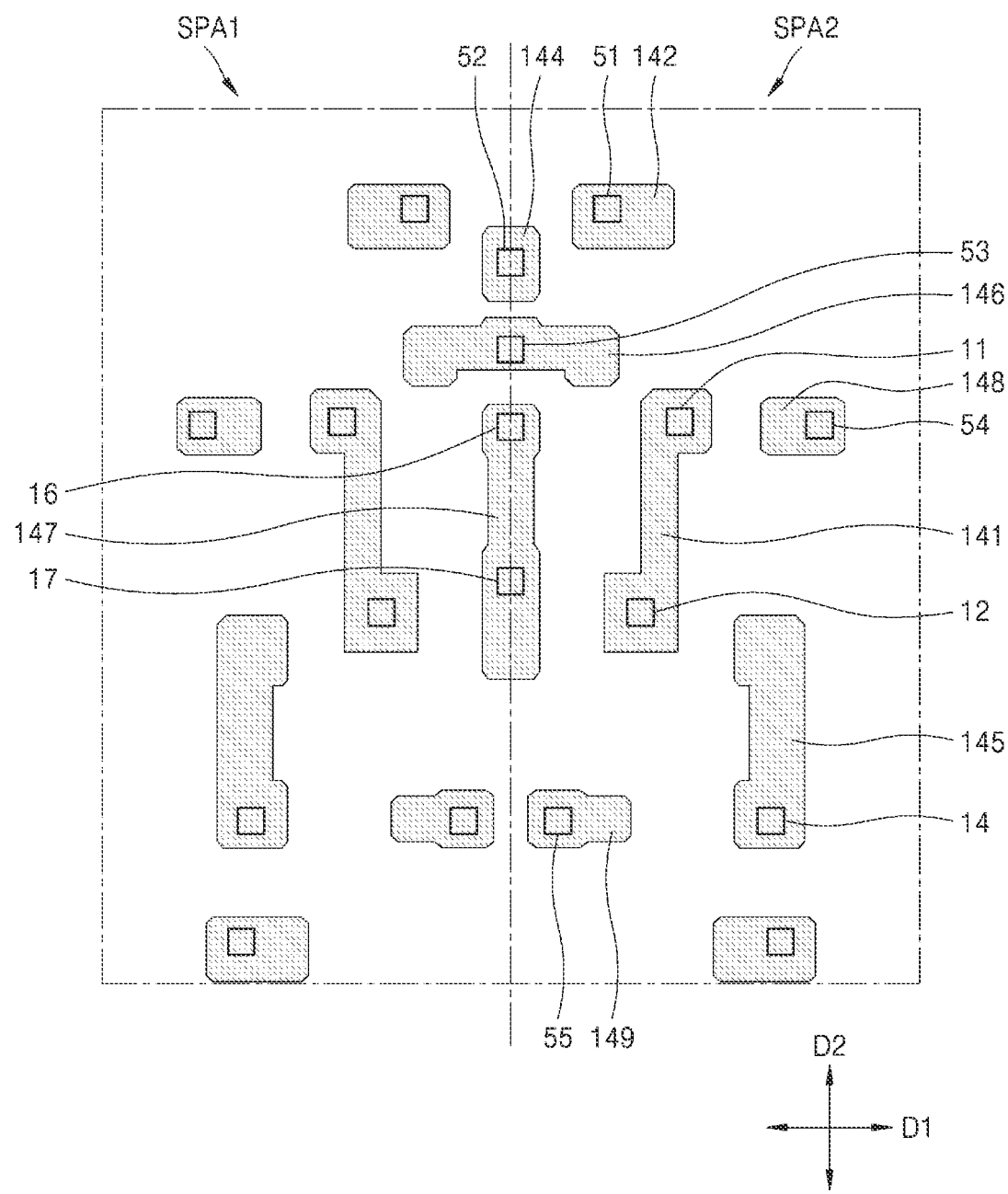

Referring to FIGS. 13 and 14D, the node electrode 141, the first connecting electrode 145, and the second connecting electrode 147 may be on the first interlayer insulating layer 113. A fifth connecting electrode 142, a sixth connecting electrode 144, a seventh connecting electrode 146, an eighth connecting electrode 148, and a ninth connecting electrode 149 may be further provided on the first interlayer insulating layer 113.

The node electrode 141 may be connected to the drain region 177c of the third transistor T3, the drain region 177d of the fourth transistor T4, and the gate electrode 125a of the first transistor T1 via the contact holes 11 and 12. The first connecting electrode 145 may be connected to the drain region 177e of the fifth transistor T5 via the contact hole 14. The first connecting electrode 145 may overlap the upper electrode 127 of the capacitor Cst. The second connecting electrode 147 may be connected to the first shielding electrode 129 and the electrode voltage layer 127 via the contact holes 16 and 17.

The fifth connecting electrode 142 may be in each of the first pixel area SPA1 and the second pixel area SPA2. The fifth connecting electrode 142 may be connected to the source region 176g of the seventh transistor T7 via the contact hole 51 in the first gate insulating layer 111, the second gate insulating layer 112, and the first interlayer insulating layer 113.

The sixth connecting electrode 144 may be at the boundary between the first pixel area SPA1 and the second pixel area SPA2. The sixth connecting electrode 144 may overlap the protrusion 122p of the second scan line 122, and may be connected to the protrusion 122p of the second scan line 122 via the contact hole 52 in the second gate insulating layer 112 and the first interlayer insulating layer 113.

The seventh connecting electrode 146 may be at the boundary between the first pixel area SPA1 and the second pixel area SPA2, and may extend in the first direction D1. The seventh connecting electrode 146 may overlap the third semiconductor layer ACT3 where the first semiconductor layer ACT1 and the second semiconductor layer ACT2 may be connected. The seventh connecting electrode 146 may be connected to the third semiconductor layer ACT3 via the contact hole 53 in the first gate insulating layer 111, the second gate insulating layer 112, and the first interlayer insulating layer 113, and thus, may be connected to the source region 176d of the fourth transistor T4 and the drain region 177g of the seventh transistor T7 in each of the first pixel PXL and the second pixel PXR.

The eighth connecting electrode 148 may be each of the first pixel area SPA1 and the second pixel area SPA2. The eighth connecting electrode 148 may be connected to the source region 176b of the second transistor T2 via the contact hole 54 in the first gate insulating layer 111, the second gate insulating layer 112, and the first interlayer insulating layer 113.

The ninth connecting electrode 149 may be adjacent to the boundary between the first pixel area SPA1 and the second pixel area SPA2. The ninth connecting electrode 149 may be connected to the drain region 177f of the sixth transistor T6 via the contact hole 55 in the first gate insulating layer 111, the second gate insulating layer 112, and the first interlayer insulating layer 113.

The second interlayer insulating layer 114 may cover the conductive layers on the first interlayer insulating layer 113.

Before forming the conductive layers shown in FIG. 14D and after forming the contact holes in the inorganic insulating layer IL, a dehydrogenation annealing process may be performed on the semiconductor layer. A driving range of a driving transistor may be increased due to the annealing process.

Figure 14E:
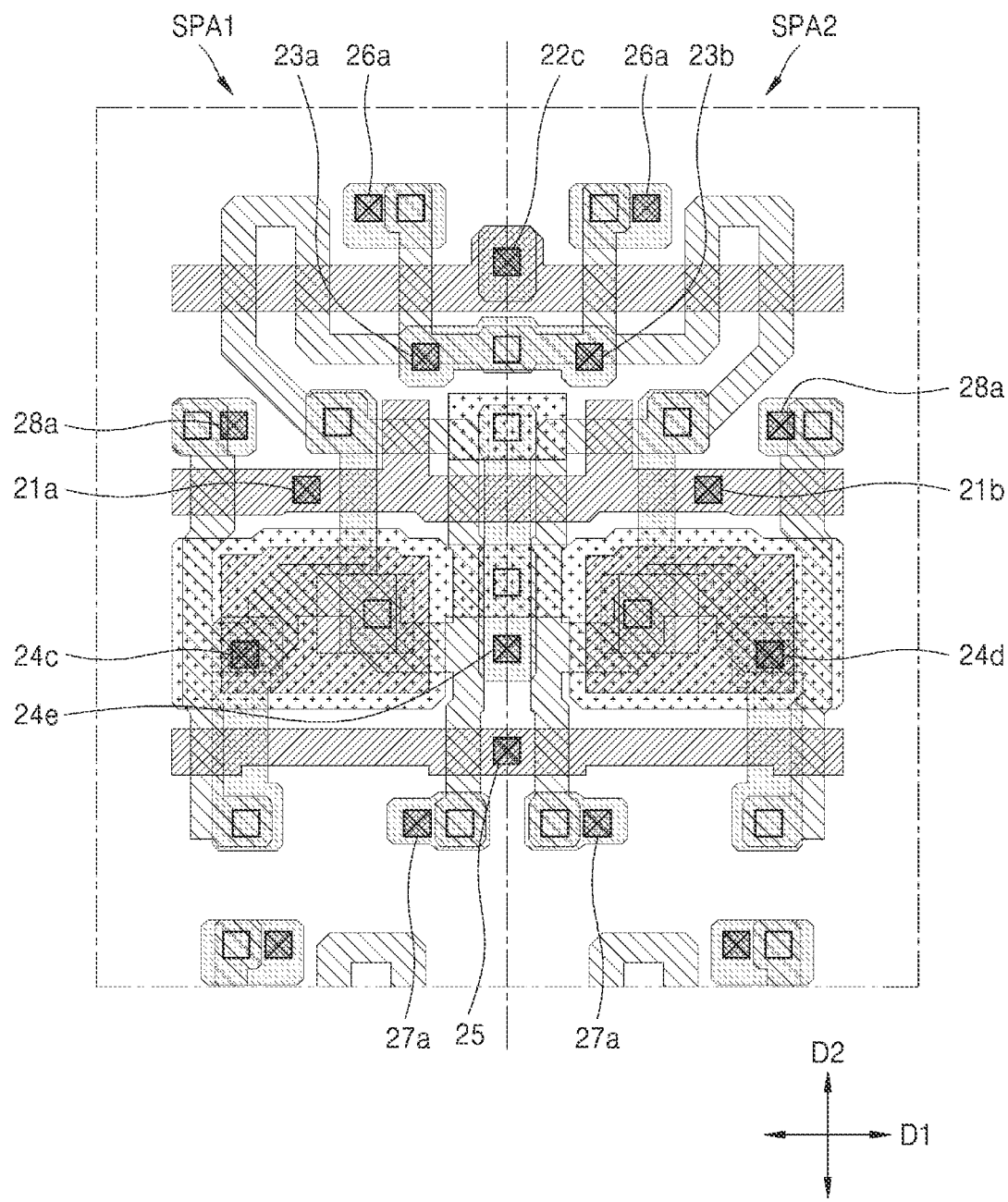
Figure 14F:
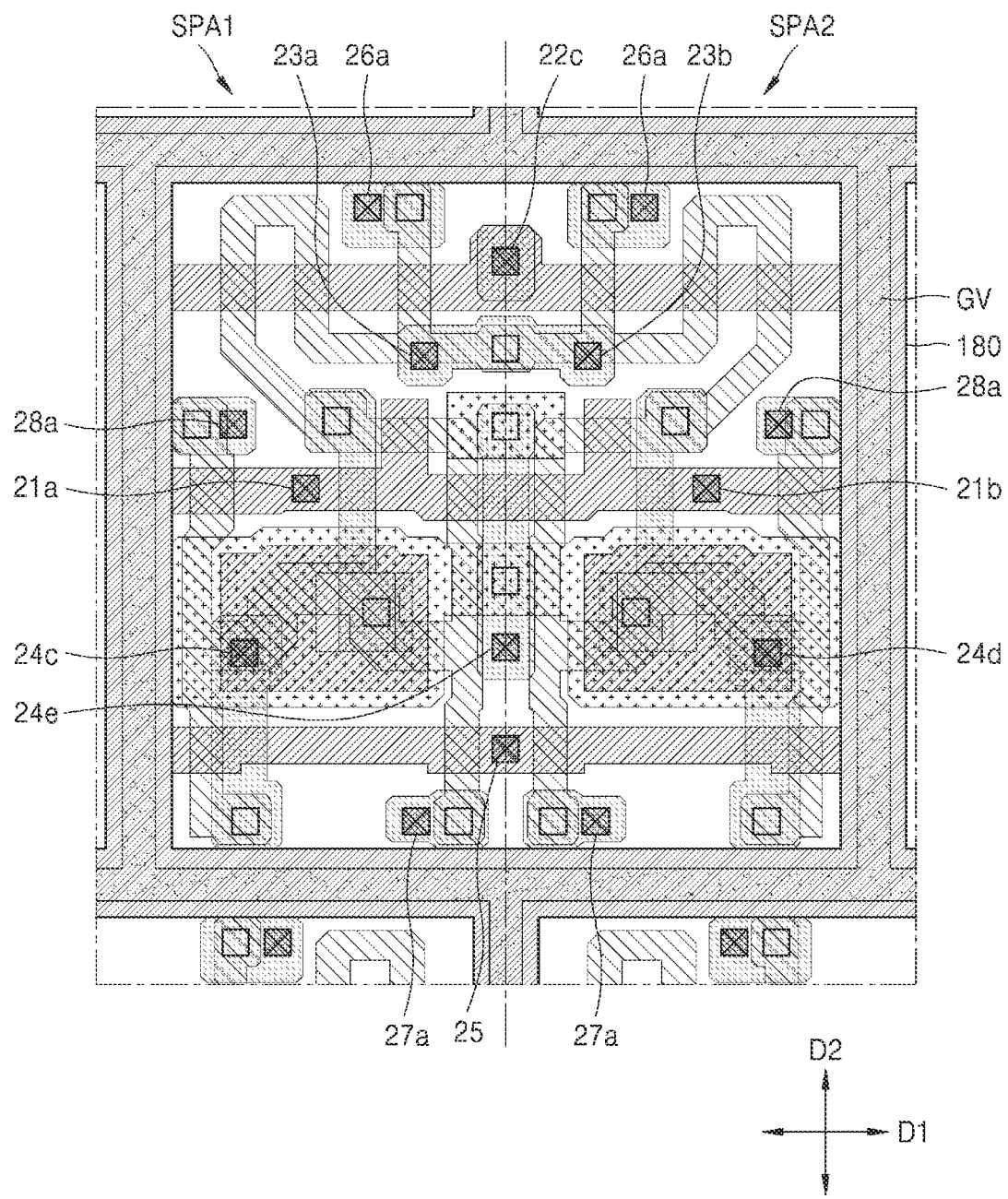

FIGS. 14E and 14F also show the conductive layers shown in FIGS. 14A to 14D. Referring to FIGS. 13 and 14E, contact holes 21a, 21b, 22c, 23a, 23b, 24c, 24d, 24e, 25, 26a, 27a, and 28a, through which the conductive layers on the second interlayer insulating layer 114 may be in contact with lower conductive layers, may be in at least one of the first to fourth gate insulating layers 111, 112, 113, and 114 in the pixel area PXA. FIG. 14E only shows locations corresponding to the contact holes 21a, 21b, 22c, 23a, 23b, 24c, 24d, 24e, 25, 26a, 27a, and 28a and insulating layers are omitted for convenience of description and disclosure.

Referring to FIGS. 13 and 14F, after forming the contact holes 21a, 21b, 22c, 23a, 23b, 24a, 24b, 24c, 25, 26a, 27a, and 28a in the pixel area PXA, the groove GV surrounding the pixel area PXA may be formed in the inorganic insulating layer IL. The organic material layer 180 may be filled in the groove GV in the inorganic insulating layer IL. For example, a mask process for forming the groove GV may be separately performed from the mask process for forming the contact holes 21a, 21b, 22c, 23a, 23b, 24c, 24d, 24e, 25, 26a, 27a, and 28a.

In an embodiment, a process of forming the groove GV may be performed simultaneously with a second mask process for removing the inorganic insulating layer IL on a bending area of the substrate 100. In order to reduce an area of the peripheral area PA recognized by a user, the substrate 100 may include the bending area in the peripheral area PA. The bending area may be a separate area from the foldable area FA, and may be, in the peripheral area PA, between a pad area at a side of the substrate 100 and the display area DA. The substrate 100 may be bent at the bending area, and the pad area may at least partially overlap the display area DA. A bending direction may be set such that the pad area may not block the display area DA, but may be located behind the display area DA. Accordingly, the user may recognize that the display area DA occupies most of the display device. Pads in the pad area may be electrically connected to a soft film on which a driver chip may be arranged. The organic material layer may be filled in a region of the bending area, from which the inorganic insulating layer IL may be removed.

Figure 14G:
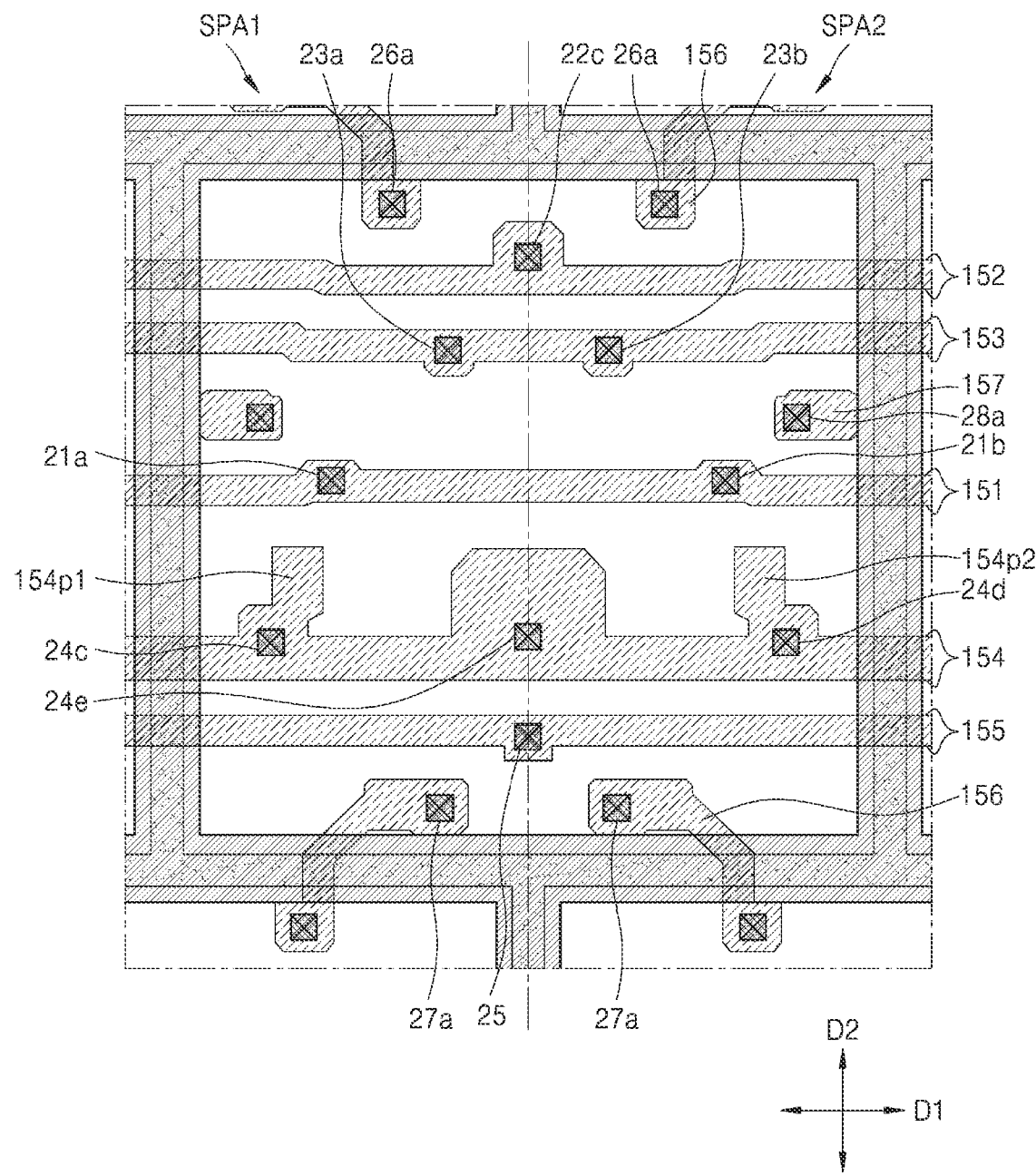

Referring to FIGS. 13 and 14G, the connecting lines 150 and the third connecting electrode 157 may be on the second interlayer insulating layer 114. The connecting lines 150 may include a first scan connecting line 151, a second scan connecting line 152, an initialization voltage connecting line 153, a power voltage connecting line 154, an emission control connecting line 155, and a semiconductor layer connecting line 156.

The second scan connecting line 152 may be connected to the second scan line 122 via the contact hole 22c in the second gate insulating layer 112, the first interlayer insulating layer 113, and the second interlayer insulating layer 114 at the boundary between the first pixel area SPA1 and the second pixel area SPA2.

As shown in FIG. 15, the initialization voltage connecting line 153 may overlap the seventh connecting electrode 146, and may be connected to the seventh connecting electrode 146 via the contact holes 23a and 23b in the second interlayer insulating layer 114.

As shown in FIG. 14G, the power voltage connecting line 154 may include a first protrusion 154p1 and a second protrusion 154p2 protruding in the second direction D2. The power voltage connecting line 154 may be connected to the first connecting electrode 145 via the contact holes 24c and 24d in the second interlayer insulating layer 114, and may be connected to the second connecting electrode 147 via a contact hole 24e in the second interlayer insulating layer 114.

As shown in FIG. 14G and FIG. 15, an end of the semiconductor layer connecting line 156 may be connected to the fifth connecting electrode 142 via the contact hole 26a in the second interlayer insulating layer 114 and thus may be connected to the source region 176g of the seventh transistor T7. Another end of the semiconductor layer connecting line 156 may be connected to the ninth connecting electrode 149 via the contact hole 27a in the second interlayer insulating layer 114, and thus may be connected to the drain region 177f of the sixth transistor T6.

As shown in FIG. 15, the third connecting electrode 157 may be connected to the eighth connecting electrode 148 via the contact hole 28a in the second interlayer insulating layer 114, and thus may be connected to the source region 176b of the second transistor T2.

The protective layer 115 may be on the connecting lines 150 and the third connecting electrode 157. The protective layer 115 may not cover the organic material layer 180. The first insulating layer 116 may be further on the protective layer 115. A mask process for forming the contact hole in the protective layer 115 and a mask process for forming a contact hole in the first insulating layer 116 may be separately performed.

Figure 14H:
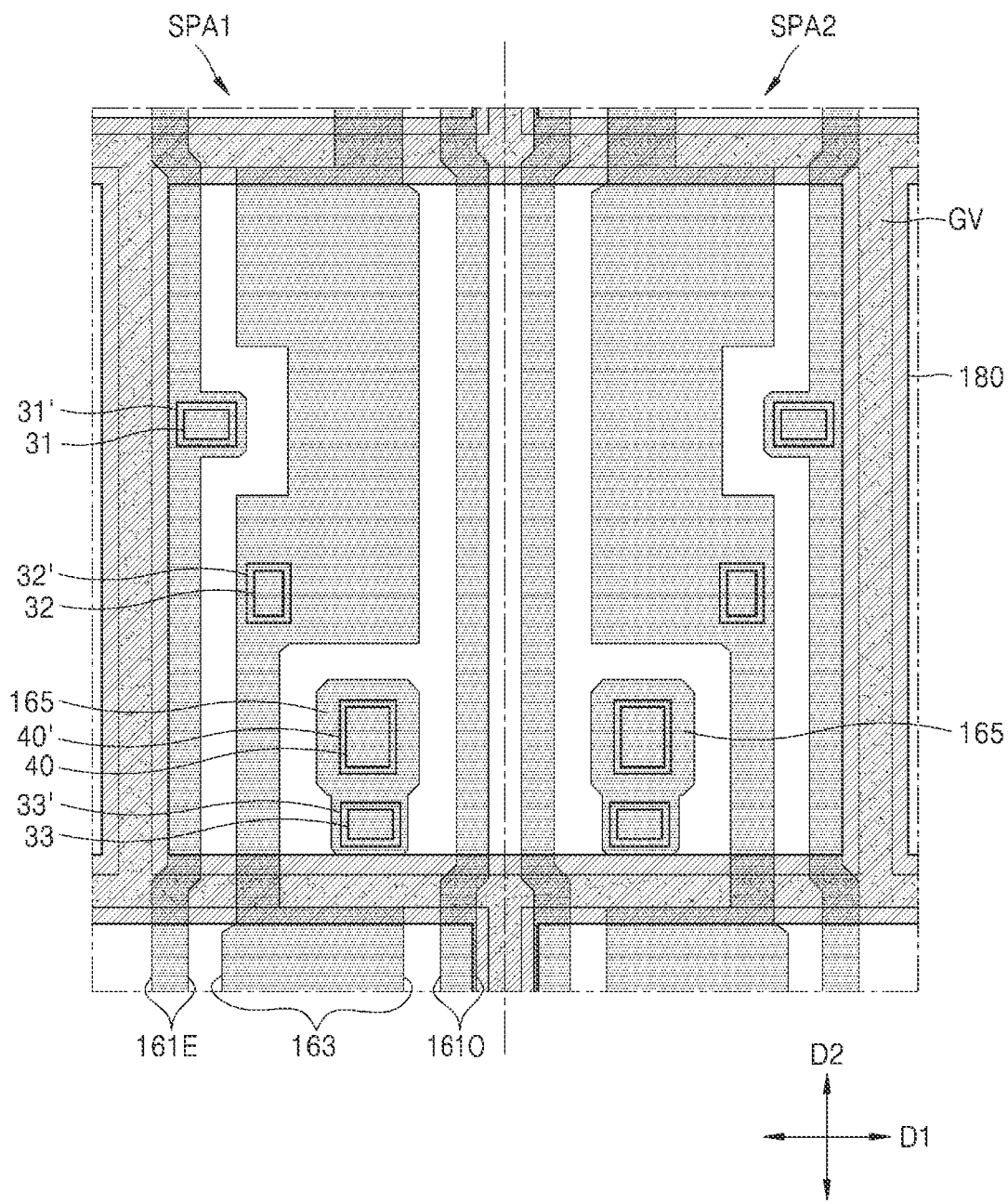

Referring to FIGS. 13 and 14H, the data lines 161, the power voltage line 163, and the fourth connecting electrode 165 may be on the first insulating layer 116. As shown in FIGS. 7 to 9, the second insulating layer 117 and the third insulating layer 118 may be sequentially on the data lines 161, the power voltage line 163, and the fourth connecting electrode 165 of FIG. 14H. The organic light-emitting diode OLED may be on the third insulating layer 118. The encapsulation layer 400 may be on the organic light-emitting diode OLED.

The embodiment illustrated with reference to FIG. 13 may be different from the embodiment of FIG. 5, in that the mask process for forming the groove GV by removing the inorganic insulating layer IL and the mask process for forming the contact holes by removing the first and second gate insulating layers 111 and 112 and the first and second interlayer insulating layers 113 and 114 in the pixel area PXA may be separately performed, as shown in FIGS. 14E and 14F.

According to a limitation in a hole depth in the mask process for forming the contact holes, as shown in FIG. 15, the seventh connecting electrode 146, the eighth connecting electrode 148, and the ninth connecting electrode 149 may be additionally on the first interlayer insulating layer 113, and each of the initialization voltage connecting line 153, the third connecting electrode 157, and the semiconductor layer connecting line 156 may not be in contact (e.g., direct contact) with the semiconductor layer, but may be connected to the semiconductor layer thereunder via each of the seventh connecting electrode 146, the eighth connecting electrode 148, and the ninth connecting electrode 149.

Figure 16:
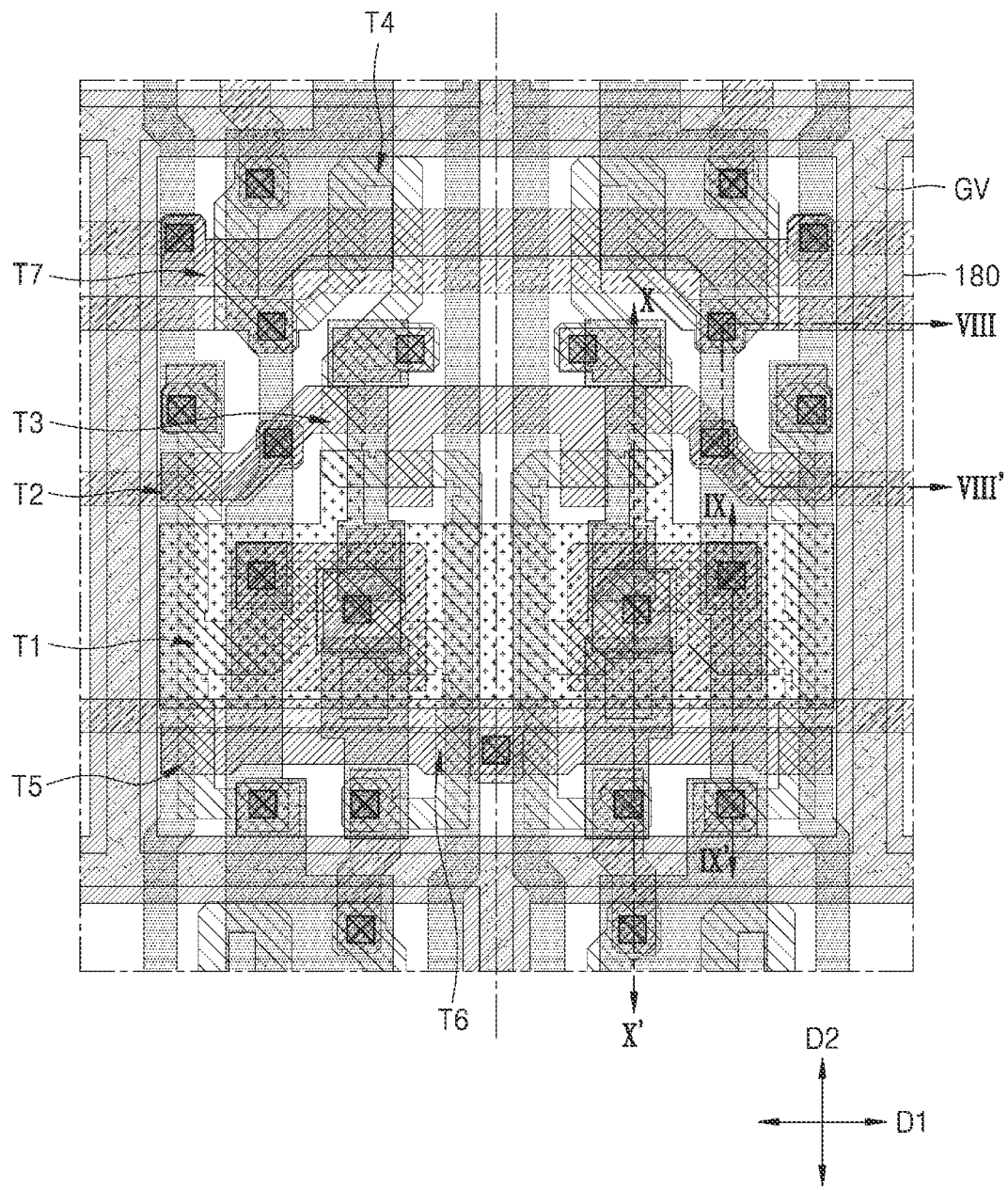
FIG. 16 is a schematic diagram showing locations of thin film transistors and a capacitor in each of two adjacent pixels according to another embodiment.
Figure 18:
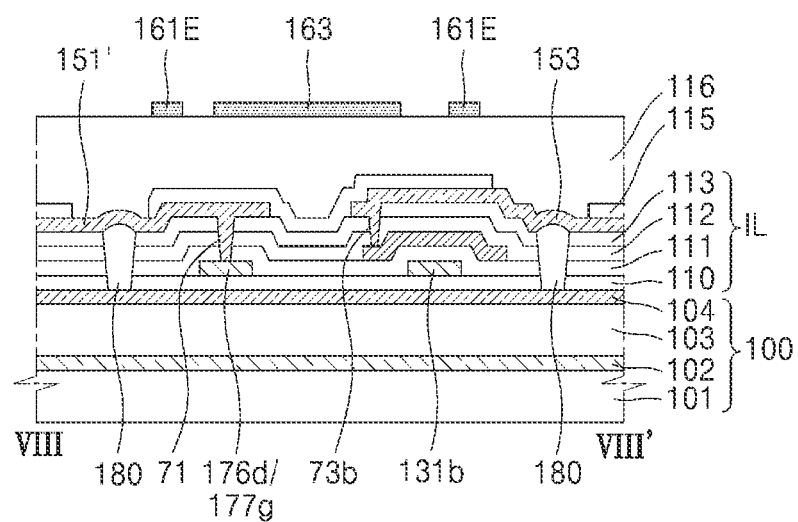
FIGS. 18 to 20 are schematic cross-sectional views of the pixels taken along lines VIII-VIII', IX-IX', and X-X' of FIG. 16.
Figure 19:
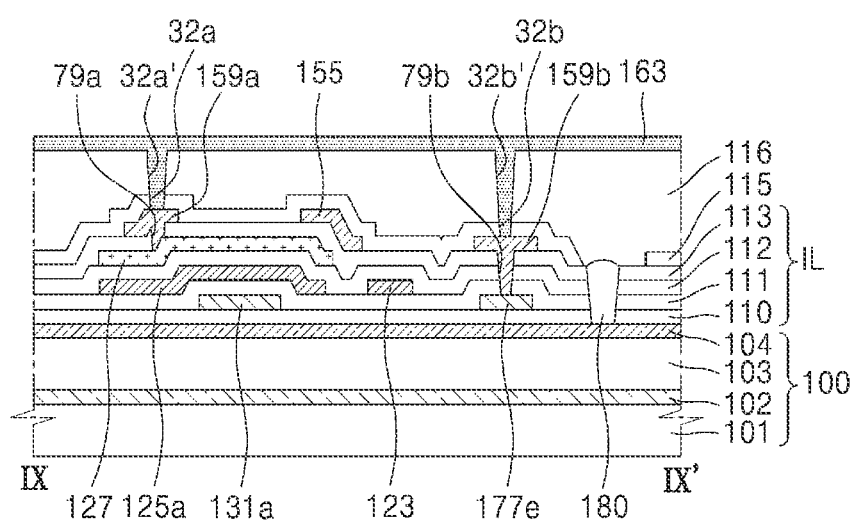
Figure 20:
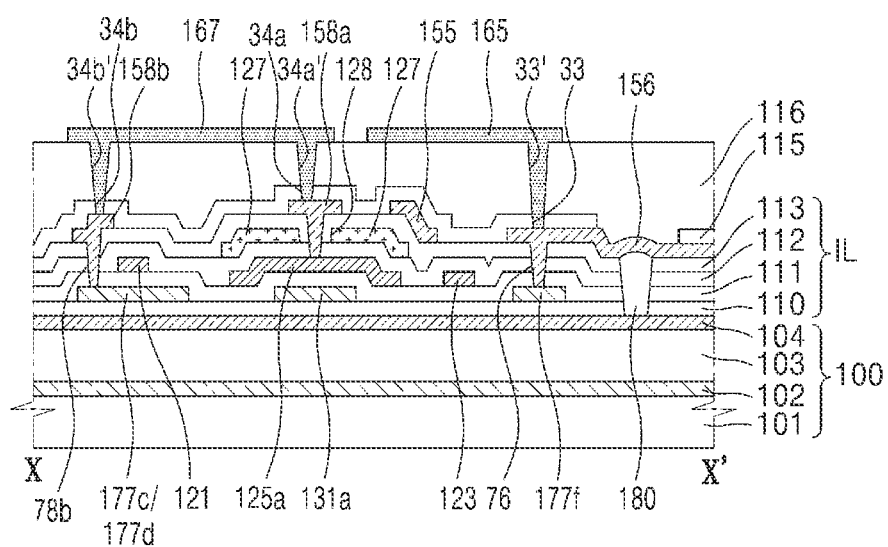

FIG. 16 is a schematic diagram showing locations of thin film transistors and a capacitor in each of two adjacent pixels according to another embodiment. FIGS. 17A to 17F are schematic plan views showing elements such as thin film transistors, the capacitor, and a pixel electrode shown in FIG. 16 according to layers. FIGS. 18 to 20 are schematic cross-sectional views of the pixels taken along lines VIII-VIII', IX-IX', and X-X' of FIG. 16. In FIG. 15, layers arranged after the first insulating layer 115 are omitted for convenience of disclosure. Hereinafter, elements different from those of FIG. 5 will be described, and descriptions about the same elements as those of FIG. 5 will be omitted.

Figure 17A:
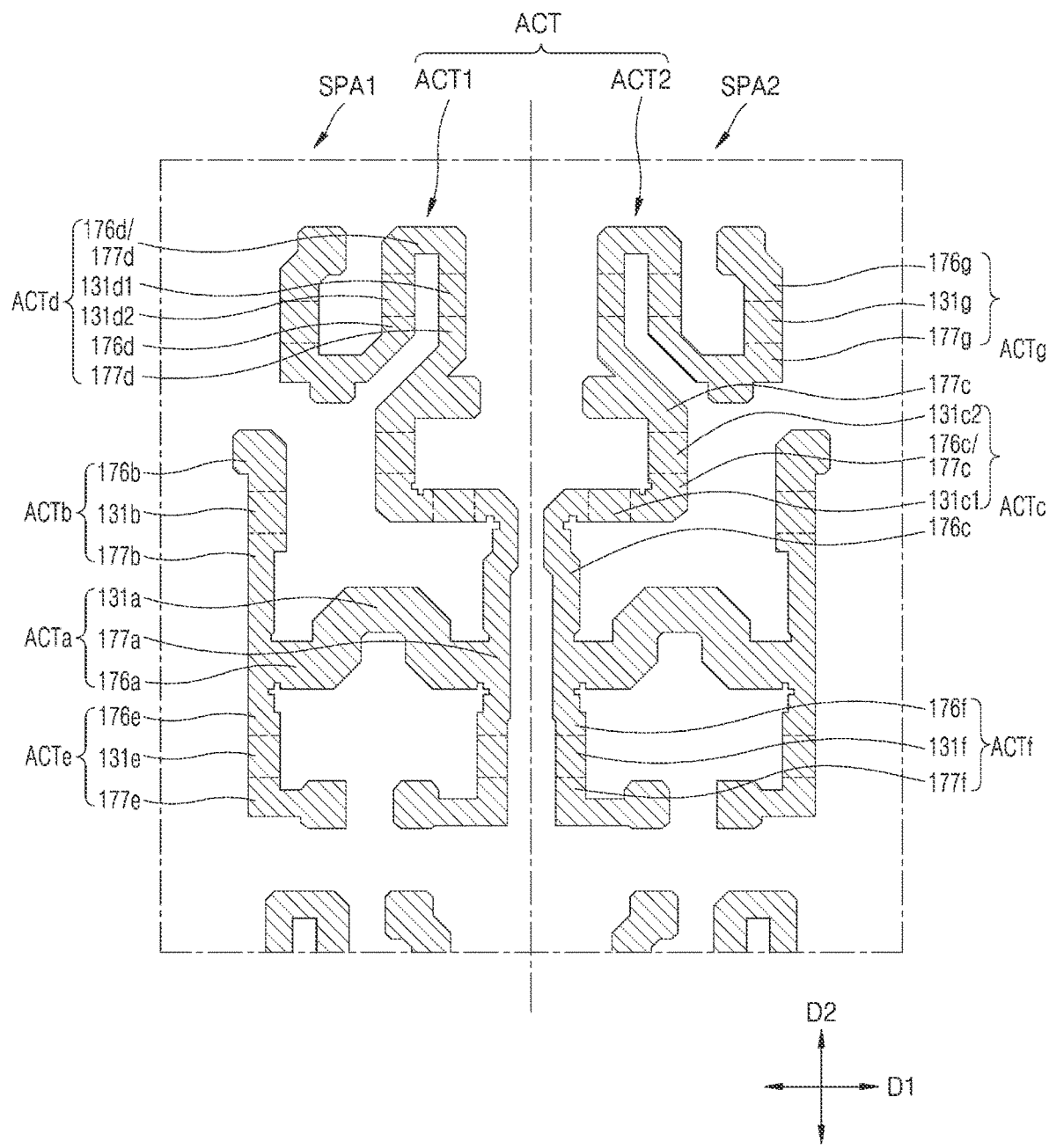
FIGS. 17A to 17F are schematic plan views showing elements such as thin film transistors, the capacitor, and a pixel electrode shown in FIG. 16 according to layers.

Referring to FIGS. 16 and 17A, the semiconductor layer ACT may be on the buffer layer 110 of the substrate 100 in units of the pixel area PXA. The semiconductor layer ACT may include the first semiconductor layer ACT1 in the first pixel area SPA1 and the second semiconductor layer ACT2 in the second pixel area SPA2. The first semiconductor layer ACT1 and the second semiconductor layer ACT2 may be separated from each other. The gate insulating layer 111 may be on the semiconductor layer ACT. The first semiconductor layer ACT1 and the second semiconductor layer ACT2 may be symmetrical with each other.

Figure 17B:
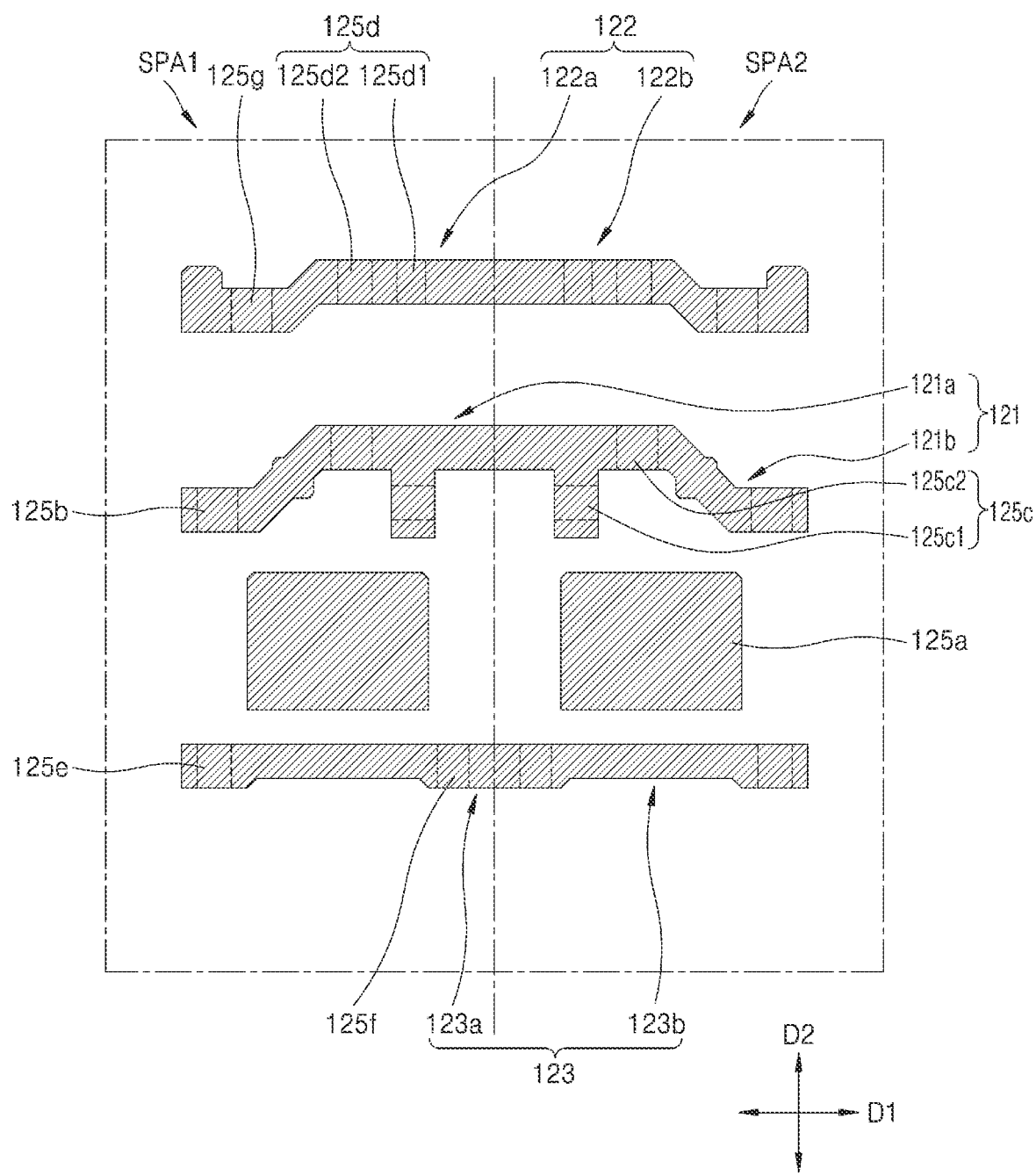

Referring to FIGS. 16 and 17B, the gate electrodes 125a, 125b, 125c, 125d, 125e, 125f, and 125g of the first to seventh transistors T1 to T7, the first scan line 121, the second scan line 122, and the emission control line 123 may be on the first gate insulating layer 111. The second gate insulating layer 112 may be on the gate electrodes of the first to seventh transistors T1 to T7.

Figure 17C:
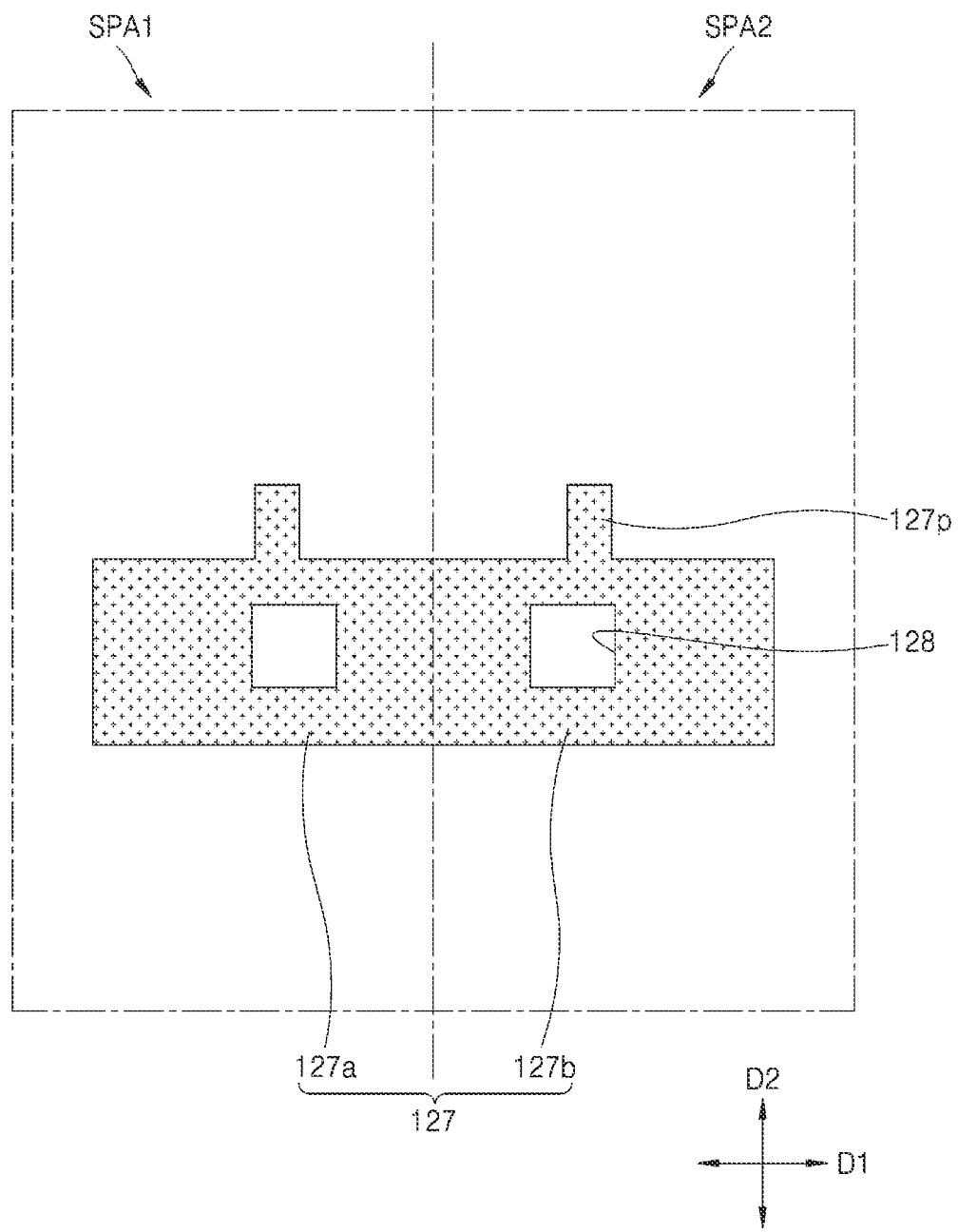

Referring to FIGS. 16 and 17C, the electrode voltage layer 127 may be on the second gate insulating layer 112. Each of the first portion 127a and the second portion 127b in the electrode voltage layer 127 may include the opening 128. The electrode voltage layer 127 may further include a protrusion 127p protruding from each of the first portion 127a and the second portion 127b in the second direction D2. The protrusions 127p may overlap the source/drain region 176c/177c between the two channel regions 131c1 and 131c2 of the third transistor T3 in each of the first pixel PXL and the second pixel PXR. For example, the protrusions 127p may act as shielding portions that may prevent the third transistor T3 in each of the first pixel PXL and the second pixel PXR from being affected by light incident from outside and/or other electrical signals. The first interlayer insulating layer 113 may be on the electrode voltage layer 127.

Figure 17D:
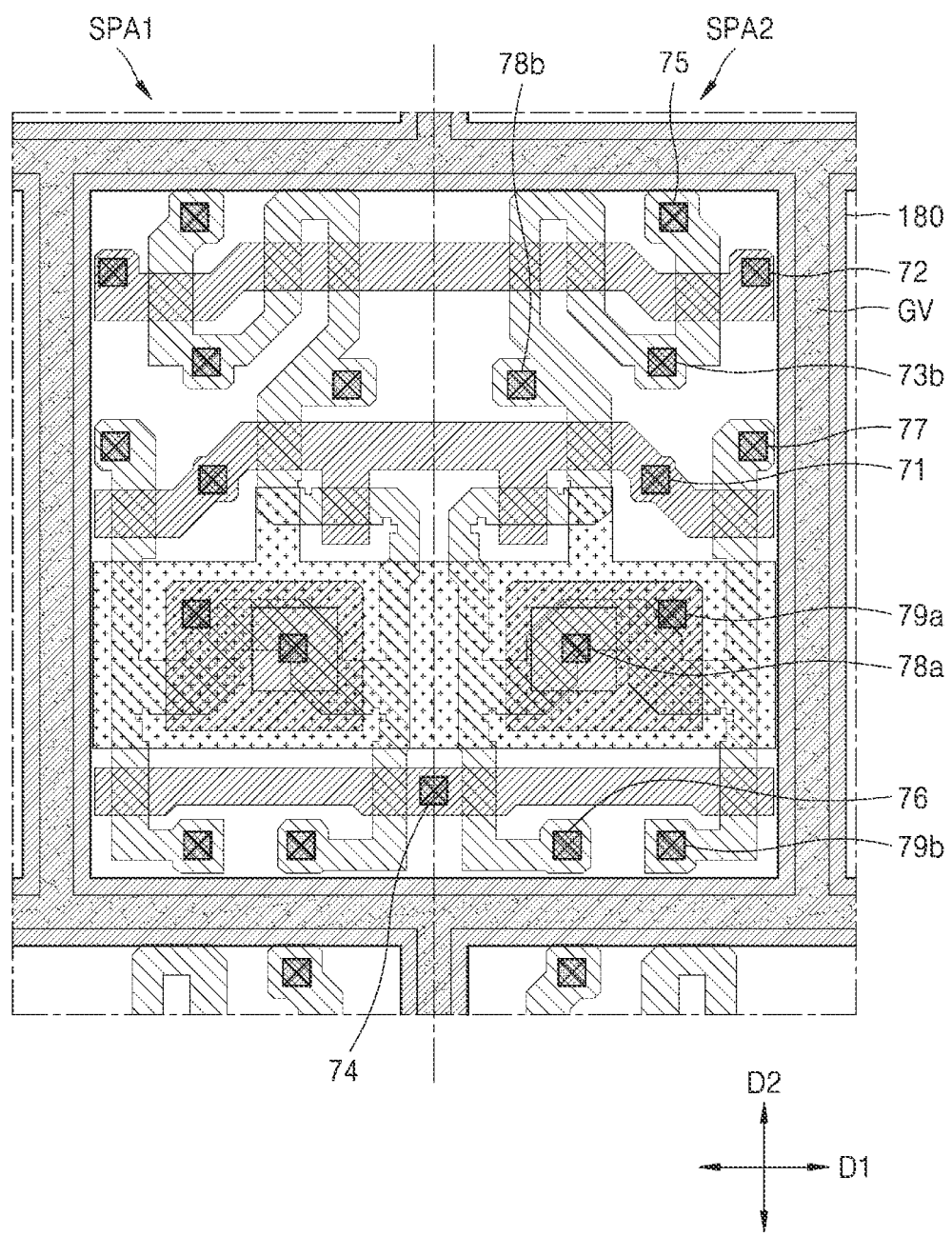

FIG. 17D shows the conductive layers shown in FIGS. 17A to 17C altogether. Referring to FIGS. 16 and 17D, contact holes 71, 72, 73a, 73b, 74, 75, 76, 77, 78a, 78b, 79a, and 79b, through which the conductive layers on the first interlayer insulating layer 113 may be in contact with lower conductive layers, may be formed in at least one of the first and second gate insulating layers 111 and 112 and the first interlayer insulating layer 113 in the pixel area PXA. FIG. 17D only shows locations corresponding to the contact holes 71, 72, 73a, 73b, 74, 75, 76, 77, 78a, 78b, 79a, and 79b and insulating layers may be omitted for convenience of description and disclosure.

The groove GV surrounding the pixel areas PXA may be formed in the buffer layer 110, the first and second gate insulating layers 111 and 112, and the first interlayer insulating layer 113. In an embodiment, the mask process for forming the groove GV may be separately performed from the mask process for forming the contact holes 71, 72, 73a, 73b, 74, 75, 76, 77, 78a, 78b, 79a, and 79b. The groove GV may be obtained through two mask processes, for example, a mask process for removing the inorganic insulating layer after forming the first gate insulating layer 111 and a mask process for removing the inorganic insulating layer after forming the first interlayer insulating layer 113. In another embodiment, the groove GV may be simultaneously obtained with the mask process for forming the contact holes 71, 72, 73a, 73b, 74, 75, 76, 77, 78a, 78b, 79a, and 79b. The organic material layer 180 may be filled in the groove GV in the inorganic insulating layer IL.

Figure 17E:
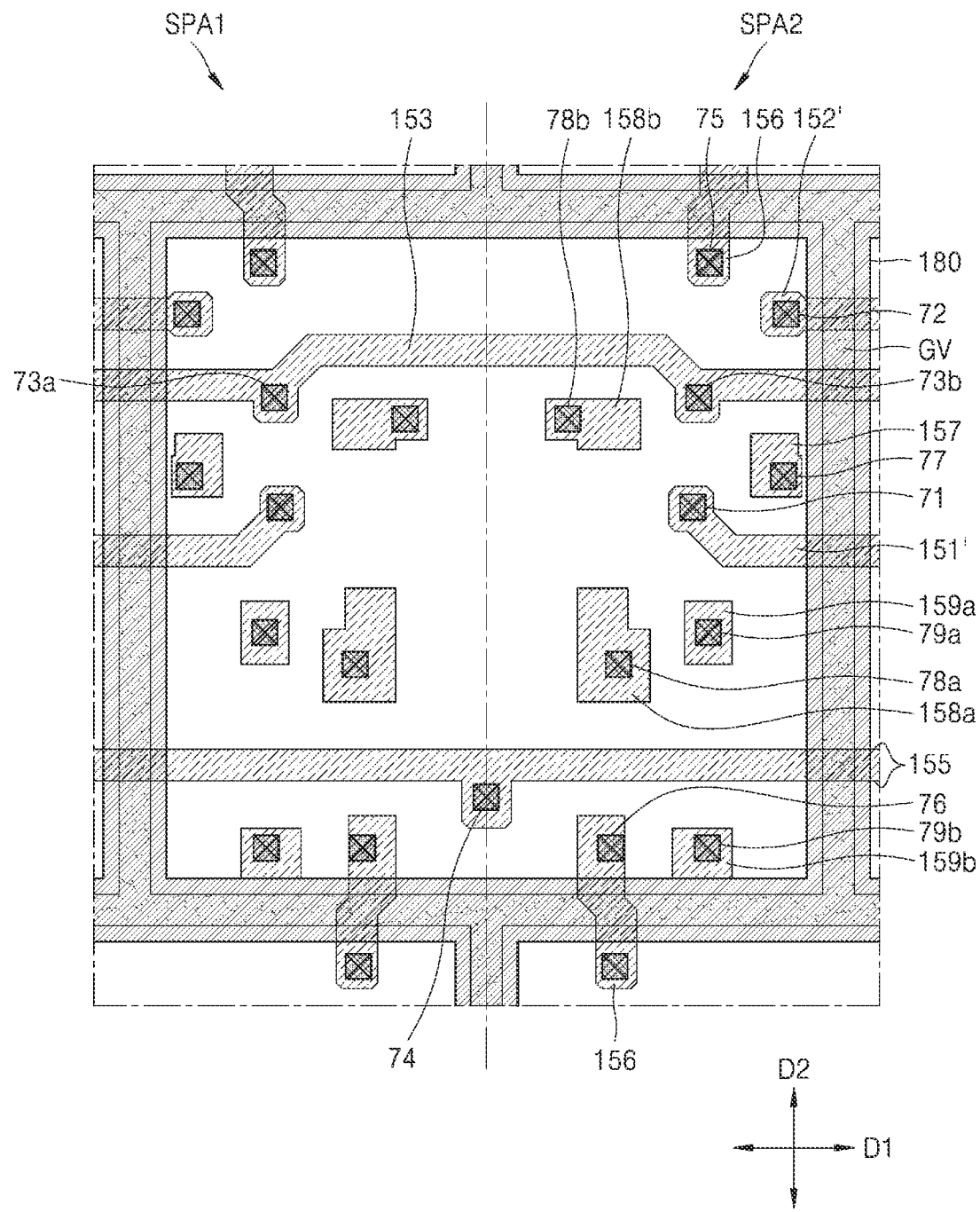

Referring to FIGS. 16 and 17E, the connecting lines 150 and connecting electrodes may be on the first interlayer insulating layer 113.

The connecting lines 150 may include a first scan connecting line 151', a second scan connecting line 152', the initialization voltage connecting line 153, the emission control connecting line 155, and the semiconductor layer connecting line 156.

The first scan connecting line 151' may extend in the first direction D1 across the upper portion of the organic material layer 180 that may surround the pixel area PXA. An end of the first scan connecting line 151' may be connected to the 1-1 scan line 121a or the 1-2 scan line 121b in the pixel area PXA via the contact hole 71 in the second gate insulating layer 112 and the first interlayer insulating layer 113. Another end of the first scan connecting line 151' may be connected to the 1-1 scan line 121a or the 1-2 scan line 121b in the pixel area PXA adjacent thereto in the first direction D1 via the contact hole 71 in the second gate insulating layer 112 and the first interlayer insulating layer 113. An end and another end of the first scan connecting line 151' may be in different pixel areas PXA with the groove GV therebetween, in order to connect the first scan lines 121 in adjacent pixels PX in the first direction D1.

The second scan connecting line 152' may extend in the first direction D1 across the upper portion of the organic material layer 180 that may surround the pixel area PXA. An end of the second scan connecting line 152' may be connected to the 2-1 scan line 122a or the 2-2 scan line 122b in the pixel area PXA via the contact hole 72 in the second gate insulating layer 112 and the first interlayer insulating layer 113. Another end of the second scan connecting line 152' may be connected to the 2-1 scan line 122a or the 2-2 scan line 122b in the pixel area PXA adjacent thereto in the first direction D1 via the contact hole 72 in the second gate insulating layer 112 and the first interlayer insulating layer 113. An end and another end of the second scan connecting line 152' may be in different pixel areas PXA with the groove GV therebetween, in order to connect the second scan lines 122 in adjacent pixels PX in the first direction D1.

The initialization voltage connecting line 153 may extend in the first direction D1 across the first pixel area SPA1 and the second pixel area SPA2. The initialization voltage connecting line 153 may be connected to the source region 176d of the fourth transistor T4 and the drain region 177g of the seventh transistor T7 in each of the first pixel PXL and the second pixel PXR via the contact holes 73a and 73b in the first gate insulating layer 111, the second gate insulating layer 112, and the first interlayer insulating layer 113.

The emission control connecting line 155 may extend in the first direction D1 while overlapping the emission control line 123, and may be arranged across the first pixel area SPA1 and the second pixel area SPA2. The emission control connecting line 155 may be connected to the emission control line 123 via the contact hole 74 in the second gate insulating layer 112 and the first interlayer insulating layer 113 at the boundary between the first pixel area SPA1 and the second pixel area SPA2.

The semiconductor layer connecting line 156 may extend in the second direction D2 across an upper portion of the organic material layer 180 surrounding the pixel area PXA. An end of the semiconductor layer connecting line 156 may be connected to the source region 176g of the seventh transistor T7 via the contact hole 75 in the first gate insulating layer 111, the second gate insulating layer 112, and the first interlayer insulating layer 113. Another end of the semiconductor layer connecting line 156 may be connected to the drain region 177f of the sixth transistor T6 via the contact hole 76 in the first gate insulating layer 111, the second gate insulating layer 112, and the first interlayer insulating layer 113. An end and another end of the semiconductor layer connecting line 156 may be in different pixel areas PXA with the groove GV therebetween, in order to connect the semiconductor layers in adjacent pixels PX in the second direction D2.

The third connecting electrode 157 may be connected to the source region 176b of the second transistor T2 via the contact hole 77 in the first gate insulating layer 111, the second gate insulating layer 112, and the first interlayer insulating layer 113.

A node connecting electrode 158 may include a first node connecting electrode 158a and a second node connecting electrode 158b. The first node connecting electrode 158a may be connected to the gate insulating layer 125a of the first transistor T1 via the contact hole 78a in the second gate insulating layer 112 and the first interlayer insulating layer 113. The second node connecting electrode 158b may be connected to the drain region 177c of the third transistor T3 and the drain region 177d of the fourth transistor T4 via the contact hole 78b in the first gate insulating layer 111, the second gate insulating layer 112, and the first interlayer insulating layer 113.

The power voltage connecting electrode 159 may include a first power voltage connecting electrode 159a and a second power voltage connecting electrode 159b. The first power voltage connecting electrode 159a may be connected to the electrode voltage layer 127 via the contact hole 79a in the first interlayer insulating layer 113. The second power voltage connecting electrode 159b may be connected to the drain region 177e of the fifth transistor T5 via the contact hole 79b in the first gate insulating layer 111, the second gate insulating layer 112, and the first interlayer insulating layer 113.

The protective layer 115 may be on the connecting lines 150 and the connecting electrodes. The protective layer 115 may not cover the organic material layer 180. The first insulating layer 116 may be further on the protective layer 115. A mask process for forming the contact hole in the protective layer 115 and a mask process for forming a contact hole in the first insulating layer 116 may be separately performed.

Figure 17F:
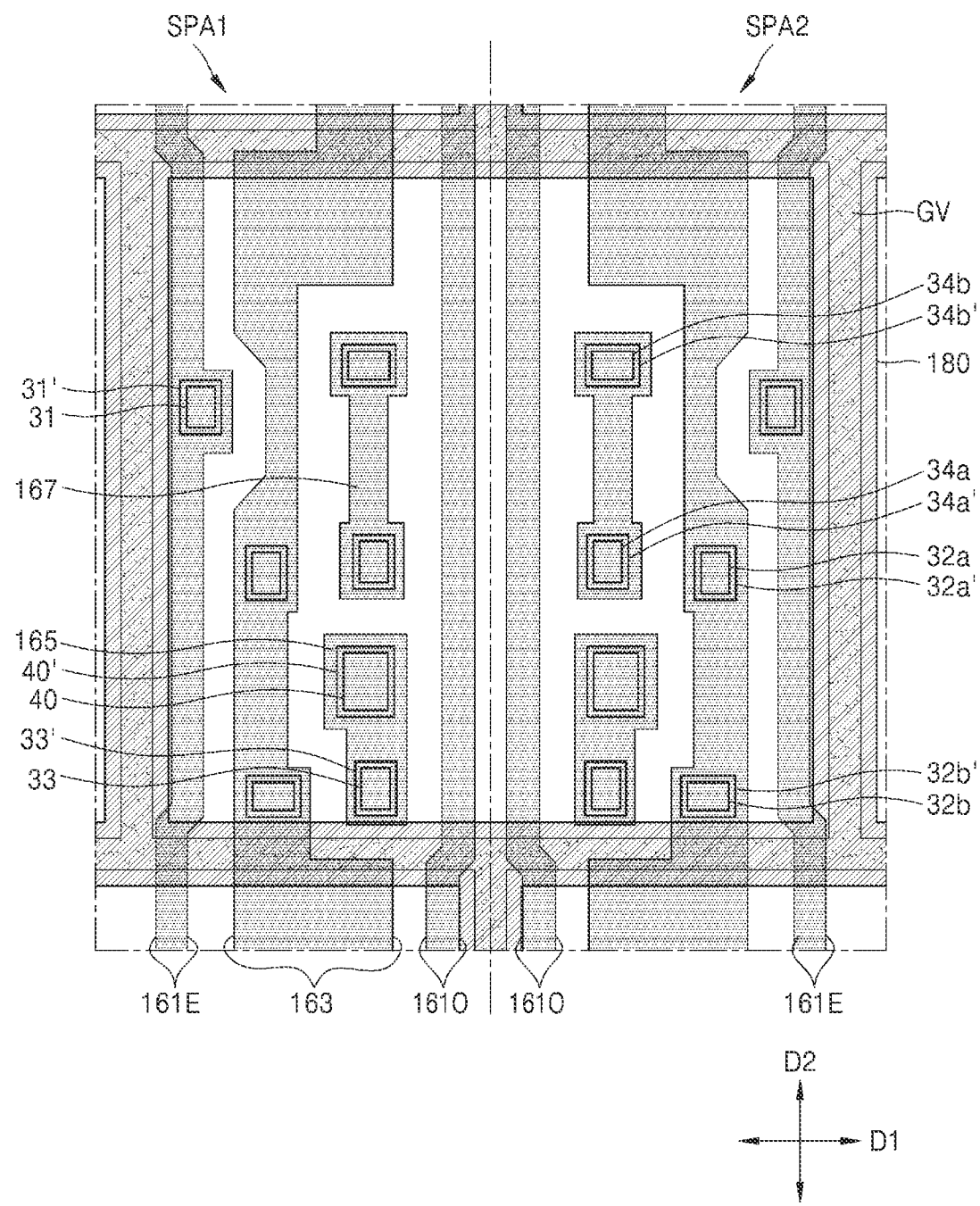

Referring to FIGS. 16 and 17F, the data line 161, the power voltage line 163, the fourth connecting electrode 165, and the node electrode 167 may be on the first insulating layer 116.

The power voltage line 163 may be connected to the first power voltage connecting electrode 159a and the second power voltage connecting electrode 159b via the contact holes 32a and 32b in the protective layer 115 and contact holes 32a' and 32b' in the first insulating layer 116.

The node electrode 167 may be connected to the first node connecting electrode 158a and the second node connecting electrode 158b via the contact holes 34a and 34b in the protective layer 115 and contact holes 34a' and 34b' in the first insulating layer 116.

As shown in FIGS. 7 to 9, the second insulating layer 117 and the third insulating layer 118 may be sequentially on the data line 161, the power voltage line 163, the fourth connecting electrode 165, and the node electrode 167 of FIG. 17F. The organic light-emitting diode OLED may be on the third insulating layer 118. An encapsulation layer 400 may be on the organic light-emitting diode OLED.

According to the embodiment illustrated with reference to FIG. 16, the conductive layers shown in FIGS. 17B and 17C may be formed by using low-resistive metal and connected to the connecting lines of FIG. 17E, and thus, the mask processes may be reduced as compared with the embodiments illustrated in FIGS. 5 and 13, without providing the connecting conductive layers as shown in FIGS. 6D and 14D. The conductive layers shown in FIGS. 17B and 17C may have a single-layered structure including a low-resistive metal material such as aluminum (Al), aluminum alloy (Al-alloy), or copper (Cu), or a combination thereof, or a multi-layered structure including one or more metal selected from platinum (Pt), palladium (Pd), argentum (Ag), magnesium (Mg), aurum (Au), nickel (Ni), neodymium (Nd), iridium (Ir), chromium (Cr), lithium (Li), calcium (Ca), molybdenum (Mo), titanium (Ti), and tungsten (W). For example, the conductive layers shown in FIGS. 17B and 17C may each have a single-layered structure including aluminum alloy, or a multi-layered structure including aluminum alloy/TiN, TiN/aluminum alloy/TiN, etc.

Figure 21:
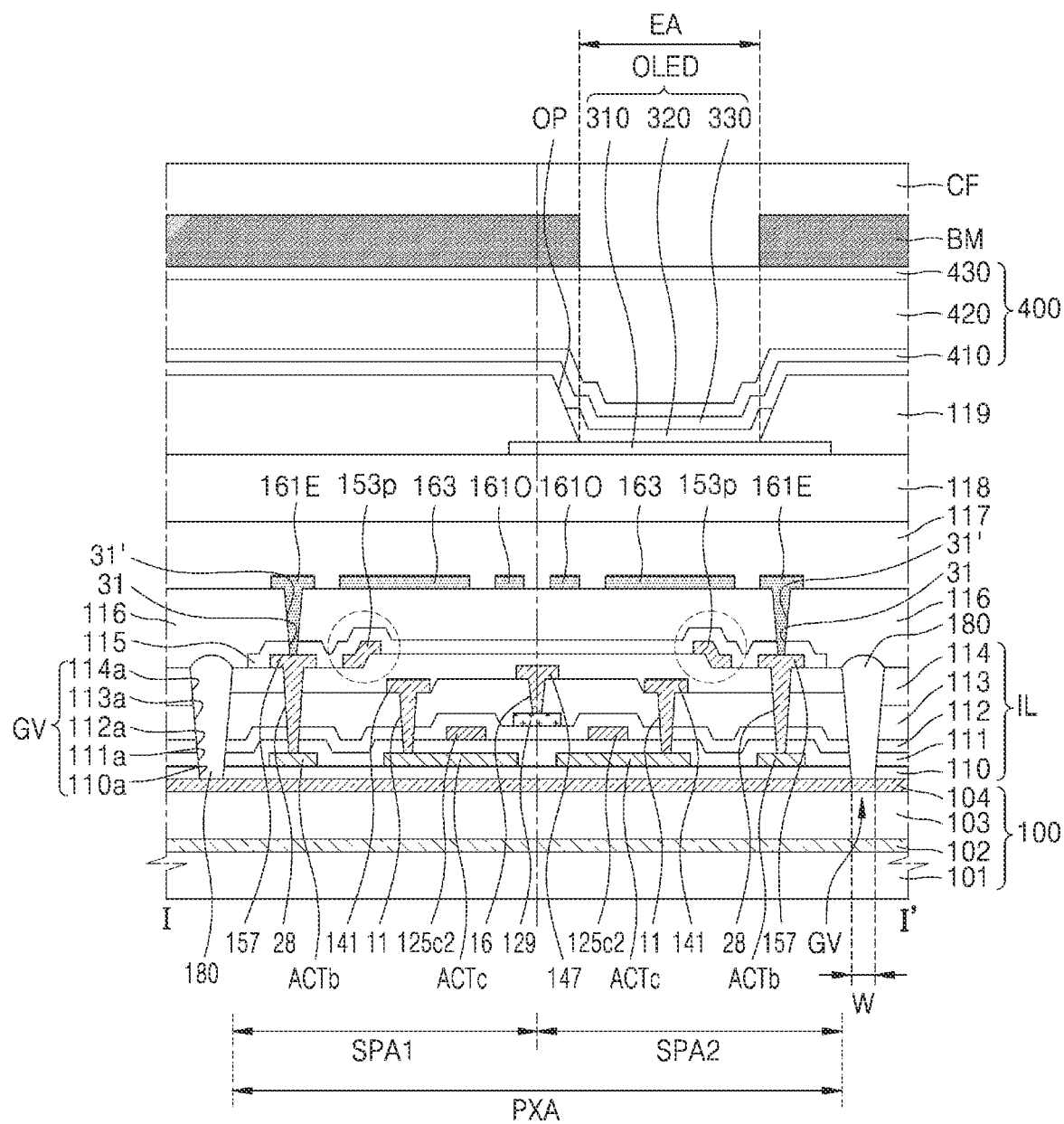
FIG. 21 is a schematic cross-sectional view of a display device according to an embodiment.
Figure 22:
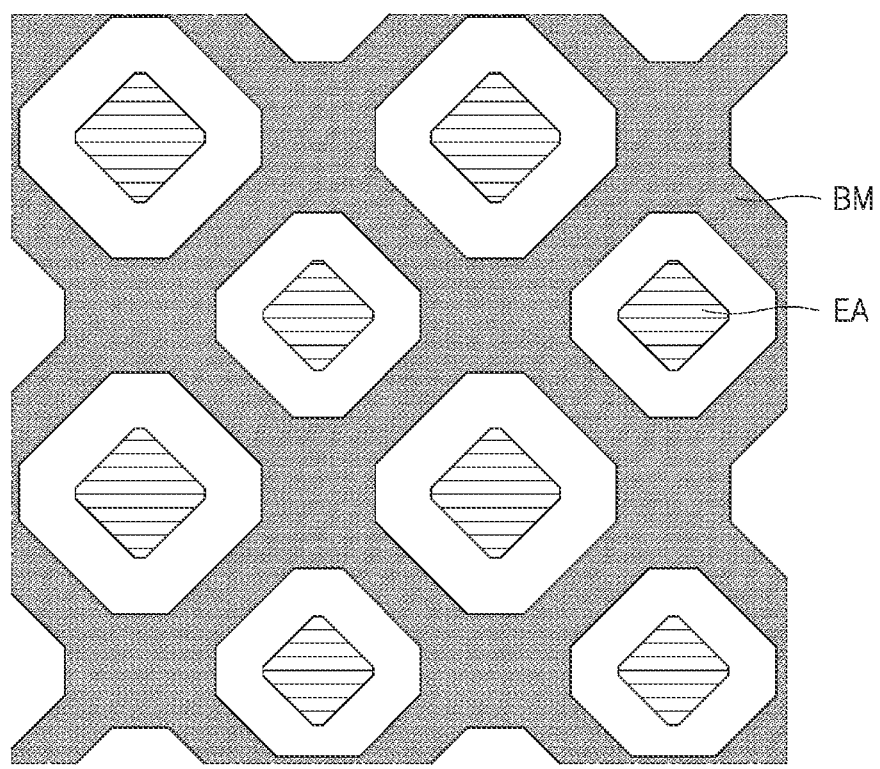
FIG. 22 is a schematic diagram showing a relationship between a black matrix and an emission area of FIG. 21.
Figure 23:
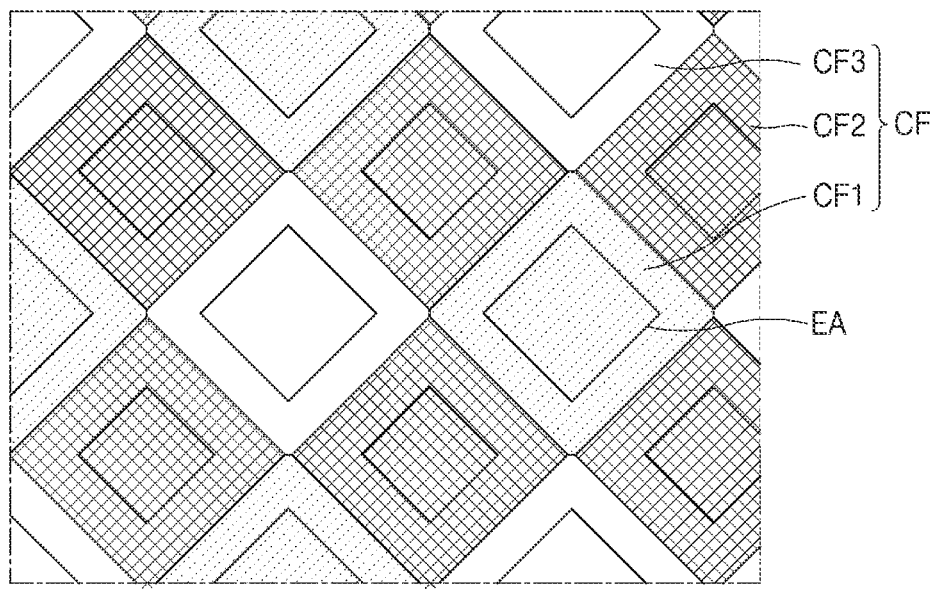
FIG. 23 is a schematic diagram showing a relationship between a color filter and the emission area of FIG. 21.

FIG. 21 is a schematic cross-sectional view of a display device according to an embodiment, FIG. 22 is a schematic diagram showing a relationship between a black matrix and an emission area in FIG. 21, and FIG. 23 is a schematic diagram showing a relationship between a color filter and the emission area of FIG. 21.

Referring to FIG. 21, a black matrix BM and a color filter CF may be on the encapsulation layer 400 as optical functional layers. As shown in FIG. 22, the black matrix BM may surround the emission areas EA and may correspond to other regions than the openings OP in the fourth insulating layer 119. As shown in FIG. 23, the color filter CF may at least correspond to the emission areas EA. The color filter CF may include a first color filter CF1 selectively transmitting first color light, a second color filter CF2 selectively transmitting second color light, and a third color filter CF3 selectively transmitting a third color light. The first color filter CF1, the second color filter CF2, and the third color filter CF3 may be arranged adjacent to one another in a certain pattern. The black matrix BM may correspond to boundaries among the first color filter CF1, the second color filer CF2, and the third color filter CF3. Each of the first color filter CF1, the second color filter CF2, and the third color filter CF3 may partially overlap the black matrix BM.

Although not shown in the drawings, an input sensing layer may be further provided between the black matrix BM and the color filter CF, and the encapsulation layer 400.

According to one or more embodiments, pixel groups may be provided as islands by using the groove and the organic material layer, and the pixel groups of the island type may be connected by using flexible connecting lines to provide the foldable display device of a high resolution, which may be robust against internal shock. According to one or more embodiments, some of the connecting lines for connecting the pixel groups may be used as the shielding layer for preventing the coupling (cross-talk) between the gate node of the driving thin film transistor and the data line, and thus, the display device of high image quality may be provided. Also, according to one or more embodiments, a structure for shielding a floating node between the two channel regions of the thin film transistor having the double-gate structure may be provided, and thus, leakage of the thin film transistor may be reduced.

According to one or more embodiments, the inorganic insulating layer including the groove and the organic material layer filling the groove may be provided in the regions among the pixels, and thus, the high resolution display device that may be robust against the external shock and flexible may be implemented. However, the scope of the disclosure is not limited to the above effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, including any equivalents.

What is claimed is:

1. A display device comprising:
a substrate comprising a display area, the display area comprising pixel areas each of which comprises a first sub pixel area and a second sub pixel area that are adjacent to each other in a first direction;
an inorganic insulating layer comprising inorganic patterns, each inorganic pattern corresponding to each pixel area comprising the first sub pixel area and the second sub pixel area;
an organic material layer disposed between the inorganic patterns and surrounding each pixel area comprising the first sub pixel area and the second sub pixel area; and
a first conductive line on the inorganic insulating layer, extending in the first direction and crossing pixel areas, wherein
the first conductive line crosses the organic material layer and electrically connects signal lines disposed in each pixel area.

2. The display device of claim 1, further comprising:
a plurality of thin film transistors, each of the thin film transistors being disposed in each of the first sub pixel area and the second sub pixel area.

3. The display device of claim 2, further comprising:
an organic insulating layer on the inorganic insulating layer,
wherein the plurality of thin film transistors are between the substrate and the organic insulating layer.

4. The display device of claim 1, further comprising:
a first thin film transistor comprising a first semiconductor layer in the first sub pixel area; and
a second thin film transistor comprising a second semiconductor layer in the second sub pixel area, wherein
at least one signal line of the signal lines is a scan line extending in the first direction and crossing the first sub pixel area and the second sub pixel area, and
the scan line overlaps the first semiconductor layer and the second semiconductor layer.

5. The display device of claim 1, further comprising:
a first driving thin film transistor comprising a first semiconductor layer and a first gate electrode in the first sub pixel area; and
a second driving thin film transistor comprising a second semiconductor layer and a second gate electrode in the second sub pixel area, wherein
at least one signal line of the signal lines includes an electrode layer extending in the first direction and crossing the first sub pixel area and the second sub pixel area, the electrode layer overlapping the first semiconductor layer and the second semiconductor layer.

6. The display device of claim 5, further comprising:
an organic insulating layer on the inorganic insulating layer; and a power line on the organic insulating layer, extending in a second direction and crossing pixel areas,
wherein the power line is electrically connected to the first conductive line.

7. The display device of claim 5, further comprising:
an organic insulating layer on the inorganic insulating layer; and
a data line on the organic insulating layer, extending in a second direction and crossing pixel areas,
wherein the first conductive line is disposed between the electrode layer and the data line, and overlaps the electrode layer.

8. The display device of claim 7, wherein a constant voltage is applied to the electrode layer and the first conductive line.

9. The display device of claim 7, further comprising:
a power line extending in the second direction and crossing pixel areas, wherein
the power line and the data line are disposed on a same layer, and
the power line is electrically connected to the first conductive line.

10. The display device of claim 1, further comprising:
a semiconductor layer in each pixel area; and
a second conductive line extending in a second direction different from the first direction and electrically connects semiconductor layers in a pair of pixel areas adjacent each other in the second direction.

11. The display device of claim 1, further comprising:
a display element comprising a pixel electrode, an opposite electrode facing the pixel electrode, and an emission layer disposed between the pixel electrode and the opposite electrode; and
at least two organic insulating layers disposed between the inorganic insulating layer and the pixel electrode.

12. The display device of claim 11, wherein the pixel electrode overlaps the organic material layer.

13. The display device of claim 1, wherein the inorganic pattern in a first row and the inorganic pattern in a second row adjacent to the first row are offset from each other in the first direction.

14. A display device comprising:
a substrate including a first pixel area and a second pixel area adjacent to the first pixel area in a first direction;
a first driving thin film transistor in the first pixel area;
a second driving thin film transistor in the second pixel area;
an electrode layer overlapping a first gate electrode of the first driving thin film transistor and a second gate electrode of the second driving thin film transistor, the electrode layer being disposed on the first gate electrode and the second gate electrode;
an inorganic pattern corresponding to the first pixel area and the second pixel area; and
an organic material layer surrounding the first pixel area and the second pixel area, and comprising a hole corresponding to the inorganic pattern.

15. The display device of claim 14, further comprising:
a conductive line on the electrode layer, overlapping the electrode layer and electrically connected to the electrode layer,
wherein the conductive line extends in the first direction and crosses the organic material layer.

16. The display device of claim 15, further comprising:
an organic insulating layer on the inorganic pattern and the organic material layer; and
a power line on the organic insulating layer, extending in a second direction and crossing the organic material layer,
wherein the power line is electrically connected to the conductive line.

17. The display device of claim 16, further comprising:
an organic insulating layer on the inorganic pattern and the organic material layer; and
a data line on the organic insulating layer, extending in the second direction and crossing the organic material layer,
wherein the conductive line is disposed between the electrode layer and the data line.

18. The display device of claim 17, wherein a constant voltage is applied to the electrode layer and the conductive line.

19. The display device of claim 17, further comprising:
a power line extending in the second direction and the organic material layer, wherein
the power line and the data line are disposed on a same layer, and
the power line is electrically connected to the conductive line.

20. The display device of claim 14, further comprising:
at least two organic insulating layers on the inorganic pattern and the organic material layer; and
a display element on the organic insulating layers and comprising a pixel electrode, an opposite electrode facing the pixel electrode, and an emission layer disposed between the pixel electrode and the opposite electrode.

* * * * *